United States Patent [19]

Kawahata et al.

[11] Patent Number: 5,726,077
[45] Date of Patent: Mar. 10, 1998

[54] METHOD OF PRODUCING AN ELECTRO-OPTICAL DEVICE

[75] Inventors: Ken Kawahata, Sendai; Akira Nakano, Furukawa; Hirofumi Fukui, Taiwa-machi; Hiroyuki Hebiguchi, Sendai; Kenji Yamamoto, Shichigahama-machi; Chisato Iwasaki, Miyagi-ken, all of Japan

[73] Assignee: Frontec Incorporated, Sendai, Japan

[21] Appl. No.: 459,925

[22] Filed: Jun. 2, 1995

[30] Foreign Application Priority Data

Jun. 3, 1994 [JP] Japan ..................... 6-122883
Oct. 17, 1994 [JP] Japan ..................... 6-251052

[51] Int. Cl.$^6$ ............................. H01L 21/84
[52] U.S. Cl. ............ 438/30; 438/158; 438/609
[58] Field of Search ............ 437/181, 51, 48, 437/21, 101, 40 TFI, 41 TFI; 438/30, 158, 609, 136, 155, 183, 200, 341

[56] References Cited

U.S. PATENT DOCUMENTS 4,624,737  11/1986  Shimbo .
5,210,045   5/1993  Possin et al. ............... 437/51
5,346,833   9/1994  Wu ............................ 438/30
5,466,618  11/1995  Kim .......................... 437/51
5,496,752   3/1996  Nasu et al. ................ 438/30
5,585,290  12/1996  Yamamoto et al. ......... 437/51

*Primary Examiner*—Mary Wilczewski
*Attorney, Agent, or Firm*—Guy W. Shoup

[57] ABSTRACT

A method for producing an electo-optical device including only five photolithographic steps, including a first photolithographic step for forming a gate electrode and gate wiring, a second photolithographic step for forming a semiconductor portion above the gate electrode, a third photolithographic step for forming a contact hole through the first insulator film to the gate wiring, a fourth photolithographic step for forming a source electrode, a source wiring and a drain electrode and then forming a channel portion above the gate electrode exposing said semiconductor active film and forming a transparent pixel electrode, and a fifth photolithographic step for forming a light-permeable opening above the transparent pixel electrode, and a contact hole for source wiring and gate wiring connection terminals.

11 Claims, 56 Drawing Sheets

METHOD OF PRODUCING AN ELECTRO-OPTICAL DEVICE

BACKGROUND OF THE INVENTION

1. Field of the Invention

The present invention concerns a method of producing an electro-optical device in which thin film transistors are formed and, more in particular, it relates to a technique capable of reducing the number of photolithographic steps as compared with that in the prior art method.

2. Description of the Related Art Statement

FIG. 165 shows an example for a constitution of an equivalent circuit of an active matrix liquid crystal display device using thin film transistors as switching elements.

In FIG. 169, a plurality of gate wirings G1, G2, - - -, Gn and a plurality of source wirings S1, S2, - - -, Sm are wired in a matrix, in which each of the gate wirings G is connected to a scanning circuit 1 and each of the signal wirings S is connected to a signal supply circuit 2 respectively. A thin film transistor (switching element) 3 is disposed to a crossing point between each of the wirings and a capacitance section 4 as a capacitor and a liquid crystal device 5 are connected to a drain electrode of the thin film resistor 3 to constitute a circuit.

FIG. 170 and FIG. 171 illustrate an example for a structure of a thin film transistor array substrate having portions, for example, the gate wirings G and the source wirings F on a substrate in an existent active matrix liquid crystal display device shown by the equivalent circuit in FIG. 169.

In the thin film transistor array substrate shown in FIG. 170 and FIG. 171, the gate wirings G and the source wirings S are wired in a matrix on a transparent substrate 6 such as made of glass. Further, a thin film resistor 3 is disposed near the crossing point between each of the gate wirings G and the source wirings S.

The thin film transistor 3 shown in FIG. 170 and FIG. 171 has a general etch-stopper type constitution formed by disposing an gate insulator film 9 on the gate wiring G and a gate electrode 8 led out of the gate wiring G, disposing a semiconductor film 10 made of amorphous silicon (a-Si) on the gate insulator film 9 and further disposing, on the semiconductor film 10, a drain electrode 11 and a source electrode 12 made of an electroconductive material opposing to each other. An ohmic contact film 10a comprising, for example, amorphous silicon and doped at a high concentration with an impurity as such as phosphorus as a doner is formed to the uppermost layer of the semiconductor film, on which an etching stopper 13 is formed being put between the drain electrode 11 and the source electrode 12. Further, the gate electrode 8 has a double structure comprising a gate insulator film 8a of an upper layer and a gate wiring 8b of a lower layer, and a transparent pixel electrode 15 made of a transparent electrode material is formed from a portion above the drain electrode 11 to lateral sides of the drain electrode 11.

Then a passivation film 16 is disposed covering, for example, the gate insulator film 9, the transparent pixel electrode 15 and the source electrode 12.

A not illustrated orientation film is formed on the passivation film 16, and liquid crystals are disposed above the orientation film to constitute an active matrix liquid crystal display device 15 and the device can control the orientation of liquid crystal molecules when an electric field is applied to the molecules of the liquid crystals by way of the transparent pixel electrode 15.

By the way, the thin film transistor array substrate of the structure described above has been produced so far based on the steps as described in Table 1 shown below.

TABLE 1

| Step | Production method | Material | Remarks |
| --- | --- | --- | --- |
| Initial cleaning | Brush and UV | | |
| Formation of surface stabilization layer | Reactive sputtering | TaOx | 750 nm |
| Formation of gate wiring metal | DC sputtering | Al | 200 nm |
| Gate wiring metal PL ① | Wet etching | | |
| Formation of gate electrode | DC sputtering | Ta | 400 nm |
| Gate electrode PL ② | Dry etching | | |
| Anodization of gate electrode | | TaOx | 300 nm |
| Formation of gate insulation | Plasma CVD | SiNx | 250 nm |
| Formation of a-Si | Plasma CVD | a-Si | 50 nm |
| Formation of ES insulator layer | Plasma CVD | SiNx | 100 nm |
| ES insulator layer PL ③ | Wet etching | | Back exposure method |
| Formation of SD semiconductor | Plasma CVD | n + Si | 25 nm |
| Device area PL ④ | Dry etching | | |
| Formation of SD electrode | DC sputtering | Ti | 400 nm |
| SD electrode PL ⑤ | Dry etching | | |
| Formation of transparent electrode | Reactive sputtering | ITO | 50 nm |
| Transparent electrode PL ⑥ | Wet etching | | |
| Formation of protection layer | Plasma CVD | SiNx | 250 nm |
| Protection layer PL ⑦ | Wet etching | | |

Note: PL: photolithography, ES: etching stopper, SD: source/drain
①-⑦: Exposure process At first, a transparent substrate, for example, made of glass is prepared, and then put to initial cleaning by a brush cleaning device and an UV-irradiation device, and a surface stabilization film, for example, made of $TiO_x$ is formed by using a film-forming method such as reactive sputtering on the transparent substrate after cleaning.

A metal film for gate wirings made of an electroconductive material such as Al is deposited on the substrate formed with a surface stabilization film by using a film forming-method such as DC sputtering, and the metal film is etched in a first photolithographic step (1) using a method such as wet etching, to form gate wirings.

Then, a metal film for forming a gate electrode made, for example, of Ta is deposited on the gate wirings by a film forming method such as DC sputtering and then the metal film is etched in a second photolithographic step (2) using a method such as dry etching, to form the gate electrode.

Then, the gate electrode is anodized to form the surface portion into $TaO_x$ to apply a treatment for improving the insulation performance of the gate electrode.

Successively, a gate insulator film made of $SiN_x$, a semiconductor film made of a-Si (amorphous silicon) or the like and an insulator film for etching stopper made of $SiN_x$ are formed on them by a film-forming method such as plasma CVD.

Then, etching is applied in a third photolithographic step (3) using a method, for example, of wet etching to form an etching stopper on the gate electrode.

Then, an ohmic contact film such as made of a-Si($n^+$) is formed on the surface of the substrate after the third photolithographic step by using a method such as plasma CVD.

Then, the semiconductor film and the ohmic contact film are patterned in a fourth photolithographic step (4) using a method such as DC sputtering to form a semiconductor portion above the gate electrode in a state isolated from other portions.

Then, a metal film made, for example, of Ti is formed on the surface of the substrate after the fourth photolithographic step by using a film-forming method such as DC sputtering.

Then, the metal film is patterned in a fifth photolithographic step (5) using a method such as dry etching to form a source electrode and a drain electrode.

Then, a transparent conductive film, for example, made of ITO (Indium Tin Oxide) is formed on the surface of the substrate after the fifth photolithographic step by a film-forming method such as reactive sputtering.

Then, the transparent conductive film is fabricated in a sixth photolithographic step (6) using a method such as wet etching to form a transparent pixel electrode, and then a protection film, for example, made of $SiN_x$ is formed on the surface of the substrate after the sixth photolithographic step by a method such as plasma CVD.

Then, a seventh photolithographic step (7) of patterning the protection film by a method such as wet etching to form a contact hole for a source terminal for connection with the source electrode and a contact hole for a drain terminal for connection with the drain electrode, to complete the thin film transistor array substrate.

However, when the thin film transistor array substrate is produced by the method as described above, photolithographic steps have to be applied for seven times and, since there are a number of photolithographic steps, they give a significant effect by so much on the yield to bring about a problem of increasing the production cost.

Then, in a case of producing the thin film transistor array substrate of this type, it may be adopted a structure in which various thin films are stacked, a contact hole is formed to a portion of the laminate film, and a conductive film is formed to the contact hole to electrically connect the film of the upper layer with the film of the lower layer by way of the conductive film.

FIG. 172 shows an example of such a structure in which an insulator film 18 made, for example, of $SiN_x$ and a conductive oxide film 19 made of ITO are stacked on a metal film 17, for example, made of Ti formed on the substrate, and the conductive oxide film 19 is connected with the metal film 17 by way of a contact hole 18a formed to the insulator film 18.

In the structure of this example, the contact hole 18a is formed by a method of forming the insulator film 18, depositing thereover a predetermined pattern of a photoresist, etching the insulator film 18 by dry etching using, for example, $SF_6+O_2$ gas to form the contact hole 18a, and then peeling off the photoresist with $O_2$ plasma and subsequently forming the conductive oxide film 19. However, since the metal film 17 is exposed through the contact hole 18a to an oxidative atmosphere in the course of the process, there is a worry that the metal film 17 is oxidized.

In view of the above, Ti has been used so far as a metal capable of providing a good contact with the conductive oxide film 19 and is less oxidized by the $O_2$ plasma atmosphere but a thin film of Al or Ta which is oxidized more readily than Ti can not be used, so that the material used for the metal film 17 suffers from restriction. By the way, in a case where a contact area of the connection portion is set to 7 $um^2$ and a contact chain of a structure having 1,600 steps for the contact portion of the structure shown in FIG. 172 is formed, the contact resistance of the thin Al film to the thin ITO film is from $10^{10}$–$10^{12}$ ohm, whereas the contact resistance of the Ti thin film to the ITO thin film is from $10^4$ to $10^5$ ohm and the Ti thin film is apparently superior in the contact performance. It is considered that exposure to the $O_2$ plasma atmosphere forms oxide layers at the boundary of the connection portion and, even if Ti has lower conductivity as compared with that of Al, it contrarily shows less contact resistance than the latter due to the presence of the oxide layers.

Further, in a case of using the thin Ti film as the metal film 17 described above, if the structure is applied to a thin film transistor array substrate to form gate wirings with the metal film 17, the Ti metal film 17 can be served for usual application use but it may possibly cause signal delay in the gate wirings since the specific resistivity of Ti itself is high, to result in a disadvantage in view of increase for the size of a liquid crystal panel.

OBJECT OF THE INVENTION

The present invention has been achieved in view of the foregoing situations and it is an object of the invention to provide a method for producing an electro-optical device capable of reducing the production cost by reducing the number of photolithographic steps thereby improving the yield as compared with the production method in the prior art, as well as capable of selecting more varied materials for a conductive film in a case of connecting a transparent conductive film with other conductive films by way of a contact hole and reducing signal delays in wirings in a case of forming the wirings with the conductive film.

SUMMARY OF THE INVENTION

For overcoming the foregoing problems, there is provided in accordance with a first aspect of the present invention, a method for producing an electro-optical device in which an electro-optical material is put between a pair of substrates opposed to each other, at least a portion of opposing surfaces of the substrates is insulative, a plurality of source wirings and a plurality of gate wirings are formed crossing to each other on the surface of the substrate and a transparent pixel electrode and a thin film transistor are formed to each of crossing points between the source wirings and the gate wirings, wherein the method comprises:

a step A1 for forming a transparent conductive film on the surface of the substrate, a first photolithographic step A2 of patterning the transparent conductive film to form a transparent pixel electrode, a step A3 of forming a first metal film on the surface of the substrate after the first photolithographic step, a third photolithographic A4 of patterning the first metal film to form a gate electrode and a gate wiring, a step A5 of forming a first insulator film, a semiconductor active film and an ohmic contact film on the surface of the substrate after the second photolithographic step, a third photolithographic step A6 of patterning the first insulator film, the semiconductor active film and the ohmic contact film to form a contact hole reaching the transparent pixel electrode and a contact hole reaching the gate wiring, a step A7 of forming a second metal film on the surface of the substrate after the third photolithographic step, a fourth photolithographic step A8 of patterning the second metal film, to form a source electrode, a source wiring, a drain electrode connected with the transparent pixel electrode by way of the contact hole reaching the transparent pixel electrode and a gate terminal wiring connected with the gate wiring by way of the contact hole reaching the gate electrode, and fabricating the ohmic contact film by using the second metal film as a mask to form a channel portion above the gate electrode, a step A9 of forming a passivation film on the surface of the substrate after forming the channel portion, and a fifth photolithographic step A10 of forming, to the passivation film, a contact hole reaching the gate terminal wiring and the source wiring, and fabricating the semiconductor active film below the source electrode, the drain electrode and the source wiring using the passivation film as a mask to isolate the same from the semiconductor active film of adjacent thin film transistors having the gate wiring in common and make a portion above the pixel electrode light permeable.

In a second aspect of the present invention, there is provided a method for producing the electro-optical device according to the first aspect, wherein the step A3 of forming the first metal film on the surface of the substrate and the second photolithographic step A4 of patterning the first metal film to form the gate electrode and the gate wiring are conducted and, subsequently, the step A1 of forming the transparent conductive film on the surface of the substrate and the first photolithographic step A2 of patterning the transparent conductive film to form the transparent pixel electrode are applied.

For overcoming the foregoing problems, there is provided in accordance with a third aspect of the present invention, a method for producing an electro-optical device comprising:

a step B1 of forming a first metal film on the surface of the substrate, a first photolithographic step B2 of patterning the first metal film to form a gate electrode and a gate wiring, a step B3 of forming a first insulator film, a semiconductor active film and an ohmic contact film on the surface of the substrate after the first photolithographic step, a second photolithographic step B4 of patterning the semiconductor active film and the ohmic contact film to form a semiconductor portion above the gate electrode in a state isolated from other portions, a third photolithographic step B5 of patterning the first insulator film to form a contact hole reaching the gate wiring, a step B6 of forming a transparent conductive film for a transparent pixel electrode, a second metal film for a source electrode and a drain electrode on the surface of the substrate after the third photolithographic step, a fourth photolithographic step B7 of patterning the second metal film, the transparent conductive film and the semiconductor active film and the ohmic contact film to form a source electrode, a source wiring and a drain electrode and, further, forming a channel portion above the gate electrode and forming a transparent pixel electrode, a step B8 of forming the passivation film on the surface of the substrate after the fourth photolithographic step, and a fifth photolithographic step B9 of patterning the passivation film and the second metal film to make a portion above the transparent pixel electrode light permeable and forming a contact hole for source wiring and gate wiring connection terminals.

For overcoming the foregoing problems, there is provided in accordance with a fourth aspect of the present invention, a method for producing an electro-optical device comprising:

a step C1 of forming a first metal film on the surface of the substrate, a first photolithographic step C2 of patterning the first metal film to form a gate electrode and a gate wiring, a step C3 of forming a first insulator film, a semiconductor active film, an ohmic contact film and a metal film on the surface of the substrate after the first photolithographic step, a second photolithographic step C4 of patterning the semiconductor active film, the ohmic contact and the metal film to form a semiconductor portion above the gate electrode in a state isolated from other portions, a third photolithographic step C5 of patterning the first insulator film to form a contact hole reaching the gate wiring, a step C6 of forming a transparent conductive film for a transparent pixel electrode, a source electrode and a drain electrode on the surface of the substrate after the third photolithographic step, a fourth photolithographic step C7 of patterning the transparent conductive film to form a source electrode, a source wiring, a drain electrode and a transparent pixel electrode, and patterning the transparent conductive film, the buffer film and the ohmic contact film above the gate electrode to form a channel portion above the gate electrode, a step C8 of forming a passivation film on the surface of the substrate after the fourth photolithographic step, and a fifth photolithographic step C9 of patterning the passivation film to remove a portion of the passivation film above the transparent pixel electrode and make a portion above the transparent pixel electrode light permeable and forming a contact hole for source wiring and gate wiring connection terminals.

For overcoming the foregoing problems, there is provided in accordance with a fifth aspect of the present invention, a method for producing an electro-optical device comprising:

a step D1 of forming a transparent conductive film for a transparent pixel electrode and a first film for a gate electrode and a gate wiring on the transparent conductive film on the surface of the substrate, a first photolithographic step D2 of patterning the transparent conductive film and the first metal film to form a gate electrode, a gate wiring and a transparent pixel electrode, a step D3 of forming a first insulator film, a semiconductor active film and an ohmic contact film on the surface of the substrate after the first photolithographic step, a second photolithographic step D4 of patterning the ohmic contact film, the semiconductor active film and the first insulator film to form a contact hole reaching the gate wiring, a step D5 of forming a second metal film for the source electrode and the drain electrode on the surface of the substrate after the second photolithographic step, a third photolithographic step D6 of patterning the second metal film to form the source electrode and the drain electrode and patterning the second metal film and the ohmic contact film on the gate electrode to form a channel portion above the gate electrode, a step D7 of forming a passivation film on the surface of the substrate after the third photolithographic step, and a fourth photolithographic step D8 of patterning the passivation film to remove a portion of the passivation film, the second metal film, the ohmic contact film, the semiconductor active film and the first insulator film above the transparent pixel electrode and make a portion above the transparent pixel electrode light permeable, isolating the semiconductor active film below the source electrode, the drain electrode and the source wiring from the semiconductor active film of adjacent thin film transistor having the gate wiring in common and forming a contact hole for source wiring and gate wiring connection terminals.

For overcoming the foregoing problems, there is provided in accordance with a sixth aspect of the present invention, a method for producing an electro-optical device comprising:

a step E1 of forming a transparent conductive film for a transparent pixel electrode and a first film for a gate electrode and a gate wiring on the transparent conductive film on the surface of the substrate, a first photolithographic step E2 of patterning the transparent conductive film and the first metal film to form a gate electrode, a gate wiring and a transparent pixel electrode, a step E3 of forming a first insulator film, a semiconductor active film and an ohmic contact film on the surface of the substrate after the first photolithographic step, a second photolithographic step E4 of patterning the semiconductor active film and the ohmic contact film to form a semiconductor portion above the gate electrode in a state isolated from other portions, a third photolithographic step E5 of patterning the first insulator film to form a contact hole reaching the gate wiring, a step E6 forming a second metal film for a source electrode and a drain electrode on the surface of the substrate after the third lithographic step, a fourth photolithographic step E7 of patterning the second metal film to form a source electrode and a drain electrode, and patterning the second metal film and the ohmic contact film above the gate electrode to form a channel portion above the gate electrode, a step E8 of forming a passivation film on the surface of the substrate after the fourth photolithographic step, and a Fifth photolithographic step E9 of patterning the passivation film to remove a portion of the passivation film, the second metal film and the first insulator film above the transparent pixel electrode and make a portion above the transparent pixel electrode light permeable, and forming a contact hole for source wiring and gate wiring connection terminal.

For overcoming the foregoing problems, there is provided in accordance with a seventh aspect of the present invention, a method for producing an electro-optical device comprising:

a step F1 of forming a first metal film on the surface of the substrate, a first photolithographic step F2 of patterning the first metal film to form a gate electrode and a gate wiring, a step F3 of forming a first insulator film on the surface of the substrate after the first photolithographic step, a second photolithographic step F4 of patterning the first insulator film to form a contact hole reaching the gate wiring, a step F5 of forming a transparent conductive film, a second metal film and an ohmic contact film in this order on the surface of the substrate after the second photolithographic step, a third photolithographic step F6 of patterning the ohmic contact film, the second metal film and the transparent conductive film to form a source electrode, a drain electrode, a channel portion and a transparent pixel electrode, a step F7 of forming a semiconductor active film and a passivation film on the surface of the substrate after the third photolithographic step, and a fourth photolithographic step F8 of patterning the passivation film, the semiconductor active film, the ohmic contact film and the second metal film to make a portion above the transparent pixel electrode light permeable and isolate the semiconductor film above the source electrode, the drain electrode and the source wiring from the semiconductor active film of adjacent thin film transistors having the gate wiring in common and forming a contact hole for source wiring and gate wiring connection terminals.

For overcoming the foregoing problems, there is provided in accordance with a eighth aspect of the present invention, a method for producing an electro-optical device comprising:

a step G1 of forming a first metal film on the surface of the substrate, a first photolithographic step G2 of patterning the first metal film to form a gate electrode and a gate wiring, a step G3 of forming a first insulator film, a semiconductor film and an ohmic contact film on the surface of the substrate after the first photolithographic step, a second photolithographic step G4 of patterning the semiconductor active film and the ohmic contact film to form a semiconductor portion above the gate electrode in a state isolated from other portions, a step G5 of forming a second metal film on the surface of the substrate after the second photolithographic step, a third photolithographic step G6 of patterning the second metal film and the ohmic contact film to form a source electrode, a drain electrode and a channel portion, a step G7 of forming a passivation film on the surface of the substrate after the third photolithographic step, and a fourth photolithographic step G8 of patterning the passivation film to form a contact hole reaching the gate wiring, a contact hole reaching the drain electrode and a contact hole for source wiring and gate wiring connection terminals, a step G9 forming a transparent conductive film on the surface of the substrate after the fourth photolithographic step, and a fifth photolithographic step G10 of patterning the transparent conductive film to form a transparent pixel electrode.

For overcoming the foregoing problems, there is provided in accordance with a ninth aspect of the present invention, a method for producing an electro-optical device comprising:

a step H1 of forming a first metal film on the surface of the substrate, a first photolithographic step H2 of patterning the first metal film to form a gate electrode and a gate wiring, a step H3 of forming a first insulator film on the surface of the substrate after the first photolithographic step, a second photolithographic step H4 of patterning the first insulator film to form a contact hole reaching the gate wiring, a step H5 of forming a second metal film and an ohmic contact film on the surface of the substrate after the second photolithographic step, a third photolithographic step H6 of patterning the ohmic contact film and the second metal film to form a source electrode, a drain electrode, a source wiring and a channel portion, a step H7 of forming a semiconductor active film and a passivation film on the surface of the substrate after the third photolithographic step, a fourth photolithographic step H8 of patterning the passivation film, the semiconductor active film and the ohmic contact film to make a transparent pixel electrode area light permeable, isolating the semiconductor active film above the source electrode, the drain electrode and the source wiring from the semiconductor active film of adjacent thin film transistors having the gate wiring in common and forming a contact hole reaching the source wiring, a step H9 forming a transparent conductive film on the surface of the substrate after the fourth photolithographic step and a step H10 of patterning the transparent conductive film to form a transparent pixel electrode.

For overcoming the foregoing problems, there is provided in accordance with a tenth aspect of the present invention, a method for producing an electro-optical device comprising:

a step J1 of forming a first metal film on the surface of the substrate, a first photolithographic step J2 of patterning the first metal film to form a gate electrode and a gate wiring, a step J3 of forming a first insulator film on the surface of the substrate after the first photolithographic step, a second photolithographic step J4 of patterning the first insulator film to form a contact hole reaching the gate wiring, a step J5 of forming a transparent conductive film on the surface of the substrate after the second photolithographic step, a third photolithographic step J6 of patterning the transparent electrode to form a source electrode, a drain electrode, a source wiring and a channel portion, a step J7 of forming a second metal film and an ohmic contact film in this order on the surface of the substrate after the third photolithographic step, a fourth photolithographic step J8 of patterning the ohmic contact film, the second metal film and the ohmic contact film to form a source electrode, a drain electrode and a channel portion, a step J9 of forming a semiconductor film and a passivation film on the surface of the substrate after the fourth photolithographic step, and a fifth photolithographic step J10 of patterning the passivation film, the semiconductor active film, the ohmic contact film and the second metal film to make a portion above the transparent pixel electrode light permeable, isolating the semiconductor active film above the source electrode, the drain electrode and the source wiring from the semiconductor active film of adjacent thin film transistors having the gate wiring in common and forming a contact hole reaching the source wiring.

For overcoming the foregoing problems, there is provided in accordance with a eleventh aspect of the present invention, a method for producing an electro-optical device comprising:

a step L1 of forming a light screening thin film on the surface of the substrate, a first photolithographic step L2 of patterning the light screening thin film to form a light screening film, a step L3 of forming a first insulator film and a semiconductor active film on the surface of the substrate after the first photolithographic step, a second photolithographic step L4 of patterning the semiconductor active film to form a semiconductor portion on the light screening film, a step L5 of forming a second insulator film and a first metal film on the surface of the substrate after the second photolithographic step, a third photolithographic step L6 of patterning the first metal film to form a gate electrode and a gate wiring, a step L7 of forming a third insulator film on the surface of the substrate after the third photolithographic step, a fourth photolithographic step L8 of patterning the second insulator film and the third insulator film to form a contact hole reaching one end of the semiconductor portion and a contact hole reaching the other end of the semiconductor portion, and patterning the third insulator film to form a contact hole reaching the gate wiring, a step L9 of forming a transparent conductive film on the surface of the substrate after the fourth photolithographic step, and a fifth photolithographic step L10 of patterning the transparent conductive film to form a source electrode, a source wiring and a drain electrode on both sides of the gate electrode and forming a pixel electrode.

For overcoming the foregoing problems, there is provided in accordance with a twelfth aspect of the present invention, a method for producing an electro-optical device comprising:

a step M1 of forming a light screening thin film on the surface of the substrate, a first photolithographic step M2 of patterning the light screening thin film to form a light screening film, a step M3 of forming a first insulator film, a semiconductor active film and an ohmic contact film on the surface of the substrate after the first photolithographic step, a second photolithographic step M4 of patterning the ohmic contact film and the semiconductor active film to form a semiconductor portion above the light screening film, a step M5 of forming a first metal film on the surface of the substrate after the second photolithographic step, a third photolithographic step M6 of patterning the first metal film to form a source electrode, a drain electrode and a source wiring, a step M7 of forming a second insulator film on the surface of the substrate after the third photolithographic step, a fourth photolithographic step M8 of patterning the second insulator film to form a contact hole reaching gate wiring, a contact hole reaching the source wiring and a contact hole reaching the drain electrode, a step M9 of forming a transparent conductive film on the surface of the substrate after the fourth photolithographic step, and a fifth photolithographic step M10 of patterning the transparent conductive film to form a gate electrode above a portion between the source electrode and the drain electrode and forming a gate wiring in connection with the gate electrode.

For overcoming the foregoing problems, there is provided in accordance with a thirteenth aspect of the present invention, a method for producing an electro-optical device comprising:

a step N1 of forming a light screening thin film on the surface of the substrate, a first photolithographic step N2 of patterning the light screening thin film to form a light screening film, a step N3 of forming a first insulator film, a semiconductor active film and an ohmic contact film on the surface of the substrate after the first photolithographic step, a second photolithographic step N4 of patterning the ohmic contact film and the semiconductor film to form a semiconductor portion above the light screening film, a step N5 of forming a transparent conductive film on the surface of the substrate after the second photolithographic step, a third photolithographic step N6 of patterning the transparent conductive film to form a source electrode, a drain electrode, a source wiring and a pixel electrode, a step N7 of forming a second insulator film on the surface of the substrate after the third photolithographic step, a fourth photolithographic step N8 of patterning the second insulator film to form a contact hole for gate wiring and a source wiring connection, a step N9 of forming a metal film on the surface of the substrate after the fourth photolithographic step, and a fifth photolithographic step N10 of patterning the metal film to form a gate electrode above a portion between the source electrode and the drain electrode and forming a gate wiring in connection with the gate electrode.

For overcoming the foregoing problems, there is provided in accordance with a fourteenth aspect of the present invention, a method for producing an electro-optical device comprising:

a step O1 of forming a light screening thin film on the surface of the substrate, a first photolithographic step O2 of patterning the light screening thin film to form a light screening film, a step O3 of forming a first insulator film, a first metal film and an ohmic contact film on the surface of the substrate after the first photolithographic step, a second photolithographic step O4 of patterning the ohmic contact film and the first metal film to form a semiconductor channel portion, and forming a source electrode, a drain electrode and a source wiring above the light screening film, a step O5 of forming a semiconductor active film and a passivation film protecting the same on the surface of the substrate after the second photolithographic step, a third photolithographic step O6 of patterning the passivation film, the semiconductor active film and the ohmic contact film to form a semiconductor portion and forming contact hole for connecting the gate wiring and the source wiring, a step O7 of forming a transparent conductive film on the surface of the substrate after the third photolithographic step, and a fourth photolithographic step O8 of patterning the transparent conductive film to form a gate electrode above a portion between the source electrode and the drain electrode and form a pixel electrode.

For overcoming the foregoing problems, there is provided in accordance with a fifteenth aspect of the present invention, a method for producing an electro-optical device comprising:

a step P1 of forming a light screening thin film on the surface of the substrate, a first photolithographic step P2 of patterning the light screening thin film to form a light screening film, a step P3 of forming a first insulator film, a transparent conductive film and an ohmic contact film on the surface of the substrate after the first photolithographic step, a second photolithographic step P4 of patterning the ohmic contact film and the transparent conductive film to form a $n^+$ semiconductor channel portion, and forming a source electrode, a drain electrode, a source wiring and a pixel electrode above the light screening film, a step P5 of forming a semiconductor active film and a second insulator film on the surface of the substrate after the second photolithographic step, a third photolithographic step P6 of patterning the second insulator film, the semiconductor active film and the ohmic contact film to form a contact hole for connecting the gate wiring and the source wiring, a step P7 of forming a metal film on the surface of the substrate after the third photolithographic step, and a fourth photolithographic step P8 of patterning the metal film to form a gate electrode above a portion between the source electrode and the drain electrode and removing a film above the pixel electrode.

For overcoming the foregoing problems, there is provided in accordance with a sixteen aspect of the present invention, a method for producing an electro-optical device comprising:

a step Q1 of forming a light screening thin film on the surface of the substrate, a first photolithographic step Q2 of patterning the light screening thin film to form a light screening film, a step Q3 of forming a first insulator film and an ohmic contact film on the surface of the substrate after the first photolithographic step, a second photolithographic step Q4 of patterning the transparent conductive film to form a pixel electrode, a step Q5 of forming a first metal film and an ohmic contact film on the surface of the substrate after the second photolithographic step, a third photolithographic step Q6 of patterning the ohmic contact film and the first metal film to form a semiconductor channel portion above the screening film and forming a source electrode, a drain electrode and a wiring therefor, a step Q7 of forming a semiconductor active film and a second insulator film on the surface of the substrate after the third photolithographic step, a fourth photolithographic step Q8 of patterning the second insulator film, the semiconductor conductive film and the ohmic contact film to form a semiconductor portion and removing the semiconductor active film and the second insulator film above the pixel electrode and, further, forming a contact hole for connecting the gate wiring and the source wiring, a step Q9 of forming a second metal film on the surface of the substrate after the fourth photolithographic step, and a step Q10 of patterning the second metal film to form a gate electrode and a wiring therefor above a portion between the source electrode and the drain electrode, and removing the second metal film above the pixel electrode and at the periphery of the semiconductor.

For overcoming the foregoing problems, there is provided in accordance with a seventeenth aspect of the present invention, a method for producing an electro-optical device comprising:

a step R1 of forming a light screening thin film on the surface of the substrate, a first photolithographic step R2 of patterning the light screening thin film to form a light screening film, a step R3 of forming a first insulator film, a first metal film and an ohmic contact film on the surface of the substrate after the first photolithographic step, a second photolithographic step R4 of patterning the ohmic contact film and the first metal film to form a semiconductor channel portion on the light screening film and, further, forming a source electrode, a drain electrode and a source wiring, a step R5 of forming a semiconductor active film on the surface of the substrate after the second photolithographic step, a third photolithographic step R6 of patterning the semiconductor active film to form a semiconductor portion above the light screening film, a step R7 of forming a second insulator film on the surface of the substrate after the third photolithographic step, a fourth photolithographic step R8 of patterning the second insulator film to form a contact hole for connecting the gate wiring and the source wiring and a contact hole for connecting the drain electrode and the pixel electrode on both sides of the semiconductor portion, a step R9 of forming a transparent conductive film on the surface of the substrate after the fourth photolithographic step, and a step R10 of patterning the transparent conductive film to form a gate electrode above the semiconductor portion, and forming a gate electrode wiring and forming a pixel electrode.

For overcoming the foregoing problems, there is provided in accordance with a eighteenth aspect of the present invention, a method for producing an electro-optical device comprising:

a step S1 of forming a light screening thin film on the surface of the substrate, a first photolithographic step S2 of patterning the light screening thin film to form a light screening film, a step S3 of forming a first insulator film, a transparent conductive film and an ohmic contact film on the surface of the substrate after the first photolithographic step, a second photolithographic step S4 of patterning the ohmic contact film and the transparent conductive film to form a semiconductor channel portion above the light screening film and, further, forming a source electrode, a drain electrode and a wiring therefor and a pixel electrode, a step S5 of forming a semiconductor active film and a second insulator film on the surface of the substrate after the second photolithographic step, a third photolithographic step S6 of patterning the second insulator film and the semiconductor active film to form a semiconductor portion, and forming a contact hole for connecting the gate wiring and the source wiring, a step S7 of forming a metal film on the surface of the substrate after the third photolithographic step, and a fourth photolithographic step S8 of patterning the metal film to form a gate electrode and a wiring therefor above the semiconductor portion and isolating the semiconductor portion with respect to each of the pixel electrodes.

In a nineteenth aspect of the present invention, there is provided a method for producing the electro-optical device according to the eighth, fourteenth or seventeenth aspect wherein the First metal film used comprises a conductive metal film and a barrier film, and the barrier film used comprises a material which is less oxidized than the conductive metal film or a material which solid solubilizes as a conductive oxide to the transparent conductive film.

In a twentieth aspect of the present invention, the electro-optical material as defined in any one of claims 1 to 19 is liquid crystals.

In accordance with the first to the twentieth aspect of the present invention, since the number of the photolithographic steps can be reduced to 4 or 5 steps as compared with the prior art requiring seven steps, the yield can be improved and the production efficiency is improved by so much as the number of steps is reduced, and the production cost can be decreased.

In accordance with the third to nineteenth aspect of the present invention, since layers causing voltage drop such as the passivation film or the gate insulator film are not present on the transparent conductive film for applying a voltage to the electro-optical material such as a liquid crystal layer, the voltage can be applied efficiently to the liquid crystals. In accordance with the fourth aspect of the present invention, since the first insulator film, the semiconductor active film, the ohmic contact film and the metal film can be stacked continuously in lamination, improvement for the throughput and lowering of the contact resistance are possible. In addition, since the source wiring comprises four layers of the semiconductor active film, the ohmic contact film, the metal film and the transparent conductive film, lowering of the resistance and redundancy to wire disconnection can be attained.

In accordance with the seventh aspect of the present invention, since the source wiring comprises four layers of the transparent conductive film, the metal film, the ohmic contact film and the semiconductor active film, lowering of the resistance and redundancy to wire disconnection can be attained.

In accordance with the eighth aspect of the invention, different from the structure in other aspects, since the pixel electrode is isolated by the insulator film not being formed in a layer which is identical with the source wiring or the gate wiring, there is no worry of causing short-circuiting between each of the source wirings or between each of the gate wirings caused by failure in forming the pixel electrode thereby enabling to improve the yield.

In accordance with the eleventh to nineteenth aspect of the present invention, since the light screening film is formed below the semiconductor portion and the light screening film inhibits an incident light from below the semiconductor portion to the semiconductor portion, incident light from the back of the semiconductor portion can be inhibited, and the light screening Film inhibits generation of a light current caused by the incident light.

In accordance with the eighth, fourteenth or seventeenth aspect of the present invention, since Al or Ta having higher electroconductivity than Ti can be used instead of the existent Ti as the material for the wiring-constituent film, the barrier film provides an antioxidant effect even if it is exposed to an oxidative atmosphere in the subsequent photolithographic step to ensure a contact performance between the film and other conductive films, so that the problem of signal delay is less caused and this is advantageous for making the size of the liquid crystal panel larger. Further, since the film thickness can be reduced for the wiring made of the Al or Ta film than in the case of the wiring made of the Ti film, a step in the stepped portion for the entire thin Film transistor device can be reduced to improve the step coverage, so that the yield can be improved.

DESCRIPTION OF THE ACCOMPANYING DRAWINGS

PREFERRED EMBODIMENT

The present invention will be explained more in details by way of preferred embodiments.

Figure 1:
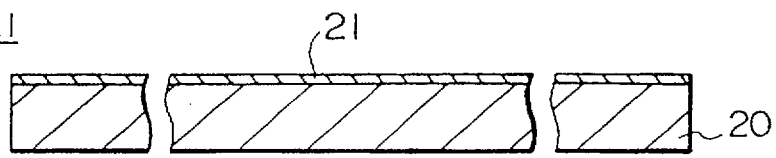
FIG. 1 is a cross sectional view illustrating a state of forming a transparent conductive film on a substrate as a first embodiment according to the present invention.
Figure 2:
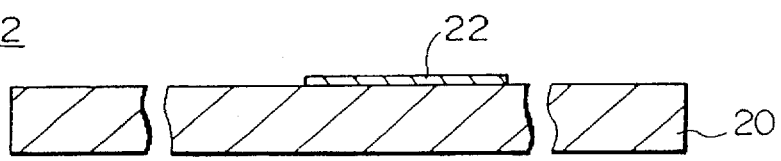
FIG. 2 is a cross sectional view illustrating a state of forming a transparent pixel electrode in the first embodiment.

FIG. 1 to FIG. 10 explained a first embodiment of the present invention. In this embodiment, as shown in FIG. 1, a transparent conductive film 21, for example, made of ITO (Indium Tin Oxide) is formed in a step A1 by a film-forming method such as reactive sputtering on a transparent substrate 20, for example, made of glass. The thickness of the transparent conductive film 20 to be formed can be for example about 700 angstrom.

The substrate 20 is preferably applied with a surface cleaning treatment by using, for example, a brush cleaning device or an ultraviolet ray irradiation device for removal of organic materials. Further, the transparent conductive film 21 may be formed after forming a surface stabilization film, for example, made of $TaO_x$ by a treatment such as reactive sputtering on the surface of the substrate after cleaning.

Figure 170:
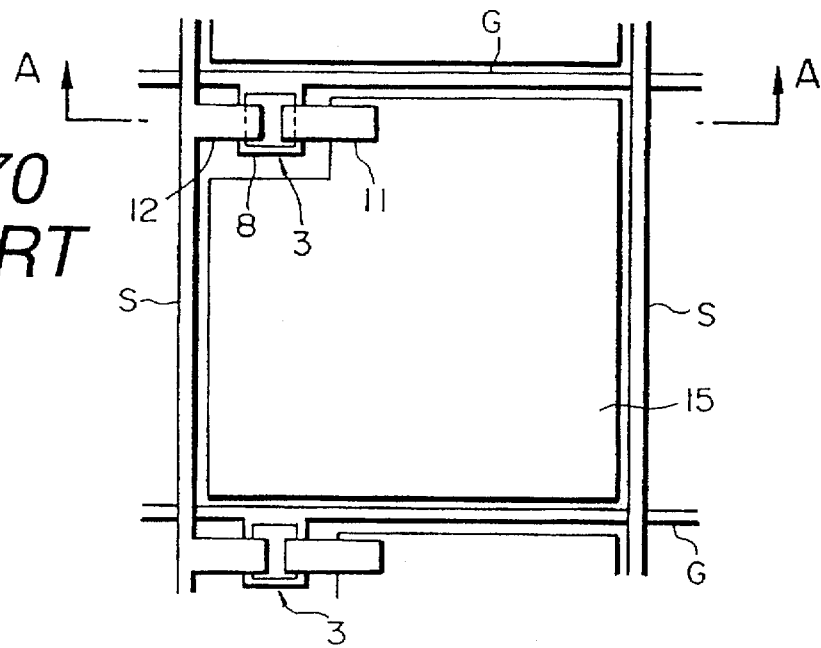
FIG. 170 is a plan view illustrating a structural example of a thin film transistor array substrate of the prior art.
Figure 171:
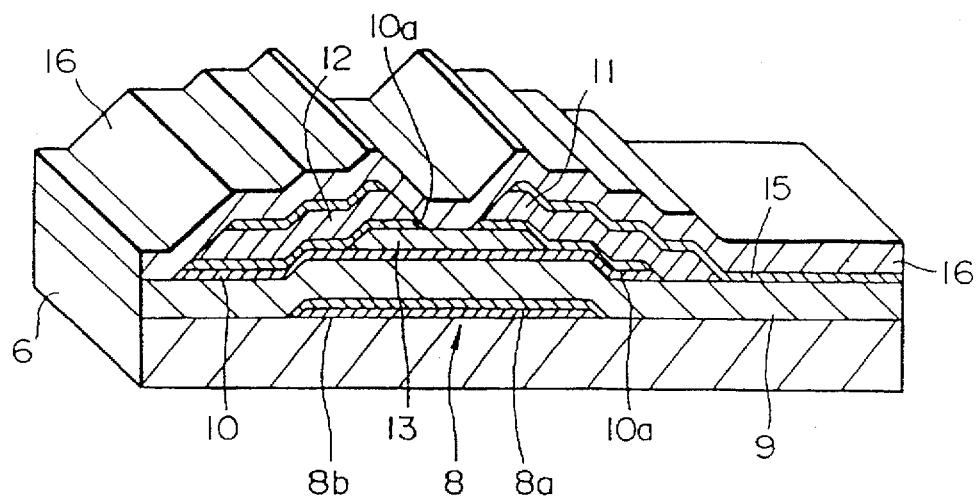
FIG. 171 is a cross sectional view illustrating a structural example of a thin film transistor array substrate of the prior art.

Then, in a first photolithographic step A2, the substrate 20 with the transparent conductive film 21 is fabricated as described below. At first, the substrate 20 is cleaned, a photoresist is coated on the transparent conductive film 21 and then exposure and development are applied over the entire upper surface by way of a photomask to transfer the pattern of the photomask to the photoresist. Then, the transparent conductive film 21 is wet-etched by using an etching solution of a composition comprising, for example, $HCl+HNO_3+H_2O$ and then the photoresist is peeled off to form a transparent pixel electrode 22 shown in FIG. 2 on the substrate 20. The planar shape of the transparent pixel electrode 22 may be identical with that of the existent transparent pixel electrode 15 shown in FIG. 170 or identical with that of a usual transparent pixel electrode known so far. Accordingly, the photomask used in the previous step may be of a pattern identical with that used so far. Accordingly, although only one transparent pixel electrode 22 is shown in the drawing, a plurality of transparent pixel electrodes are actually formed being arranged on the substrate 20.

Figure 3:
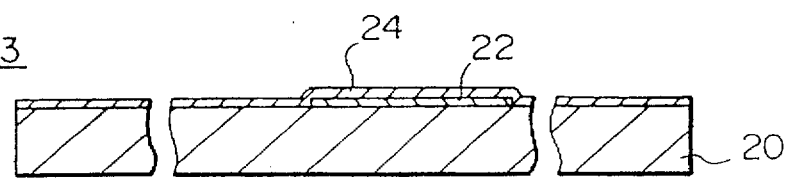
FIG. 3 is a cross sectional view illustrating a state of forming a first metal film on the surface of the substrate in the first embodiment.

After forming the transparent pixel electrode 22, the substrate 20 with the transparent pixel electrode 22 is cleaned in a step A3, and a first metal 24 formed from a conductive thin metal film made of a conductive material such as Cr, Ta, Mo and Al is formed on the surface as shown in FIG. 3. The thickness of the first metal film 24 formed in this step can be, for example, of about 1,000 angstrom.

Figure 4:
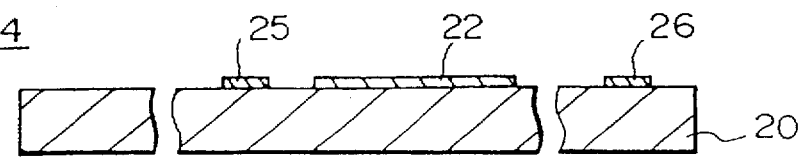
FIG. 4 is a cross sectional view illustrating a state after applying a second photolithographic step in the first embodiment.

Then, in a second photolithographic step A4, the substrate 20 with the first metal film is cleaned, and treatments such as resist coating, exposure, development, etching and resist peeling are applied as in the first photolithographic seep Al described previously to pattern the first metal film 24 and form a gate electrode 25 and a gate wiring 26 on the substrate 20 as shown in FIG. 4. The planar shape for the gate electrode 25 and the gate wiring 26 may be basically identical with that of the structure in the prior art shown in FIG. 170. Accordingly, an identical photomask with that of the prior art may be used for forming them. Further, if the first metal material 24 is made of Cr, an etching solution of a composition comprising, for example, $(NH_4)_2(Ce(NO_3)_6)$ $+HNO_3+H_2O$ can be used.

Figure 5:
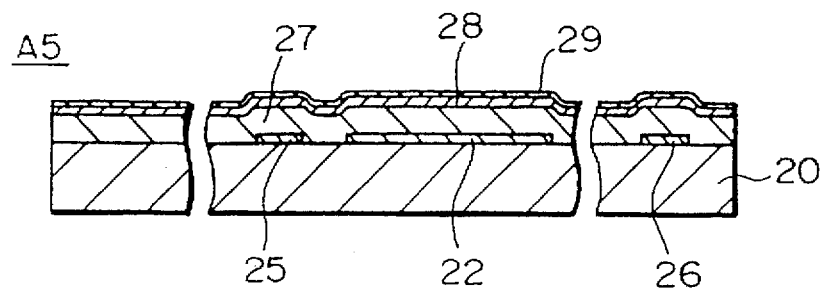
FIG. 5 is a cross sectional view illustrating a state of forming a first insulator film, a semiconductor active film and an ohmic contact film on the surface of the substrate in the first embodiment.

After forming the gate electrode 25 and the gate wiring 26, a first insulator film 27 comprising $SiN_x$, a semiconductor active film 28 comprising a-Si(i) (intrinsic amorphous silicon) and an ohmic contact film 29 comprising (a-Si) ($n^+$) are stacked in a step A5 as shown in FIG. 5. In this step, each of the films can be formed, for example, to such a thickness as: the first insulator film 27 to about 3,000 angstrom, the semiconductor active film 28 to about 1,000 angstrom and the ohmic contact film 29 to about 200 angstrom, respectively.

Figure 6:
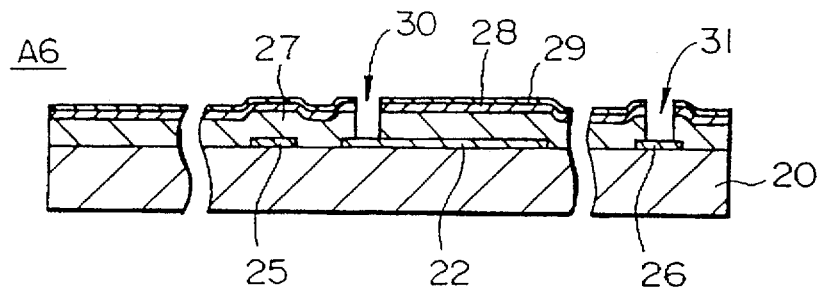
FIG. 6 is a cross sectional view illustrating a state after applying a third photolithographic step in the first embodiment.

Then, in a third photolithographic step A6, the ohmic contact film 29, the semiconductor active film 28 and the first insulator film 27 are fabricated by a method such as dry etching using $SF_6+O_2$ gas to form a contact hole 30 leading to the transparent pixel electrode 22, and a contact hole 31 leading to the gate wiring 26 as shown in FIG. 6.

Figure 7:
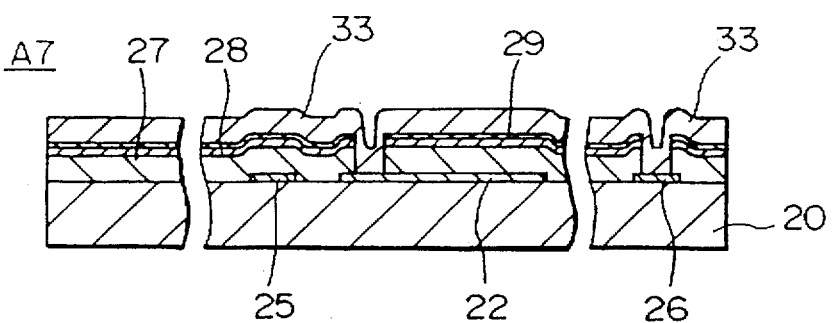
FIG. 7 is a cross sectional view illustrating a state of forming a second metal film in the first embodiment.
Figure 8:
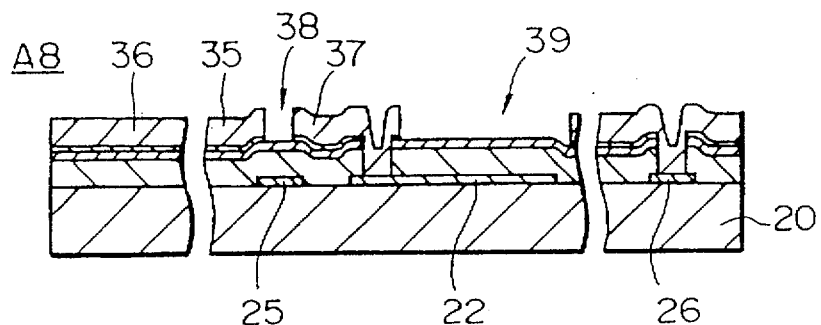
FIG. 8 is a cross sectional view illustrating a state after applying a fourth photolithographic step in the first embodiment.

Then, in a step A7, the substrate 20 after forming the contact holes is cleaned, and a second metal film 33 of a laminate structure comprising a conductive film made, for example, of Cr and a conductive film made, for example, of Al is formed on the upper surface as shown in FIG. 7. The second metal film 33 is connected with the transparent pixel electrode 22 by way of the contact hole 30 and connected with the gate wiring 28 by way of the contact hole 31 formed in the previous step. Further, the Cr film can be formed to a thickness, for example, about 1,000 angstrom and the Al film can be formed to a thickness, For example, of about 2,000 angstrom in this step.

After forming the second metal film 33, the Cr film and the Al film of the second metal film are patterned by a method such as wet etching in a fourth photolithographic step A8 to form a source electrode 35, a source wiring 36 and a drain electrode 37, and portions of the second metal film 33 and the ohmic contact film 29 above the gate electrode 25 are removed to form a channel portion 38 and, at the same time, the second metal film 33 and the ohmic contact film 29 above the transparent pixel electrode 22 are removed to Form a perforation 39.

Upon conducting the wet etching, LEC-B3 trade name products manufactured by Nagase Co. can be used as an etching solution For Fabricating the Cr film, a composition comprising $H_3PO_4+HNO_3+CH_3COOH+H_2O$ can be used for fabrication of the Al film, and a composition comprising $HF+HNO_3$ can be used for fabrication of the ohmic contact film 29.

Figure 9:
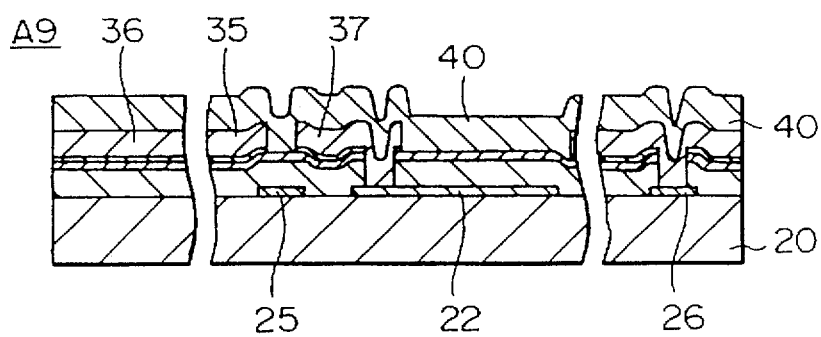
FIG. 9 is a cross sectional view illustrating a state of forming a passivation film on the surface of the substrate in the first embodiment.

Successively, in a step A9, the substrate 20 after the above-described treatments is cleaned, and a passivation film 40 comprising an insulating material such as $SiN_x$ is formed at the cleaned surface by a method such as plasma CVD as shown in FIG. 9. The passivation film 40 formed in this step can be formed to a thickness, for example, of about 4,000 angstrom.

After forming the passivation film 40, a portion of the passivation film 40 and a portion of the semiconductor active film 28 above the transparent pixel electrode 22 are removed by dry etching in a fifth photolithographic step A10 to form a perforation 41 above the transparent pixel electrode 22 to make a portion above the transparent pixel electrode light permeable and, at the same time, a contact hole 42 is formed for a source wiring connection terminal.

Further, in the fifth photolithographic step A10, the semiconductor active film 28 below the source electrode 35, the drain electrode 37 and the source wiring 36 is c fabricated using the passivation film 40 as a mask to isolate the same from other portions. That is, it is isolated from the semiconductor active film 28 of other adjacent thin film transistors having the gate wiring 26 in common.

Figure 10:
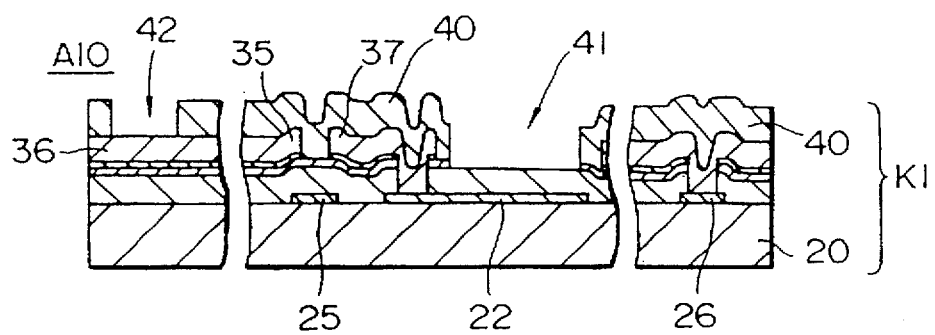
FIG. 10 is a cross sectional view illustrating a state after applying a fifth photolithographic step in the first embodiment.
Figure 11:
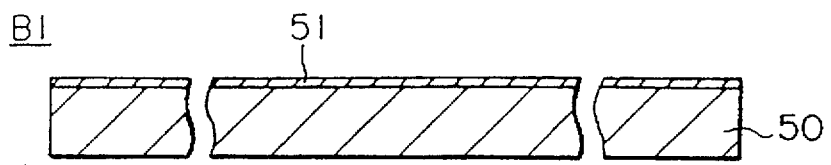
FIG. 11 is a cross sectional view illustrating a state of forming a first metal film on the surface of the substrate in a second embodiment.
Figure 12:
FIG. 12 is a cross sectional view illustrating a state of forming a gate electrode and a gate wiring by a first photolithographic step on a substrate in the second embodiment.

By way of the above-described steps, a thin film transistor array substrate K1 of a structure shown in FIG. 10 can be obtained. In the production method in this embodiment, since five photolithographic steps may suffice in the entire steps, the number of steps can be decreased as compared with the prior art process requiring seven photolithographic steps and the production steps can be simplified by so much to improve the yield and reduce the production cost.

Further, the thin film transistor array substrate K1 of this embodiment is used for constituting a liquid crystal display device (electro-optical device) by sealing liquid crystals between the substrate K1 and another substrate paired therewith like that in the liquid crystal display device of the prior art. In the structure of this embodiment, the perforation 41 is formed above the transparent pixel electrode 22, and the transparent pixel electrode 22 controls the orientation of liquid crystal molecules by way of the perforation 41 thereby enabling liquid crystal display.

FIG. 11 to FIG. 19 explain a second embodiment according to the present invention. In this embodiment, a first metal film 51 formed from a conductive thin metal film made of a conductive material such as Cr, Ta, Mo and Al is at first formed on a transparent substrate 50, for example, made of glass shown in FIG. 11 in a step B1. The thickness of the first metal film 51 formed in this step may be, for example, about 1,000 angstrom.

Then, in a first photolithographic step B2, the substrate 50 with the first metal film 51 is fabricated as below. At first, after cleaning the substrate 50 and coating a photoresist on the first metal film 51, exposure and development are applied to the entire upper surface by way of a photomask to transfer a pattern on the photomask to the photoresist.

Then, in a case where the first metal film 51 is a film made of Cr, wet etching is applied by using an etching solution of a composition comprising, for example, $(NH_4)_2(Ce(NO_2)_6)$ $+HNO_3+H_2O$ and, successively, the photoresist is peeled to form a gate electrode 52 and a gate wiring 53 shown in FIG.

12 on the substrate 50. The planar shape for the gate electrode 52 and the gate wiring 53 may be identical with that of the gate electrode 8 and the gate electrode G of the prior art shown in FIG. 170, or with the shape of a usual gate electrode or gate wiring known so far.

Accordingly, a photomask of an identical pattern with that used so far may be used in the previous step. Accordingly, although only a portion of the gate electrodes and the gate wirings is illustrated in the drawing, a plurality of gate electrodes 52 and gate wiring 53 are actually formed on the substrate 50.

Figure 13:
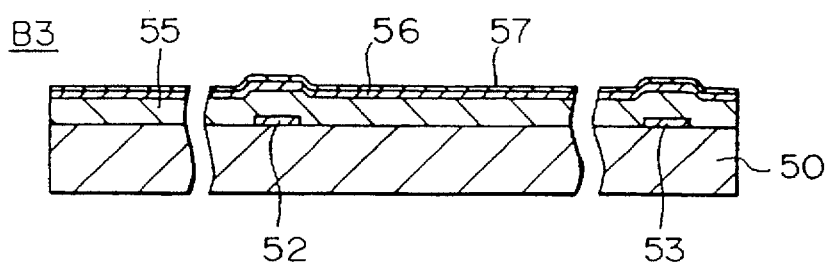
FIG. 13 is a cross sectional view illustrating a state of forming a first insulator film, a semiconductor active film and an ohmic contact film on the surface of the substrate in the second embodiment.

After forming the gate electrode 52 and the gate wiring 53, the substrate 50 on which they are formed is cleaned and a first insulator film 55 made of $SiN_x$, a semiconductor active film 56 made of a-Si(i) and an ohmic contact film 57 made of a-Si($n^+$) are stacked on the surface in a step B3 as shown in FIG. 13. In this step, each of the films can be formed to such a thickness, for example, the first insulation film 55 to about 3,000 angstrom, the semiconductor active film 56 to about 1,000 angstrom and the ohmic contact film 57 to about 200 angstrom, respectively.

Figure 14:
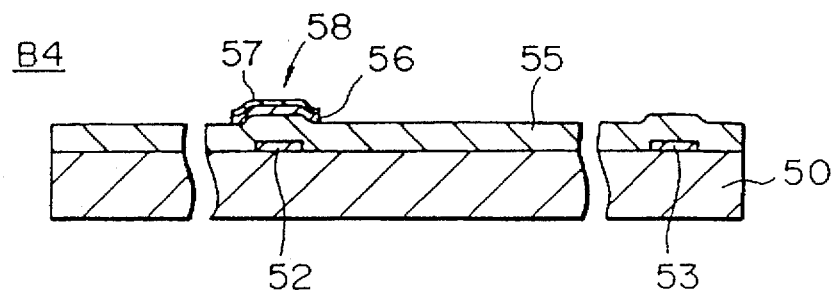
FIG. 14 is a cross sectional view illustrating a state of forming a semiconductor portion by a second lithographic step in the second embodiment.

Then, in a second photolithographic step B4, treatments such as resist coating, exposure, development, etching and resist peeling are applied as done in the first photolithographic step B2, and the semiconductor active film 56 and the ohmic contact film 57 are patterned to form a semiconductor portion 58 above the gate electrode 52 as shown in FIG. 14. The etching solution of a composition comprising, for example, $HF+HNO_3$ can be used for the step.

Figure 15:
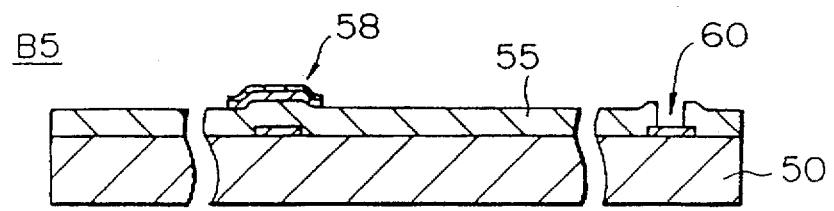
FIG. 15 is a cross sectional view illustrating a state of forming a contact hole by a third photolithographic step in the second embodiment.

After applying the second photolithographic step B4, the substrate 50 is cleaned, and a first insulator film 55 is patterned by a method such as dry etching using $SF_6+O_2$ gas in a third photolithographic step B5 to form a contact hole 60 leading to the gate wiring 53 as shown in FIG. 15.

Figure 16:
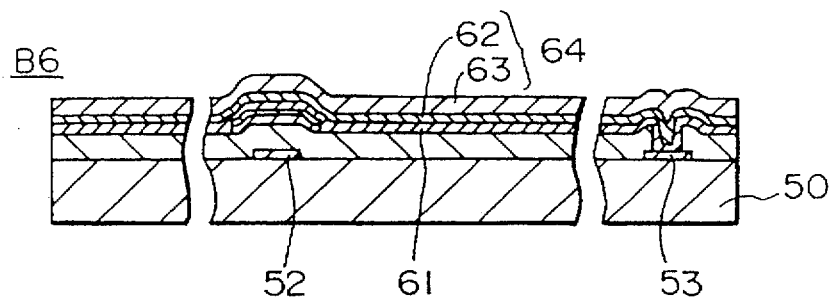
FIG. 16 is a cross sectional view illustrating a state of forming a second metal film on the surface of the substrate in the second embodiment.

Then, in a step B6, the substrate 50 after forming the contact hole is cleaned, and a transparent conductive film 61 made, for example, of ITO is formed on the upper surface and, further, a second metal film 64 of a laminate structure comprising a conductive film 62 made, for example, of Cr and a conductive film 63 made, for example, of Al is formed as shown in FIG. 16. The transparent conductive film 61 and the second metal film 64 are connected by way of the contact hole 60 formed in the previous step with the gate wiring 53. Further, each of the films may be formed in this step, for example, to such a thickness as the transparent conductive film 61 to, about 700 angstrom, the Cr conductive film 72 to about 1,000 angstrom and of the Al conductive film 63 to about 2,000 angstrom, respectively.

Figure 17:
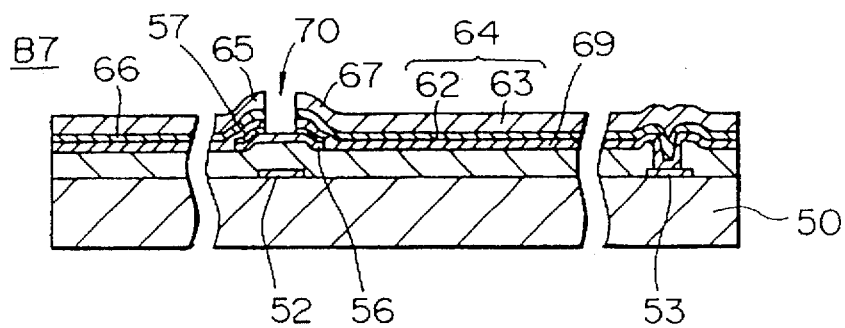
FIG. 17 is a cross sectional view illustrating a state of forming a source electrode, a drain electrode, a source wiring and a transparent pixel electrode and further forming a channel portion by a fourth photolithographic step in the second embodiment.
Figure 18:
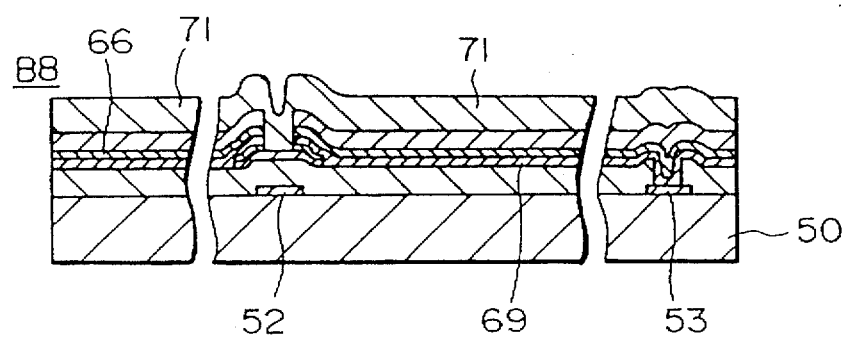
FIG. 18 is a cross sectional view illustrating a state of forming a passivation film on the surface of the substrate in the second embodiment.

In a fourth photolithographic step B7, after forming the second metal film 84, the second metal film 64 is patterned, for example, by wet etching to form a source electrode 68, a source wiring 66 and a drain electrode 67 shown in FIG. 17, and the transparent conductive film 61 is patterned by a method such as dry etching to form a transparent pixel electrode 69 and, further, a portion of the second metal film 64 and the ohmic contact film 87 above the gate electrode 82 is removed to form a channel portion 70.

Upon conducting the wet etching, the conductive Al film 63 can be fabricated by using an etching solution of a composition comprising $H_3PO_4+HNO_3+CH_3COOH+H_2O$, the conductive Cr film 63 can be fabricated by using LEC-B3 trade name of products manufactured by Nagase Co., the transparent ITO conductive film 61 can be fabricated by using $CH_3OH+Ar$ atmosphere and the ohmic contact film 57 can be fabricated by using a composition comprising $HF+HNO_3$.

Figure 19:
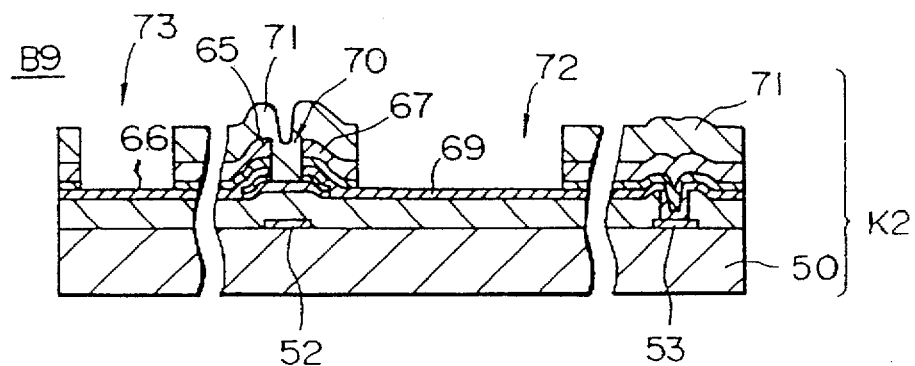
FIG. 19 is a cross sectional view illustrating a state after applying a fifth photolithographic step in the second embodiment.
Figure 20:
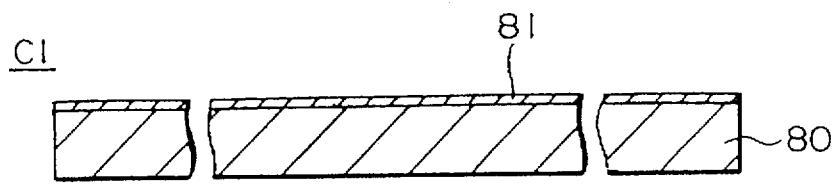
FIG. 20 is a cross sectional view illustrating a state of forming a second metal film on the surface of the substrate in a third embodiment.
Figure 21:
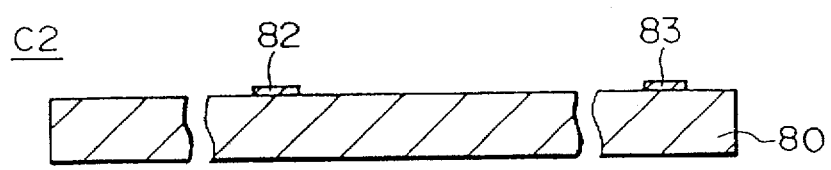
FIG. 21 is a cross sectional view illustrating a state of forming a gate electrode and a gate wiring by a first photolithographic step on a substrate in the third embodiment.

Successively, in a step B8, the substrate 50 after the above-described treatments is cleaned, and a passivation film 71 is formed to the cleaned surface by a method such as plasma CVD as shown in FIG. 19. The passivation film 40 can be formed in this step to a thickness, for example, of about 4,000 angstrom.

After forming the passivation film 71, a portion of the passivation film 71 above the transparent pixel electrode 69 is patterned by dry etching and the second metal film 64 is patterned by wet etching in a fifth photolithographic step B9 to form a perforation 72 above the transparent pixel electrode 69 to make a portion above the transparent pixel electrode 69 light permeable and, at the same time, a contact hole 73 is formed for a source wiring connection terminal.

By way of the above-described steps, a thin film transistor array substrate K2 of a structure shown in FIG. 19 can be obtained. In the production method in this embodiment, since five photolithographic steps may suffice in the entire steps, the number of steps can be decreased as compared with the prior art method requiring seven photolithographic steps and the production steps can be simplified by so much to improve the yield and reduce the production cost.

Further, the thin film transistor array substrate K2 of this embodiment is used for constituting a liquid crystal display device (electro-optical device) by sealing liquid crystals between the substrate K2 and another substrate paired therewith like that in the liquid crystal display device of the prior art. In the structure of this embodiment, the perforation 72 is formed above the transparent pixel electrode 69, and the transparent pixel electrode 69 controls the orientation of liquid crystal molecules by way of the perforation 72 thereby enabling liquid crystal display.

FIG. 20 to FIG. 28 explain a third embodiment according to the present invention. In this embodiment, a first metal film 81 formed from a conductive thin metal film made of a conductive material such as Cr, Ta, Mo and Al is at first formed on a transparent substrate 80, for example, made of glass shown in FIG. 20 in a step C1. The thickness of the first metal film 81 formed in this step may be, for example, about 1,000 angstrom.

Then, in a first photolithographic step C2, the substrate 90 with the first metal film 81 is fabricated as below. At first, after cleaning the substrate 80 and coating a photoresist on the first metal film 81, exposure and development are applied to the entire upper surface by way of a photomask to transfer a pattern on the photomask to the photoresist. Then, in a case where the first metal film 81 is a film made of Cr, wet etching is applied by using an etching solution of a composition comprising, for example, $(NH_4)_2(Ce(NO_2)_6)+HNO_3+H_2O$ and, successively, the photoresist is peeled off to form a gate electrode 82 and a gate wiring 83 shown in FIG. 21 on the substrate 80. The planar shape for the gate electrode 82 and the gate wiring 83 may be identical with that of the gate electrode 8 and the gate wiring G of the prior art shown in FIG. 170, or with the shape of a usual gate electrode or a gate wiring known so far. Accordingly, a photomask of an identical pattern with that used so far may be used in the previous step. Accordingly, although only a portion of the gate electrodes and the gate wirings is illustrated in the drawing, a plurality of gate electrodes 82 and gate wirings 83 are actually formed on the substrate So.

Figure 22:
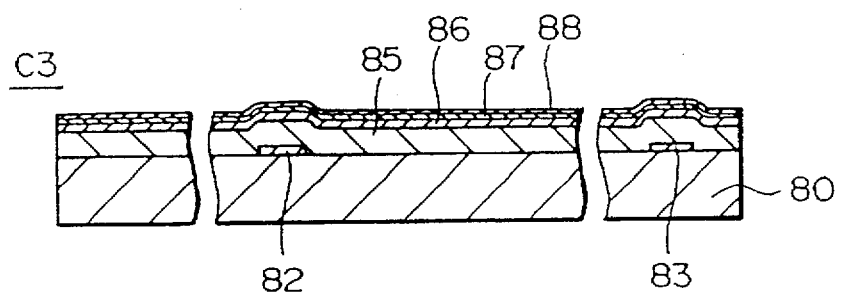
FIG. 22 is a cross sectional view illustrating a state of forming a first insulator film, a semiconductor active film, an ohmic contact film and a metal film on the surface of the substrate in the third embodiment.

After forming the gate electrode 82 and the gate wiring 83, the substrate 80 on which they are formed is cleaned, and a first insulator film 85 made of $SiN_x$, a semiconductor active film 86 made of a-Si(i), an ohmic contact film 87 made of a-Si($n^+$) and a metal film 88 made of Cr are stacked at the cleaned surface in a step C3 as shown in FIG. 22. In this step, each of the films can be formed to such a thickness, for example, as the first insulation film 85 to about 3,000 angstrom, the semiconductor active film 86 to about 1,000 angstrom, the ohmic contact film 87 to about 200 angstrom and the metal film 88 to about 500 angstrom, respectively. The metal film 88 also has an effect of preventing oxidation at the boundary of the ohmic contact film 87.

Figure 23:
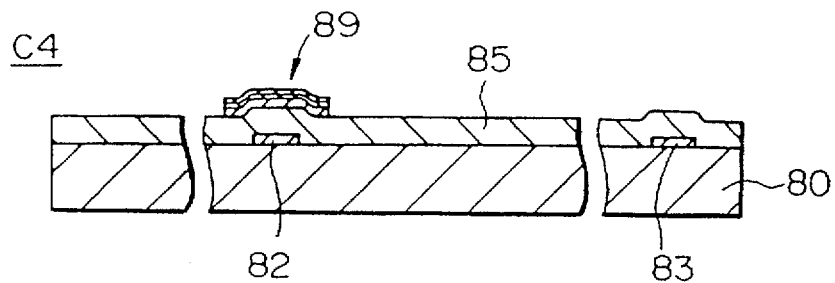
FIG. 23 is a cross sectional view illustrating a state of forming a semiconductor portion by a second lithographic step in the third embodiment.

Then, in a second photolithographic seep C4, treatments such as resist coating, exposure, development, etching and resist peeling are applied as done in the first photolithographic step C2, the metal film 88, the ohmic contact film 87 and the semiconductor active film 86 are patterned to form a semiconductor portion 89 above the gate electrode 82 as shown in FIG. 23. For the etching solution used in this step, for instance, LEC-B3, trade name of products manufactured by Nagase Co., can be used for fabrication of the metal Cr film 88, an etching solution of a composition comprising, for example, HF+HNO$_3$ can be used for fabrication of the semiconductor active film 86 and the ohmic contact film 87. In the second photolithographic step C4, the upper surface of the first insulator film 85 may be fabricated slightly by dry etching. In this case, dry etching may be conducted in SF$_6$+O$_2$ gas atmosphere.

Figure 24:
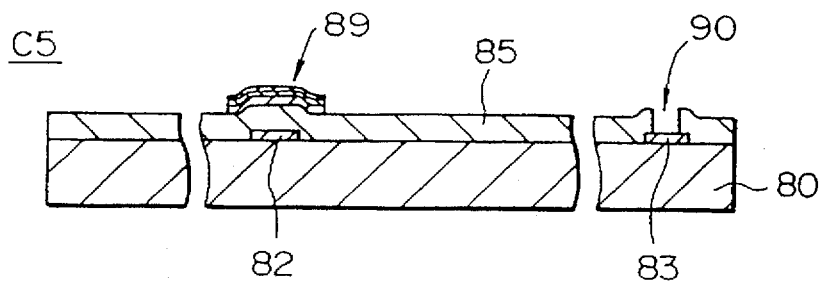
FIG. 24 is a cross sectional view illustrating a state of forming a contact hole by a third photolithographic step in the third embodiment.

After applying the second photolithographic step C4, the substrate 80 is cleaned, and a first insulator film 85 is patterned by a method such as dry etching using SF$_6$+O$_2$ gas in a third photolithographic step C5 to form a contact hole 90 leading to the gate wiring 83 as shown in FIG. 24.

Figure 25:
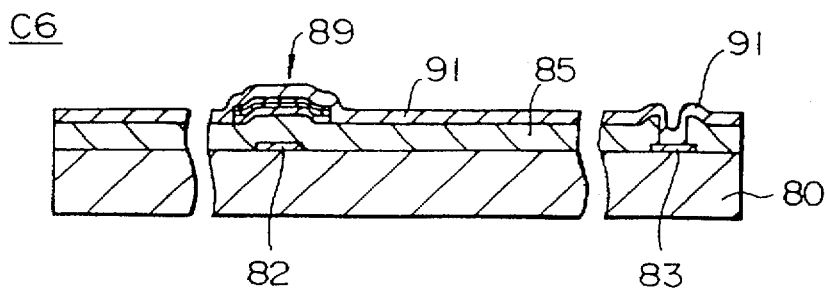
FIG. 25 is a cross sectional view illustrating a state of forming a transparent conductive film on the surface of the substrate in the third embodiment.

Then, in a step C6, the substrate 80 after forming the contact hole is cleaned, and a transparent conductive film 91 made, for example, of ITO is formed on the upper surface as shown in FIG. 25. The transparent conductive film 91 is connected by way of the contact hole 90 formed in the previous step with the gate wiring 83. Further, in this step, the transparent conductive film 91 can be formed to a thickness, for example, of about 1500 angstrom.

Figure 26:
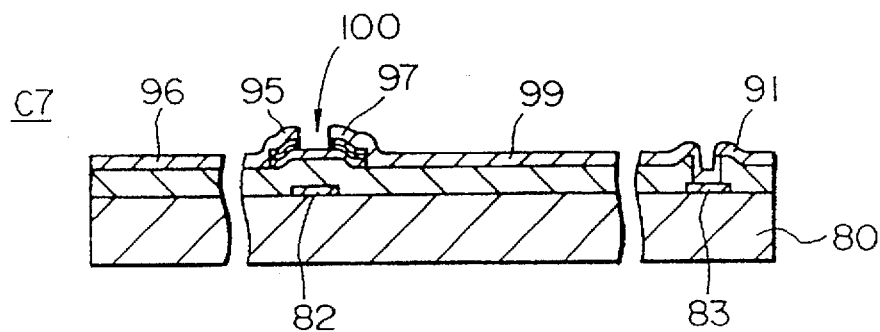
FIG. 26 is a cross sectional view illustrating a state of forming a source electrode, a drain electrode, a source wiring and a transparent pixel electrode and further forming channel portion by a fourth photolithographic step in the third embodiment.

In a fourth photolithographic step C7, after forming the transparent conductive film 91, the transparent conductive film 91 is patterned, for example, by wet etching to form a source electrode 95, a source wiring 96 and a drain electrode 97 shown in FIG. 26, and the transparent conductive film 91 is patterned to form a transparent pixel electrode 99 and, further, a portion of the transparent conductive film 91 and the ohmic contact film 87 above the gate electrode 82 is removed to form a channel portion 100.

Upon conducting the wet-etching, the transparent ITO conductive film 91 can be fabricated by using an etching solution of a composition comprising HCl+HNO$_3$+ CH$_3$COOH +H$_2$O, the metal Cr film 83 can be fabricated by using LEC-B3 trade name of products manufactured by Nagase Co. and the ohmic contact film 87 can be fabricated by using a composition comprising HF+HNO$_3$.

Figure 27:
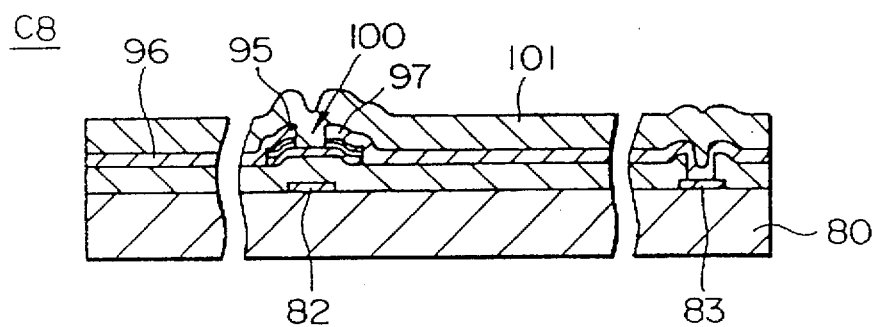
FIG. 27 is a cross sectional view illustrating a state of forming a passivation film on the surface of the substrate in the third embodiment.

Successively, in a step C8, the substrate 80 after the above-described treatments is cleaned, and a passivation film 101 is formed to the cleaned surface by a method such as plasma CVD as shown in FIG. 27. The passivation film 101 can be formed in this step to a thickness, for example, of about 4,000 angstrom.

In a fifth photolithographic step C9, after forming the passivation film 101, a portion of the passivation film 101 above the transparent pixel electrode 99 is patterned by dry etching to form a perforation 102 above the transparent pixel electrode 99 to make a portion above the transparent pixel electrode light permeable and, at the same time, a contact hole 102 is formed for a source wiring connection terminal.

Figure 28:
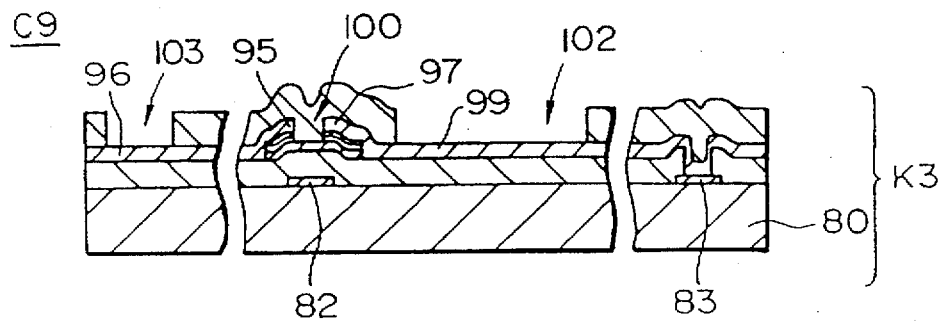
FIG. 28 is a cross sectional view illustrating a state after applying a fifth photolithographic step in the third embodiment.

By way of the above-described steps, a thin film transistor array substrate K3 of a structure shown in FIG. 28 can be obtained. In the production method in this embodiment, since five photolithographic steps may suffice in the entire steps, the number of steps can be decreased as compared with the prior art method requiring seven photolithographic steps and the production steps can be simplified by so much to improve the yield and reduce the production cost.

Further, the thin film transistor array substrate K3 of this embodiment is used for constituting a liquid crystal display device (electro-optical device) by sealing liquid crystals between the substrate K3 and another substrate paired therewith like that in the liquid crystal display device of the prior art. In the structure of this embodiment, the perforation 102 is formed above the transparent pixel electrode 99, and the transparent pixel electrode 99 controls the orientation of liquid crystal molecules by way of the perforation 102 thereby enabling liquid crystal display.

Further, since four layers of the first insulator film 85, the semiconductor active film 86, the ohmic contact film 87 and the metal film 88 can be formed continuously, high throughput can be attained. Further, since the source wiring 96 can be constituted with the four layers of the semiconductor active film 86, the ohmic contact film 87, the metal film 88 and the transparent conductive layer 91, electric resistivity can be reduced and redundancy can be provided in view of wire disconnection.

Figure 29:
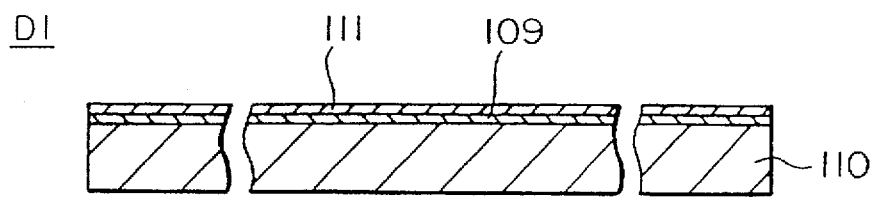
FIG. 29 is a cross sectional view illustrating a state of forming a transparent conductive film and a first metal film on the surface of the substrate in a fourth embodiment.
Figure 30:
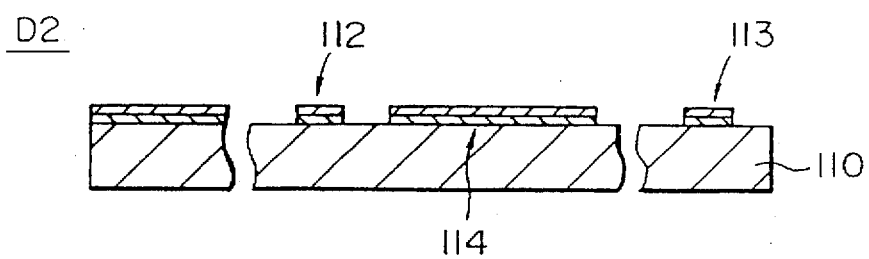
FIG. 30 is a cross sectional view illustrating a state of forming a gate electrode, a gate wiring and a transparent pixel electrode by a first photolithographic step on a substrate in the fourth embodiment.

FIG. 29 to FIG. 36 explain a fourth embodiment of the present invention. In this embodiment, a transparent conductive film 109, for example, made of ITO (Indium Tin Oxide) is at first formed in a step D1 by a film-forming method such as reactive sputtering on a transparent substrate 110, for example, made of glass as shown in FIG. 29. The transparent conductive film 109 can be formed in this step to a thickness of, for example, of about 700 angstrom. Further, a first metal film 111 formed from a thin conductive metal film made of a conductive material such as Cr, Ta, Mo, Al is formed on the transparent conductive film 109. The first metal film 111 can be formed in this step to a thickness, for example, of about 1,000 angstrom.

Then, in a first photolithographic step D2, the substrate 110 with the transparent conductive film 111 is fabricated as described below. At first, the substrate 110 is cleaned, a photoresist is coated on the first metal film 111 and then exposure and development are applied over the entire upper surface by way of a photomask to transfer the pattern of the photomask to the photoresist. Then, when the first metal film 111 is a Cr film, it is wet-etched by using an etching solution of a composition comprising, for example, (NH$_4$)$_2$(CE(NO$_3$)$_6$)+HNO$_3$+H$_2$O and then the transparent conductive film 109 is wet-etched by using an etching solution of a composition comprising HCl +HNO$_3$+H$_2$O to form a gate electrode 112, a gate wiring 112 and a transparent pixel electrode 114 shown in FIG. 30 on the substrate 110. The planar shape of the gate electrode 112, the gate wiring 113 and the transparent pixel electrode 114 may be identical with that of the gate electrode 8, the gate wiring G and the transparent pixel electrode 15 shown in FIG. 17O or identical with that of a usual transparent pixel electrode known so far. Accordingly, the photomask used in the previous step may be of a pattern identical with that used so far. Accordingly, although only a portion of the gate electrodes 112 and the gate wirings 113 is shown in the drawing, a plurality of gate electrodes 112, gate wirings 113 and transparent pixel electrodes 114 are actually formed being arranged on the substrate 110.

Figure 31:
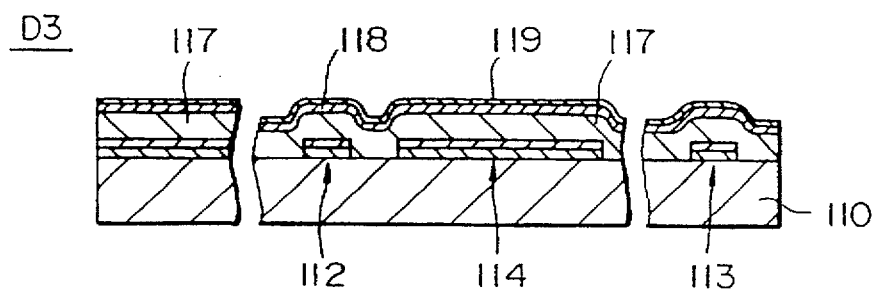
FIG. 31 is a cross sectional view illustrating a state of forming a first insulator film, a semiconductor active film and an ohmic contact Film on the surface of the substrate in the fourth embodiment.

After forming the gate electrode 112, the gate wiring 113 and the transparent pixel electrode 114, a first insulator film 117 comprising SiN$_x$, a semiconductor active film 118 comprising a-Si(i) and an ohmic contact film 119 comprising (a-Si)(n$^+$) are stacked in a step D8 as shown in FIG. 31. In this step, each of the films can be formed, for example, to a thickness as: the first insulator film 117 to about 3,000 angstrom, the semiconductor active film 118 to about 1,000 angstrom and the ohmic contact film 119 to about 200 angstrom, respectively.

Figure 32:
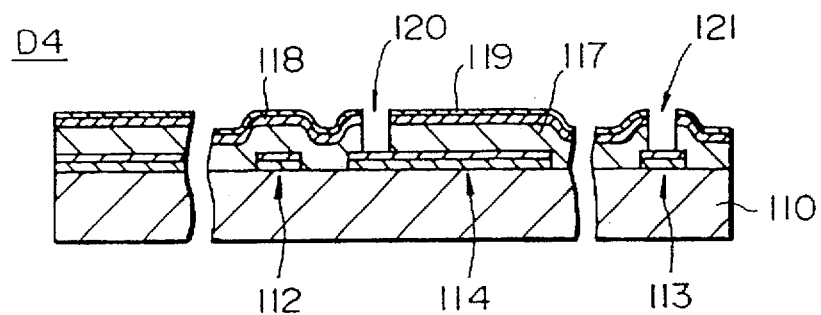
FIG. 32 is a cross sectional view illustrating a state of forming a contact hole by a second photolithographic step in the fourth embodiment.

Then, in a second photolithographic step D4, the ohmic contact film 119, the semiconductor active film 118 and the first insulator film 117 are fabricated by a method such as dry etching using SF$_6$+O$_2$ gas to form a contact hole 120 leading to the transparent pixel electrode 114, and a contact hole 121 leading to the gate wiring 113 as shown in FIG. 32.

Figure 33:
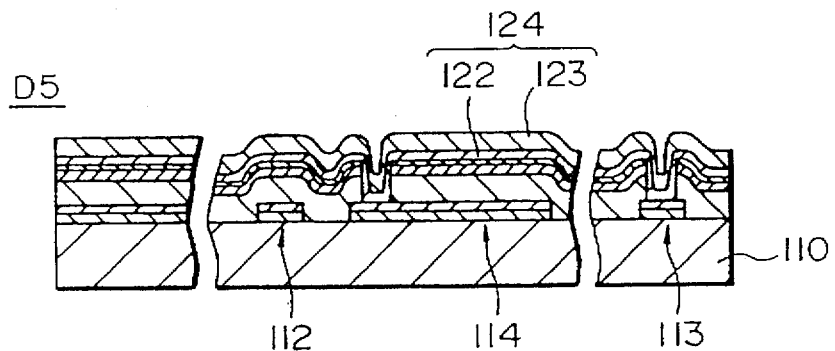
FIG. 33 is a cross sectional view illustrating a state of forming a second metal film on the surface of a substrate in the fourth embodiment.
Figure 34:
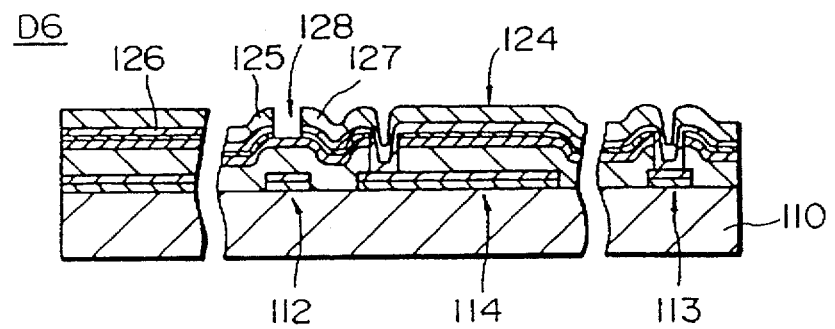
FIG. 34 is a cross sectional view illustrating a state of forming a source electrode, a drain electrode, a source wiring and a channel portion by a third photolithographic step in the fourth embodiment.

Then, in a step D5, the substrate 110 after forming the contact holes is cleaned, and a second metal film 124 of a laminate structure comprising a conductive film 122 made, for example, of Cr and a conductive film 123 made, for example, of Al is formed on the upper surface as shown in FIG. 33. The second metal film 124 is connected with the transparent pixel electrode 114 by way of the contact hole 120 and connected with the gate wiring 113 by way of the contact hole 121 formed in the previous step. Further, the Cr film can be formed in this step to a thickness, for example, of about 1,000 angstrom and the Al film can be formed to a thickness, for example, of about 2,000 angstrom in this step.

In a third photolithographic step D6 after forming the second metal film 124, the Cr film and the Al film of the second metal film 124 are patterned by a method such as wet etching to form a source electrode 125, a source wiring 126 and a drain electrode 127, and a portion of the second metal film 124 and the ohmic contact film 119 above the gate electrode 112 is removed to form a channel portion 128.

Upon conducting the wet-etching, LEC-B3 trade name of products manufactured by Nagase Co. can be used as an etching solution for fabricating the Cr film, a composition comprising H$_3$PO$_4$+HNO$_3$+CH$_3$COOH +H$_2$O can be used for fabrication of the Al film and a composition comprising HF+HNO$_3$ can be used for fabrication of the ohmic contact film 119.

Figure 35:
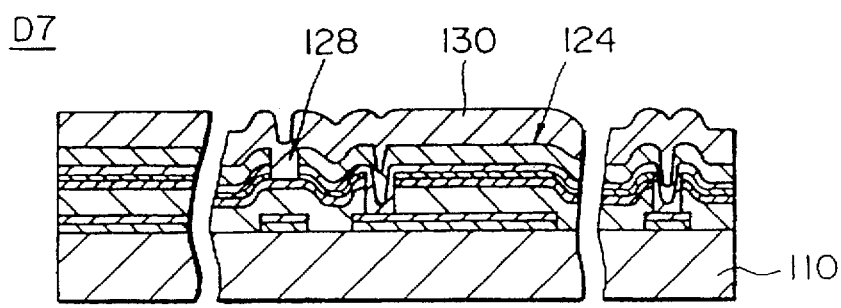
FIG. 35 is a cross sectional view illustrating a state of forming a passivation film on the surface of the substrate in the fourth embodiment.

Successively, in a step D7, the substrate 110 after the above-described treatments is cleaned, and a passivation film 130 comprising SiN$_x$ is formed at the cleaned surface by a method such as plasma CVD as shown in FIG. 35. The passivation film 130 can be formed in this step to a thickness, for example, of about 4,000 angstrom.

After forming the passivation film 130, a portion of the passivation film 130, a portion of the ohmic contact film 119, a portion of the semiconductor active film 118 and a portion of the first metal film 119 above the transparent pixel electrode 114 are removed by dry etching in a fourth photolithographic step D8 to form a perforation 131 above the transparent pixel electrode 114 to make a portion above the transparent pixel electrode light permeable and, at the same time, a contact hole 132 for a source wiring connection terminal and a contact hole for a gate wiring connection terminal (formed above the gate wiring 113 although not illustrated) are formed. Further, in the fourth photolithographic step D8, the semiconductor active film 118 below the drain electrode 127 and the source wiring 126 is isolated from the semiconductor active film 118 of other adjacent thin film transistors having the gate wiring 113 in common.

Figure 36:
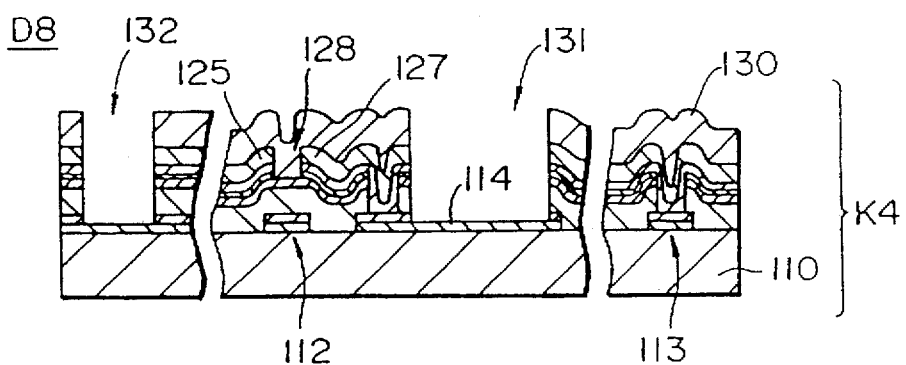
FIG. 36 is a cross sectional view illustrating a state after applying a fourth photolithographic step in the fourth embodiment.

By way of the above-described steps, a thin film transistor array substrate K4 of a structure shown in FIG. 36 can be obtained. In the production method in this embodiment, since four photolithographic steps may suffice in the entire steps, the number of steps can be decreased as compared with the prior art method requiring seven photolithographic steps and the production steps can be simplified by so much to improve the yield and reduce the production cost.

Further, the thin film transistor array substrate K4 of this embodiment is used for constituting a liquid crystal display device (electro-optical device) by sealing liquid crystals between the substrate K4 and another substrate paired therewith like that in the liquid crystal display device of the prior art. In the structure of this embodiment, the perforation 131 is formed above the transparent pixel electrode 114, and the transparent pixel electrode 114 controls the orientation of liquid crystal molecules by way of the perforation 131 thereby enabling liquid crystal display.

Figure 37:
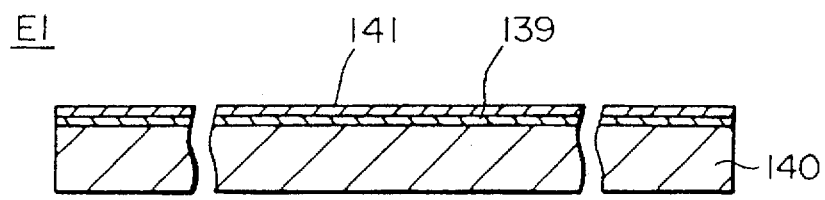
FIG. 37 is a cross sectional view illustrating a state of forming a transparent conductive film and a first metal film on the surface of the substrate in a fifth embodiment.
Figure 38:
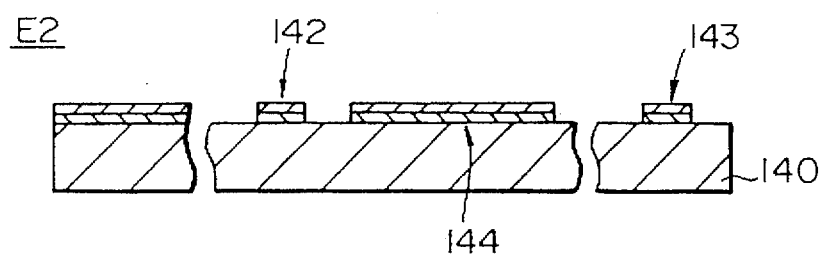
FIG. 38 is a cross sectional view illustrating a state of forming a gate electrode, a gate wiring and a transparent pixel electrode by a first photolithographic step on the substrate in the fifth embodiment.

FIG. 37 to FIG. 45 explain a fifth embodiment according to the present invention. In this embodiment, a transparent conductive film 139, for example, made of ITO (Indium Tin Oxide) is at first formed by a method such as reactive sputtering on a transparent substrate 140 in a step E1 as shown in FIG. 37. The transparent conductive film 139 can be formed in this step, for example, to a thickness of about 700 angstrom. Further, a first metal film 141 formed from a conductive thin metal film made of a conductive material such as Cr, Ta, Mo and Al is formed on the transparent conductive film 139. The first metal film 141 can be formed in this step, for example, to a thickness of about 1,000 angstrom.

Then in a first photolithographic step E2, the substrate 140 with the first metal film 141 is fabricated as below. At first, after cleaning the substrate 140 and coating a photoresist on the first metal film 141, exposure and development are applied to the entire upper surface by way of a photomask to transfer a pattern on the photomask to the photoresist. Then, in a case where the first metal film 51 is a Cr film, wet etching is applied by using an etching solution of a composition comprising, for example, (NH$_4$)$_2$(Ce(NO$_2$)$_6$)+ HNO$_3$+H$_2$O and, successively, the transparent conductive film 139 is wet-etched by using an etching solution of a composition comprising HCl+HNO$_3$+H$_2$O to form a gate electrode 142, a gate wiring 143 and a transparent pixel electrode 144 shown in FIG. 38 on the substrate 140. The planar shape for the gate electrode 142, the gate wiring 143 and the transparent pixel electrode 144 may be identical with that of the gate electrode 8, the gate electrode G and the transparent pixel electrode 15 of the prior art shown in FIG. 170, or with the shape of a usual gate electrode or gate wiring known so far. Accordingly, a photomask of an identical pattern with that used so far may be used in the previous step. Accordingly, although only a portion of the gate electrode and the gate wiring is illustrated in the drawing, a plurality of the gate electrodes 142, the gate wirings 143 and the transparent pixel electrodes 144 are actually formed on the substrate 40.

Figure 39:
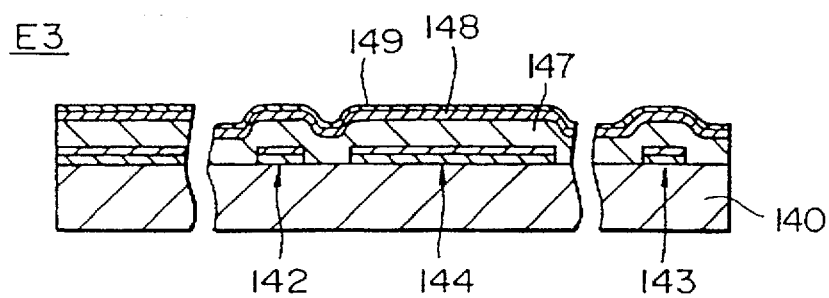
FIG. 39 is a cross sectional view illustrating a state of forming a first insulator film, a semiconductor active film and an ohmic contact film on the surface of the substrate in the fifth embodiment.

After forming the gate electrode 142, the gate wiring 143 and the transparent pixel electrode 144, a first insulator film 147 made of SiN$_x$, a semiconductor active film 148 made of a-Si(i) and an ohmic contact film 147 made of a-Si(n$^+$) are stacked in a step E3 as shown in FIG. 39. In this step, each of the films can be formed, for example, to such a thickness: as the first insulator film 147 to about 3,000 angstrom, the semiconductor active film 148 to about 1,000 angstrom and the ohmic contact film 149 to about 200 angstrom, respectively.

Figure 40:
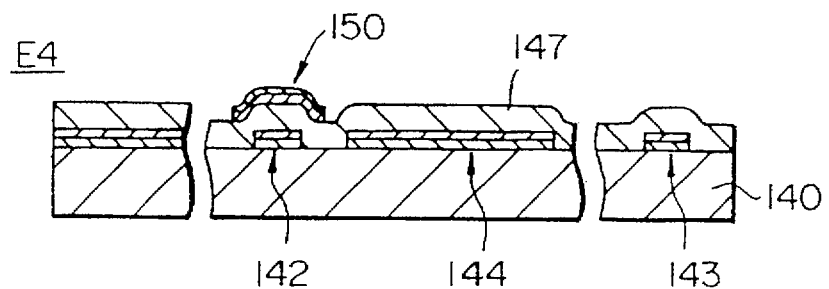
FIG. 40 is a cross sectional view illustrating a state of forming a semiconductor portion by a second lithographic step in the fifth embodiment.

Then, in a second photolithographic step E4, treatments such as resist coating, exposure, development, etching and resist peeling are applied as done in the first photolithographic step E2, and the semiconductor active film 148 and the ohmic contact film 149 are patterned to form a semiconductor portion 150 above the gate electrode 142 as shown in FIG. 40. The etching solution of a composition comprising, for example, $HF+HNO_3$ can be used for the step.

Figure 41:
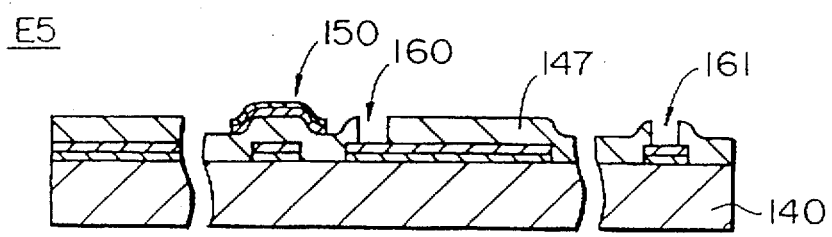
FIG. 41 is a cross sectional view illustrating a state of forming a contact hole by a third photolithographic step in the fifth embodiment.

After applying the second photolithographic step E4, the substrate 140 is cleaned, and the first insulator film 147 is patterned by a method such as dry etching using $SF_6+O_2$ gas in a third photolithographic step E5 to form a contact hole 160 leading to the transparent pixel electrode 144 and a contact hole 161 leading to the gate wiring 143 as shown in FIG. 41.

Figure 42:
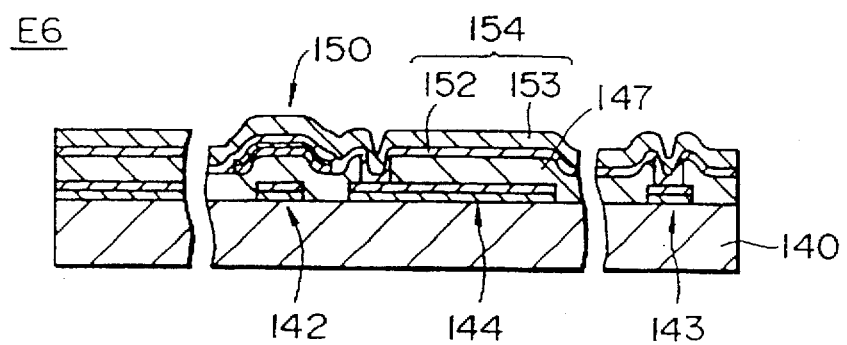
FIG. 42 is a cross sectional view illustrating a state of forming a second metal film on the surface of a substrate in the fifth embodiment.

Then, in a step E6, the substrate 150 after forming the contact holes is cleaned, and a second metal film 154 of a laminate structure comprising a conductive Cr film 152 and a conductive Al film 153 are formed on the upper surface as shown in FIG. 42. The second metal film 154 is connected by way of the contact hole 160 formed in the previous step with the transparent pixel electrode 144 and connected by way of the contact hole 161 to the gate wiring 143. Further, the Cr film 61 can be formed for example, to a thickness of about 1,000 angstrom and the conductive Al film can be formed for example, to a thickness of about 2,000 angstrom, respectively in this step.

Figure 43:
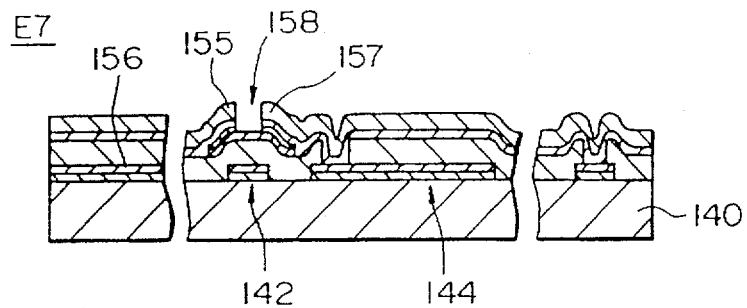
FIG. 43 is a cross sectional view illustrating a state of forming a source electrode, a drain electrode, a source wiring and a channel portion by a fourth photolithographic step in the fifth embodiment.

In a fourth photolithographic step E7, after forming the second metal film 154, the Al film and the Cr film of the second metal film 154 and the ohmic contact film 149 are patterned, for example, by wet etching to form a source electrode 155, a source wiring 156 and a drain electrode 157 as shown in FIG. 43, and a portion of the second metal film 154 and the ohmic contact film 149 above the gate electrode 142 is removed to form a channel portion 158.

Upon conducting the wet etching, the R film can be fabricated by using LEC-B3 trade name of products manufactured by Nagase Co., the Al film can be fabricated by using an etching solution of a composition comprising $H_3PO_4+HNO_3+CH_3COOH+H_2O$, and the ohmic contact film 149 can be fabricated by using a composition comprising $HF+HNO_3$.

Figure 44:
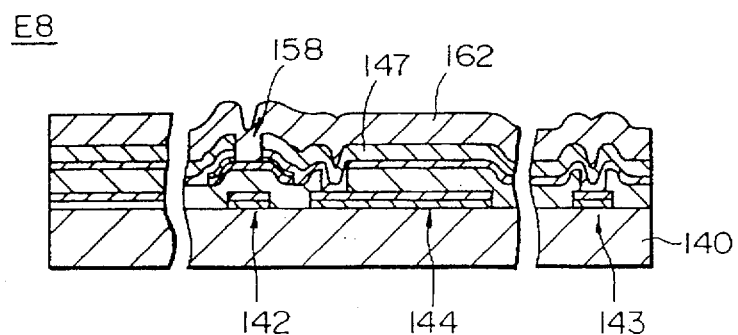
FIG. 44 is a cross sectional view illustrating a state of forming a passivation film on the surface of the substrate in the fifth embodiment.

Successively, in a step E8, the substrate 140 after the above-described treatments is cleaned, and a passivation film 162 comprising $SiN_x$ is formed at the cleaned surface by a method such as plasma CVD as shown in FIG. 44. The passivation film 162 can be formed in this step to a thickness, for example, of about 4,000 angstrom.

After forming the passivation film 162, a portion of the passivation film 130, a portion of the second metal film 154 and a portion of the first insulator film 147 above the transparent pixel electrode 144 are removed by wet etching and dry etching in a fifth photolithographic step E9 to form a perforation 165 above the transparent pixel electrode 144 to make a portion above the transparent pixel electrode light permeable and, at the same time, a contact hole 166 is formed for a source wiring connection terminal.

Figure 45:
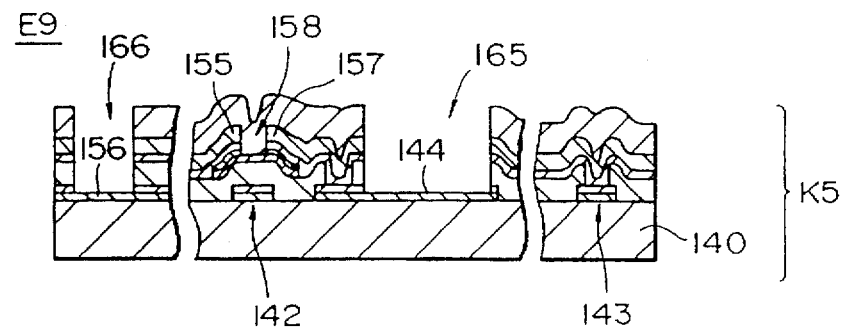
FIG. 45 is a cross sectional view illustrating a state after applying a fifth photolithographic step in the fifth embodiment.

By way of the above-described steps, a thin film transistor array substrate K5 of a structure shown in FIG. 45 can be obtained. In the production method in this embodiment, since five photolithographic steps may suffice in the entire steps, the number of steps can be decreased as compared with the prior art method requiring seven photolithographic steps and the production steps can be simplified by so much to improve the yield and reduce the production cost.

Further, the thin film transistor array substrate K5 of this embodiment is used for constituting a liquid crystal display device (electro-optical device) by sealing liquid crystals between the substrate K4 and another substrate paired therewith like that in the liquid crystal display device of the prior art. In the structure of this embodiment, the perforation 165 is formed above the transparent pixel electrode 144, and the transparent pixel electrode 144 controls the orientation of liquid crystal molecules by way of the perforation 165 thereby enabling liquid crystal display.

Figure 46:
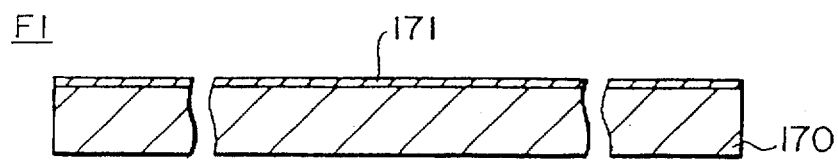
FIG. 46 is a cross sectional view illustrating a state of forming a first metal film on the surface of a substrate in the fifth embodiment.
Figure 47:
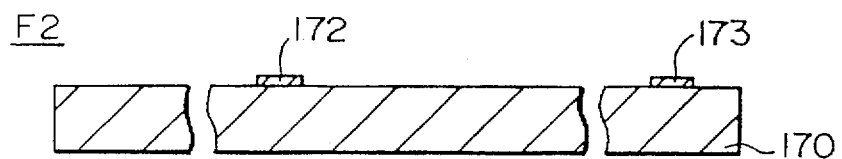
FIG. 47 is a cross sectional view illustrating a state of forming a Kate electrode and a gate wiring by a first lithographic step on a substrate in a sixth embodiment.

FIG. 46 to FIG. 53 explain a sixth embodiment according to the present invention. In this embodiment, a first metal film 171 formed from a conductive thin metal film made of a conductive material such as Cr, Ta, Mo and Al is at first formed on a transparent substrate 140, for example, made of glass in a step F1 as shown in FIG. 46. The first metal film 172 can be formed in this step to a thickness, for example, of about 1,000 angstrom.

Then in a first photolithographic step F2, the substrate 170 with the first metal film 171 is fabricated as below. At first, after cleaning the substrate 170 and coating a photoresist on the first metal film 171, exposure and development are applied to the entire upper surface by way of a photomask to transfer a pattern on the photomask to the photoresist. Then, in a case where the first metal film 51 is a Cr film, wet etching is applied by using an etching solution of a composition comprising, for example, $(NH_4)_2(Ce(NO_2)_6)+HNO_3+H_2O$ and, successively, the photoresist is peeled off to form a gate electrode 172, a gate wiring 173 shown in FIG. 47 on the substrate 170. Although only a portion of the actually formed gate electrodes and the gate wirings is illustrated in the drawing, a plurality of the gate electrodes 172 and the gate wirings 173 are actually formed on the substrate 170.

Figure 48:
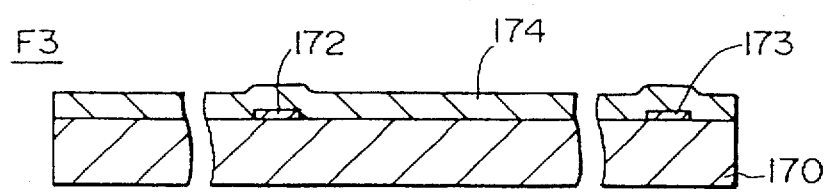
FIG. 48 is a cross sectional view illustrating a state of forming a first insulator film on the surface of a substrate in the sixth embodiment.

After forming the gate electrode 172 and the gate wiring 173, a first insulator film 174 made of $SiN_x$ is formed in a step F3 as shown in FIG. 48. In this step, the first insulation film 174 can be formed, for example, to a thickness of about 3,000 angstrom.

Figure 49:
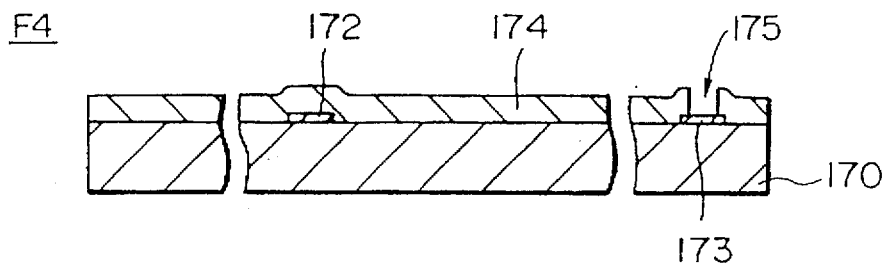
FIG. 49 is a cross sectional view illustrating a state of forming a contact hole by a second photolithographic step in the sixth embodiment.
Figure 50:
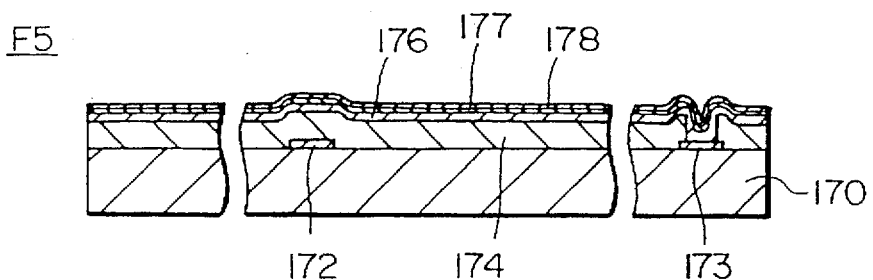
FIG. 50 is a cross sectional view illustrating a state of forming a transparent conductive film, a second metal film and an ohmic contact film of the substrate in the fifth embodiment.

After forming the first insulator film 174, the substrate 170 is cleaned, and the first insulator film 174 is patterned in a second photolithographic step F4 by a method such as dry etching using, for example, $SF_6+O_2$ gas to form a contact hole 175 leading to a gate wiring 173 as shown in FIG. 49.

Then, in a step F6, the substrate 170 after forming a contact hole is cleaned, a transparent conductive film 176 made, for example, of ITO is formed on the upper surface and, further, a second metal film 177 made, for example, of Cr and an ohmic contact film 178 made of a-Si($n^+$) are formed. The transparent conductive film 176 and the second metal film 177 are connected to the gate wiring 173 by way of the contact hole 175 formed in the step described previously. Further, in this step, the transparent conductive film 176 can be formed to a thickness, for example, of about 700 angstrom, the second metal film 177 made of Cr can be formed to a thickness, for example, of about 1,500 angstrom and the ohmic contact film 178 can be formed to a thickness, for example, of about 200 angstrom.

Figure 51:
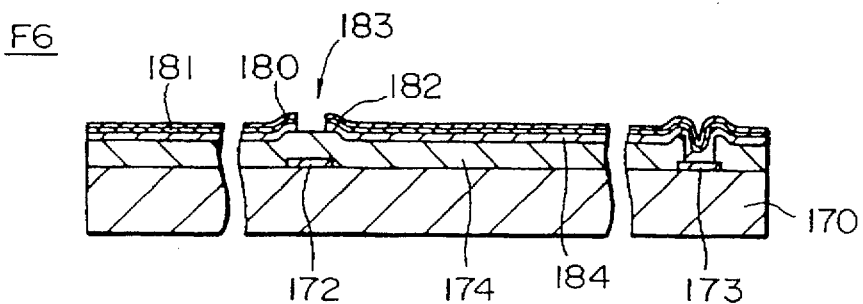
FIG. 51 is a cross sectional view illustrating a state of forming a source electrode, a drain electrode, a semiconductor portion and a transparent pixel electrode by a second photolithographic step in the sixth embodiment.

In a third photolithographic step F6, after forming the ohmic contact film 178, the ohmic contact film 178, the second metal film 177 and the transparent conductive film 176 are patterned by a method such as wet etching to form a source electrode 180, a source wiring 181, a drain electrode 182 and a channel portion 183 shown in FIG. 51, and a transparent pixel electrode 184 is formed.

For the etching solution used in the wet etching described above, the same solution as described in the previous embodiment can be used.

Figure 52:
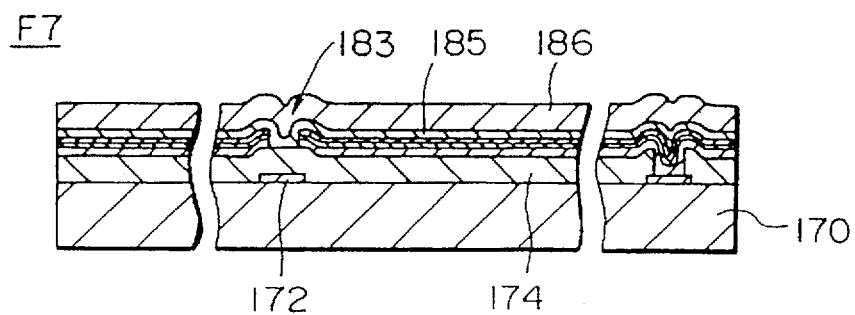
FIG. 52 is a cross sectional view illustrating a state of forming a passivation film on the surface of the substrate in the sixth embodiment.

Successively, in a step F7, the substrate 170 after the above-described treatments is cleaned, and a semiconductor active film 185 made of i-Si(i) and a passivation film 186 are formed at the cleaned surface by a method such as plasma CVD as shown in FIG. 52. The semiconductor active film 185 and the passivation film 186 in this step can be formed to a thickness, for example, of about 1,000 angstrom and of about 4,000 angstrom, respectively.

After forming the passivation film 186, a portion of the passivation film 186 and a portion of the semiconductor active film 185 above the transparent pixel electrode 184 are patterned by dry etching and a portion of the metal film 177 is patterned to the treated substrate 170 in a fourth photolithographic step F8 to form a perforation 187 above the transparent pixel electrode 184 to make a portion above the transparent pixel electrode light permeable and, at the same time, a contact hole 188 is formed for a source wiring connection terminal. Further, in the fourth photolithographic step F8, the semiconductor active film 185 below the drain electrode 182 and the source wiring 181 is isolated from the semiconductor active film 185 of other adjacent thin film transistors having the gate wiring 173 in common.

Figure 53:
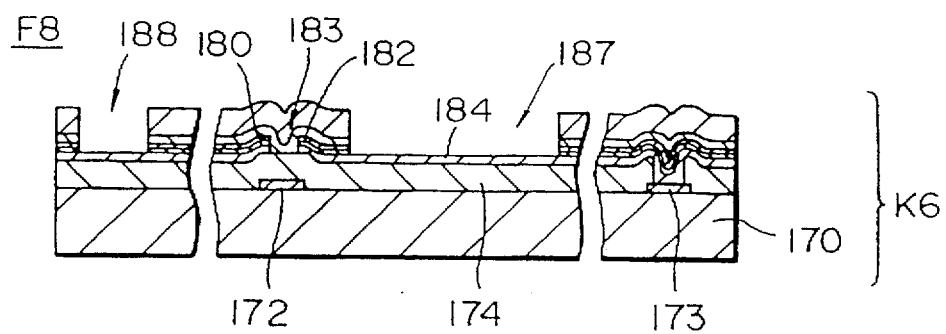
FIG. 53 is a cross sectional view illustrating a state after applying a fourth photolithographic step in the sixth embodiment.
Figure 54:
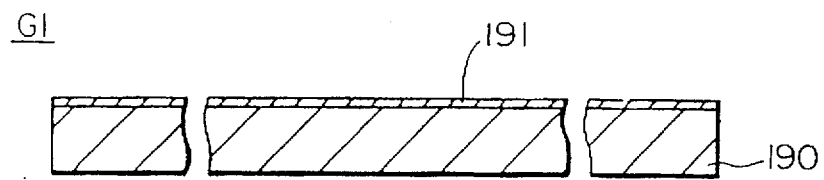
FIG. 54 is a cross sectional view illustrating a state of forming a first metal film on the surface of a substrate in a seventh embodiment.
Figure 55:
FIG. 55 is a cross sectional view illustrating a state of forming a gate electrode and a gate wiring by a first lithographic step on the substrate in the seventh embodiment.
Figure 56:
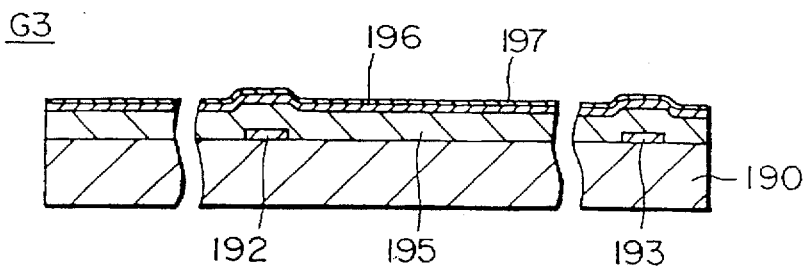
FIG. 56 is a cross sectional view illustrating a state of forming a first insulator film, a second metal film and an ohmic contact film on the surface of the substrate in the seventh embodiment.

By way of the above-described steps, a thin film transistor array substrate K6 of a structure shown in FIG. 53 can be obtained. In the production method in this embodiment, since five photolithographic steps may suffice in the entire steps, the number of steps can be decreased as compared with the prior art process requiring seven photolithographic steps and the production steps can be simplified by so much to improve the yield and reduce the production cost.

Further, the thin film transistor array substrate K6 of this embodiment is used for constituting a liquid crystal display device (electro-optical device) by sealing liquid crystals between the substrate K6 and another substrate paired therewith like that in the liquid crystal display device of the prior art. In the structure of this embodiment, the perforation 187 is formed above the transparent pixel electrode 184, and the transparent pixel electrode 184 controls the orientation of liquid crystal molecules by way of the perforation 187 thereby enabling liquid crystal display.

FIG. 54 to FIG. 63 explain a seventh embodiment according to the present invention. In this embodiment, a first metal film 191 formed from a conductive thin metal film made of a conductive material such as Cr, Ta, Mo and Al is at first formed on a transparent substrate 190, for example, made of glass shown in FIG. 54 in a step G1. The first metal film 191 can be formed in this step, for example, to a thickness of about 1,000 angstrom.

Then, in a first photolithographic step G2, the substrate 190 with the first metal film 191 is fabricated as below. At first, after cleaning the substrate 190 and coating a photoresist on the first metal film 191, exposure and development are applied to the entire upper surface by way of a photomask to transfer a pattern on the photomask to the photoresist. Then, in a case where the first metal film 51 is a film made of Cr, wet etching is applied by using an etching solution of a composition comprising, for example, $(NH_4)_2(Ce(NO_2)_6)+HNO_3+H_2O$ and, successively, the photoresist is peeled off to form a gate electrode 192 and a gate wiring 193 shown in FIG. 55 on the substrate 190. Although only a portion of the gate electrodes and the gate wirings are illustrated in the drawing, a plurality of the gate electrodes 192 and the gate wirings 193 are actually formed on the substrate 190.

Figure 58:
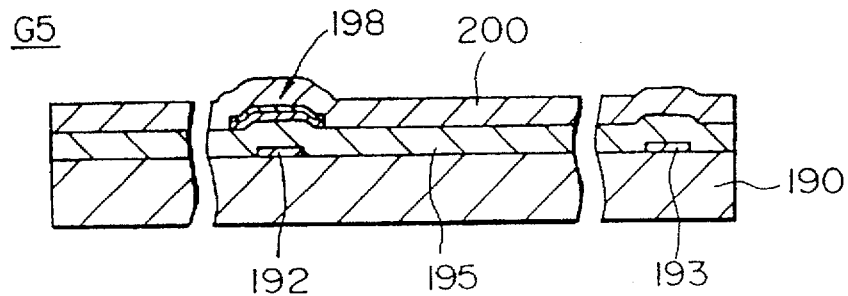
FIG. 58 is a cross sectional view illustrating a state of forming a second metal film on the surface of the substrate in the seventh embodiment.

After forming the gate electrode 192 and the gate wiring 193, the substrate 190 on which they are formed is cleaned and a first insulator film 195 made of $SiN_x$, a semiconductor active film 196 made of a-Si(i) and an ohmic contact film 197 made of a-si($n^+$) are stacked on the surface in a step G3 as shown in FIG. 58. In this step, each of the films can be formed to such a thickness, for example, as: the first insulator film 195 to about 3,000 angstrom, the semiconductor active film 196 to about 1,000 angstrom and the ohmic contact film 197 to about 200 angstrom, respectively.

Figure 57:
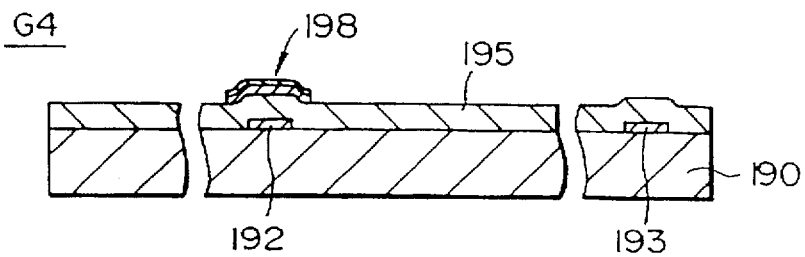
FIG. 57 is a cross sectional view illustrating a state of forming a contact hole by a second photolithographic step in the seventh embodiment.

Then, in a second photolithographic step G4, treatments such as resist coating, exposure, development, etching and resist peeling are applied as done in the first photolithographic step G2, and the semiconductor active film 196 and the ohmic contact film 197 are patterned to form a semiconductor portion 198 above the gate electrode 192 as shown in FIG. 57. The etching solution of a composition comprising, for example, $HF+HNO_3$ can be used for the step.

After applying the second photolithographic step G4, the substrate 190 is cleaned and a second metal film 200 comprising a conductive material such as Ti is formed on the upper surface as shown in FIG. 58. The second metal film can be formed in this step, for example, to a thickness of about 3,000 angstrom.

Figure 59:
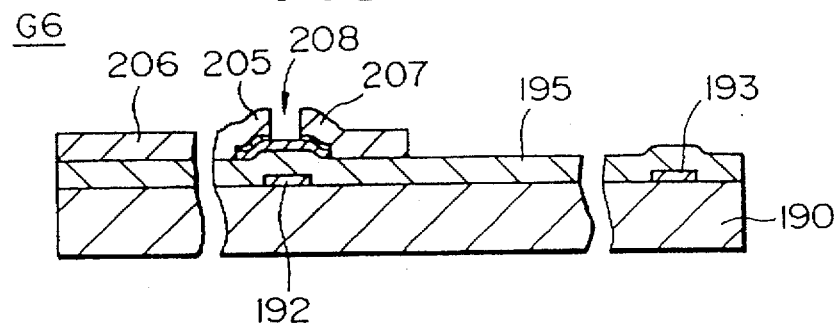
FIG. 59 is a cross sectional view illustrating a state of forming a source electrode, a drain electrode, a source wiring and a channel portion and channel portion by a third photolithographic step in the seventh embodiment.

In a third photolithographic step G6, after forming the second metal film 200, the second metal film 200 and the ohmic contact film 197 are patterned by a method such as wet etching to form a source electrode 20S, a source wiring 206, a drain electrode 207 and a channel portion 208 as shown in FIG. 59.

The etching solution of a composition comprising, for example, $HF+HNO_3$ can be used for the step.

Figure 60:
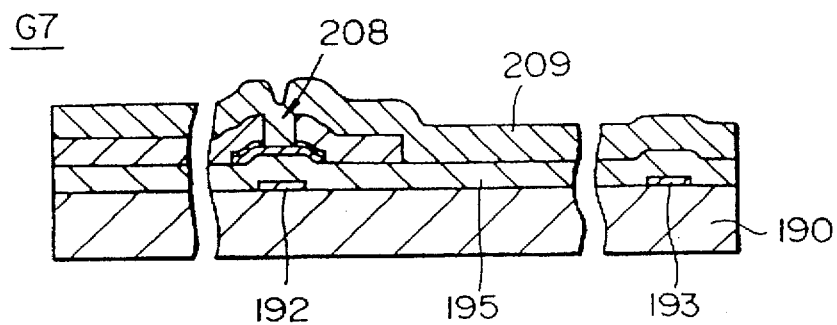
FIG. 60 is a cross sectional view illustrating a state of forming a passivation film on the surface of the substrate in the seventh embodiment.

Successively, in a step G7, the substrate 190 after the above-described treatments is cleaned, and a passivation film 209 is formed at the cleaned surface by a method such as plasma CVD as shown in FIG. 60. The passivation film 209 can be formed in this step, for example, to a thickness of about 4,000 angstrom.

Figure 61:
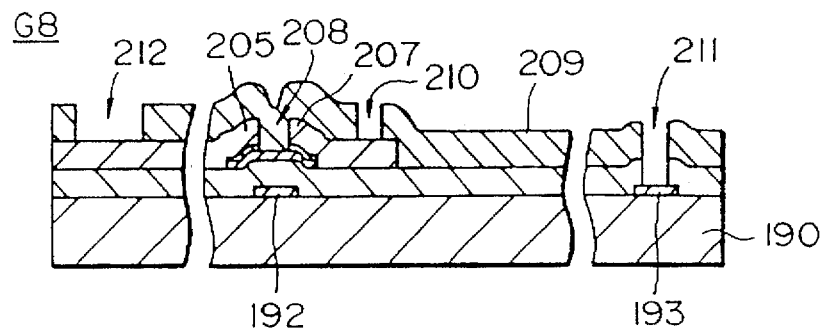
FIG. 61 is a cross sectional view illustrating a state of forming a contact hole to a passivation film by a fourth photolithographic step in the seventh embodiment.
Figure 62:
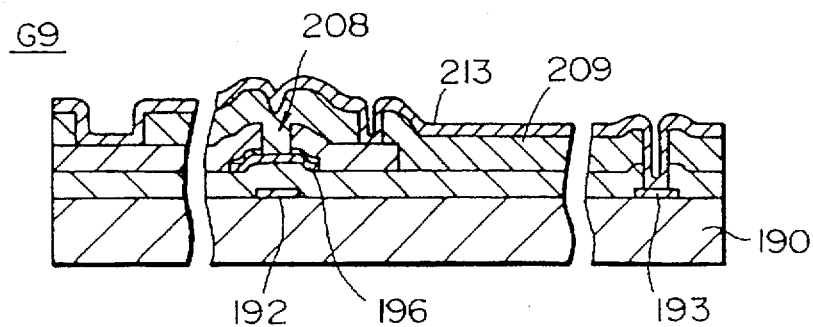
FIG. 62 is a cross sectional view illustrating a state of forming a transparent conductive film on the passivation film in the seventh embodiment.

After forming the passivation film 209, the passivation film 209 is patterned by dry etching using, for example, $SF_6+O_2$ gas in a fourth photolithographic step G8 to form a contact hole 210 leading to the drain electrode 207, a contact hole 211 leading to the gate wiring 193 and a contact hole 212 leading to the source wiring 206 to the treated substrate 190 as shown in FIG. 61.

In a step G9, a transparent conductive film 213 made of ITO is formed to the surface of the substrate 190 to which the contact hole has been formed. The transparent conductive film 213 can be formed to a thickness, for example, of about 1,500 angstrom.

Figure 63:
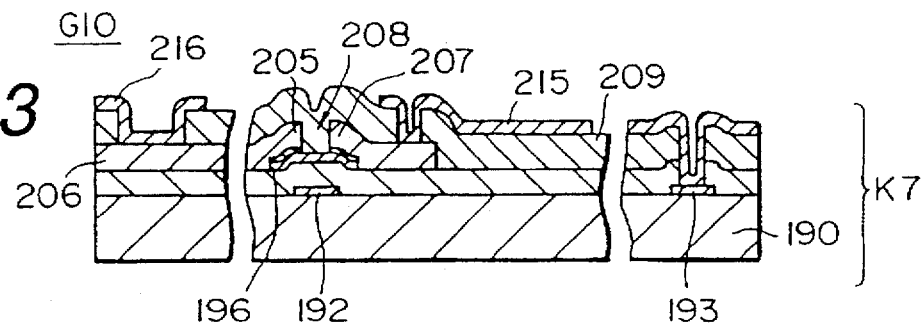
FIG. 63 is a cross sectional view illustrating a state of patterning the a passivation film to form a transparent pixel electrode by a fifth photolithographic step in the seventh embodiment.
Figure 64:
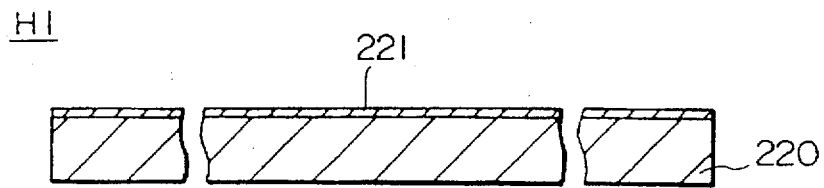
FIG. 64 is a cross sectional view illustrating a state of forming a first metal film on the surface of the substrate in an eighth embodiment.
Figure 65:
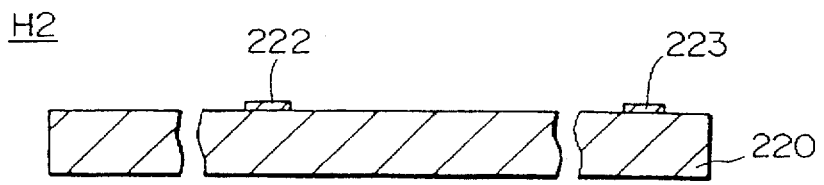
FIG. 65 is a cross sectional view illustrating a state of forming a gate electrode and a gate wiring by a first photolithographic step in the eighth embodiment.

Then, in a fifth photolithographic step G10, a portion of the transparent conductive film 213 is removed to form a transparent pixel electrode 215 and a terminal portion 216 for source wiring connection as shown in FIG. 63. For the etching solution, a composition comprising, for example, $HCl+HNO_3+H_2O$ can be used.

By way of the above-described steps, a thin film transistor array substrate K7 of a structure shown in FIG. 63 can be obtained. In the production method in this embodiment, since five photolithographic steps may suffice in the entire steps, the number of steps can be decreased as compared with the prior art process requiring seven photolithographic steps and the production steps can be simplified by so much to improve the yield and reduce the production cost.

Further, the thin film transistor array substrate K7 of this embodiment is used for constituting a liquid crystal display device (electro-optical device) by sealing liquid crystals between the substrate K7 and another substrate paired therewith like that in the liquid crystal display device of the prior art. In the structure of this embodiment, the transparent pixel electrode 215 controls the orientation of liquid crystal molecules disposed above it thereby enabling liquid crystal display. In this structure, since the transparent pixel electrode 215 and the liquid crystal molecules can be brought to a closer distance, an electric field can be applied efficiently to the liquid crystal molecules.

FIG. 64 to FIG. 73 explain &n eighth embodiment according to the present invention. In this embodiment, a first metal film 221 formed from a conductive thin metal film made of a conductive material such as Cr, Ta, Mo and Al is at first formed on a transparent substrate 220, for example, made of glass shown in FIG. 64 in a step H1. The first metal film 221 can be formed in this step to a thickness, for example, of about 1,000 angstrom.

Then, in a first photolithographic step H2, the substrate 220 with the first metal film 221 is fabricated as below. At first, after cleaning the substrate 220 and coating a photoresist on the first metal film 221, exposure and development are applied to the entire upper surface by way of a photomask to transfer a pattern on the photomask to the photoresist. Then, in a case where the first metal film 221 is a film made of Cr, wet etching is applied by using an etching solution of a composition comprising, for example, $(NH_4)_2(Ce(NO_2)_6)+HNO_3+H_2O$ and, successively, the photoresist is peeled off to form a gate electrode 222 and a gate wiring 223 shown in FIG. 6S on the substrate 220. Although only a portion of the gate electrodes and the gate wirings is illustrated in the drawing, a plurality of the gate electrodes 222 and the gate wirings 223 are actually formed on the substrate 220.

Figure 66:
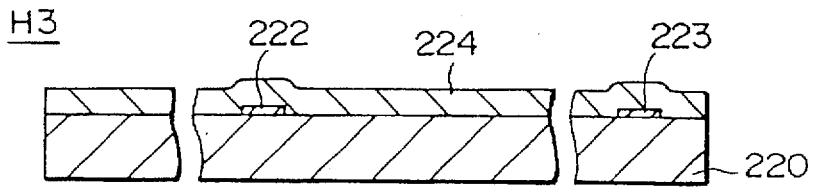
FIG. 66 is a cross sectional view illustrating a state of forming a first insulator film on the surface of the substrate in the eighth embodiment.

After forming the gate electrode 222 and the gate wiring 223, a first insulator film 224 made of $SiN_x$ is formed in a step H3 as shown in FIG. 66. In this step, the first insulation film 224 can be formed, for example, to a thickness of about 3,000 angstrom.

Figure 67:
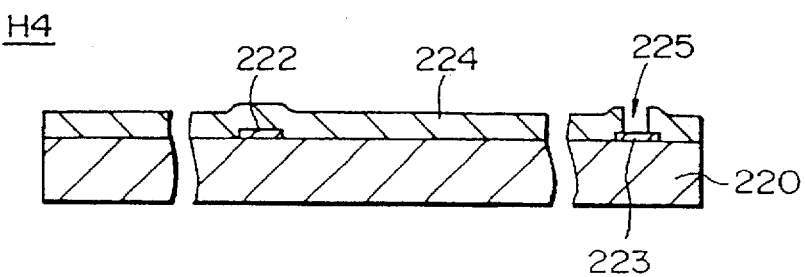
FIG. 67 is a cross sectional view illustrating a state of forming a contact hole by a second photolithographic step in the eighth embodiment.

After forming the first insulation film 224, the substrate 220 is cleaned, and the first insulator film 224 is patterned by a method such as dry etching using, for example, $SF_6+O_2$ gas in a second photolithographic step H4 to form a contact hole 225 leading to the gate wiring 223 as shown in FIG. 67.

Figure 68:
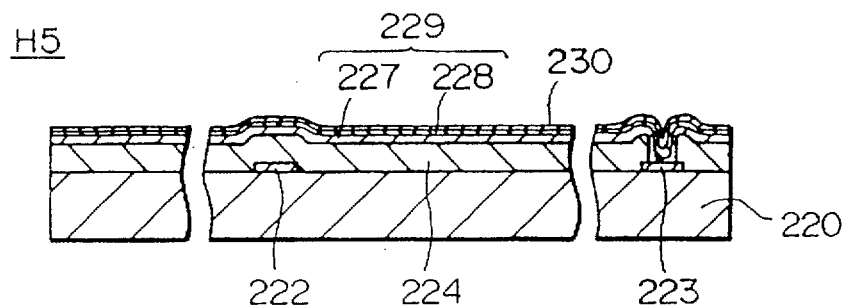
FIG. 68 is a cross sectional view illustrating a state of forming a second metal film and an ohmic contact film on the surface of the substrate in the eighth embodiment.

Then, in a step H5, the substrate 220 after forming the contact hole is cleaned and a second metal film 229 of a laminate structure comprising a conductive film 227, for example, made of Al and a conductive film 228, for example, made of Cr is formed on the upper surface as shown in FIG. 68. Further, an ohmic contact film 230 made of a-Si(n⁺) is formed on the second metal film 229.

The second metal film 229 is connected by way of the contact hole 225 formed in the step described previously with the gate wiring 223. In this step, each of the films can be formed, for example, to such a thickness as: the Al film to 2,000 angstrom, the Cr film to 1,000 angstrom and the ohmic contact film 230 to 200 angstrom, respectively.

Figure 69:
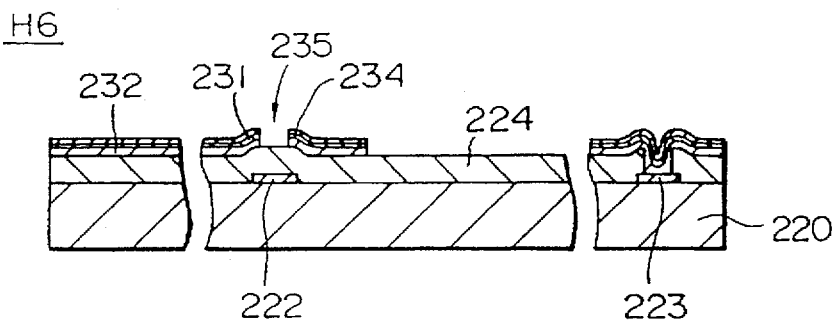
FIG. 69 is a cross sectional view illustrating a state of forming a source electrode, a drain electrode, a semiconductor portion and a channel portion by a second photolithographic step in the eighth embodiment.

After forming the ohmic contact film 230, the ohmic contact film 230 and the second metal film 229 are patterned by a method such as wet etching in a third photolithographic step H6, to form a source electrode 231, a source wiring 232, a drain electrode 234 and a channel portion 235 shown in FIG. 69.

The same etching solution as used in the embodiment described previously can be used for the etching solution in the wet etching.

Figure 70:
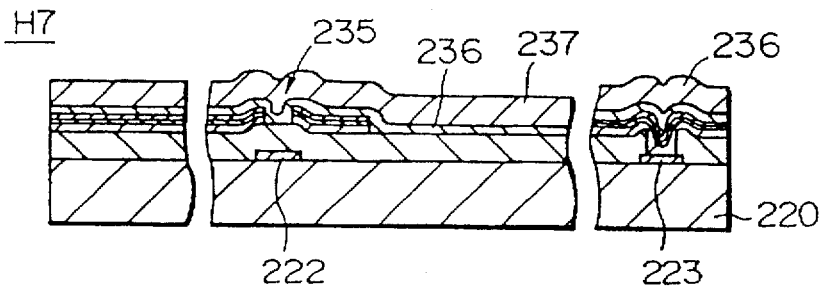
FIG. 70 is a cross sectional view illustrating a state of forming a passivation film on the surface of the substrate in the eighth embodiment.
Figure 71:
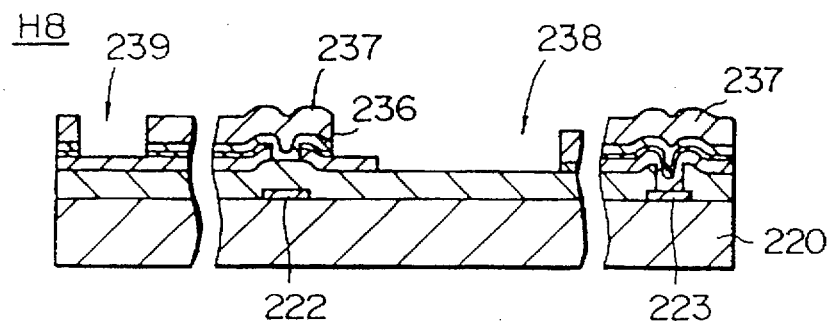
FIG. 71 is a cross sectional view illustrating a state after applying a fourth photolithographic step in the eighth embodiment.
Figure 72:
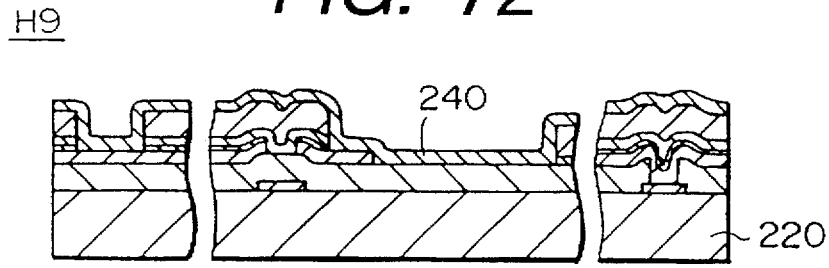
FIG. 72 is a cross sectional view illustrating a state of forming a transparent conductive film on the passivation film in the eighth embodiment.

Successively, in a step H7, the substrate 220 after the treatments is cleaned, and a semiconductor active film 236 and a passivation film 237 are formed on the surface by a method such as plasma CVD as shown in FIG. 70. In this step, the semiconductor active film 236 can be formed, for example, to a thickness of about 1,000 angstrom and the passivation film 237 can be formed, for example, to a thickness of 4,000 angstrom.

After forming the passivation film 237, a portion of the passivation film 237 is patterned by dry etching and, further, a portion of the semiconductor active film 236 is patterned by wet etching in a fourth photolithographic step H8 to form a perforation 238 above an area in which a transparent pixel electrode is to be formed, and a contact hole 239 for a source wiring connection terminal is formed to the treated substrate 220. Further, in the fourth photolithographic step HS, the semiconductor active film 236 on the drain electrode 234 and the source wiring 232 is isolated from semiconductor active film 236 of other adjacent thin film transistors having the gate wiring 223 in common.

In a step H9, a transparent conductive film 240 made of ITO is formed to the surface of the substrate 220 to which the contact hole has been formed. The transparent conductive film 240 can be formed to a thickness, for example, of about 700 angstrom.

Figure 73:
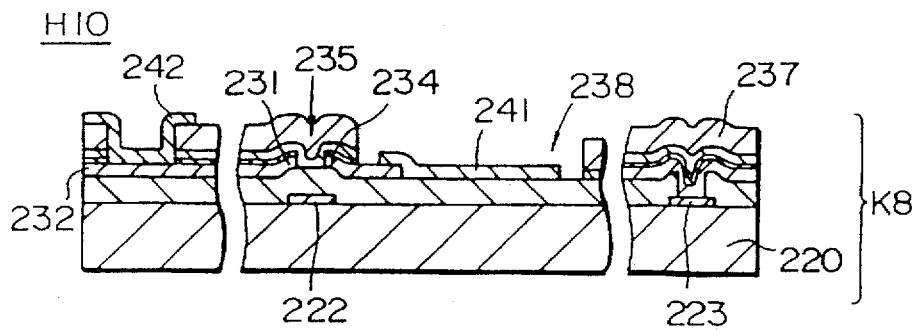
FIG. 73 is a cross sectional view illustrating a state of patterning the passivation film to form a transparent pixel electrode by fifth photolithographic step in the eighth embodiment.

Then, in a fifth photolithographic step H10, a portion of the transparent conductive film 240 is patterned by wet etching to form a transparent pixel electrode 241 and a terminal portion 242 for source wiring connection as shown in FIG. 73. For the etching solution, a composition comprising, for example, $HCl+HNO_3+H_2O$ can be used.

By way of the above-described steps, a thin film transistor array substrate K8 of a structure shown in FIG. 73 can be obtained. In the production method in this embodiment, since five photolithographic steps may suffice in the entire steps, the number of steps can be decreased as compared with the prior art method requiring seven photolithographic steps and the production steps can be simplified so much to improve the yield and reduce the production cost.

Further, the thin film transistor array substrate K8 of this embodiment is used for constituting a liquid crystal display device (electro-optical device) by sealing liquid crystals between the substrate KS and the other substrate paired therewith like that in the liquid crystal display device of the prior art. In the structure of this embodiment, the transparent pixel electrode 241 is formed at the bottom of the perforation 238 and, since the transparent pixel electrode 241 controls the orientation of the liquid crystal molecules by way of the perforation 238, liquid crystal display is enabled.

Figure 74:
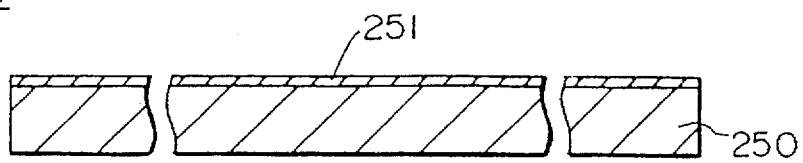
FIG. 74 is a cross sectional view illustrating a state of forming a first metal film on the surface of the substrate in a ninth embodiment.
Figure 75:
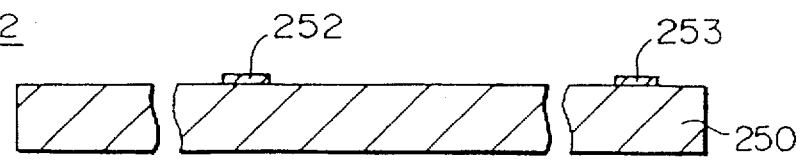
FIG. 75 is a cross sectional view illustrating a state of forming a gate electrode and gate wiring on the substrate by first photolithographic step in the ninth embodiment.

FIG. 74 to FIG. 83 explain a ninth embodiment according to the present invention. In this embodiment, a first metal film 251 formed from a conductive thin metal film made of a conductive material such as Cr, Ta, Mo and Al is at first formed on a transparent substrate 250, for example, made of glass in a step J1 as shown in FIG. 74. The first metal film 251 can be formed in this step to a thickness, for example, of about 1,000 angstrom.

Then in a first photolithographic step J2, the substrate 250 with the first metal film 251 is fabricated as below. At first, after cleaning the substrate 250 and coating a photoresist on the first metal film 251, exposure and development are applied to the entire upper surface by way of a photomask to transfer a pattern on the photomask to the photoresist. Then, in a case where the first metal film 251 is a Cr film, wet etching is applied by using an etching solution of a composition comprising, for example, $(NH_4)_2(Ce(NO_2)_6)+$ HNO$_3$+H$_2$O and, successively, the photoresist is peeled off to form a gate electrode 252 and a gate wiring 253 shown in FIG. 75 on the substrate 250. Although only a portion of the actually formed the gate electrodes and the gate wirings is illustrated in the drawing, a plurality of the gate electrodes 252 and the gate wirings 173 are actually formed on the substrate 250.

Figure 76:
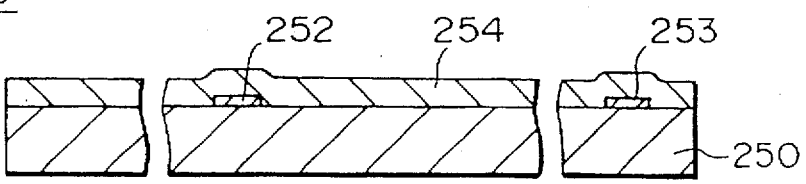
FIG. 76 is a cross sectional view illustrating a state of forming a first insulator film on the surface of the substrate in the ninth embodiment.

After forming the gate electrode 252 and the gate wiring 253, a first insulator film 254 made of SiN$_x$ is formed in a step J3 as shown in FIG. 76. In this step, the first insulation film 254 can be formed, for example, to a thickness of about 3,000 angstrom.

Figure 77:
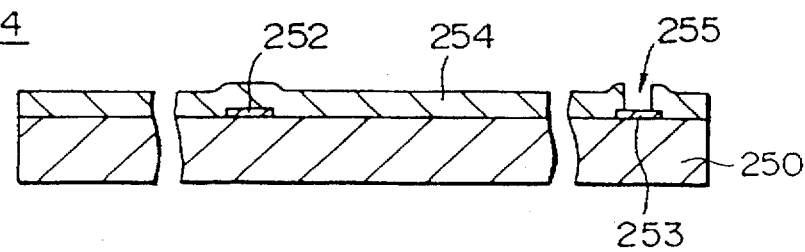
FIG. 77 is a cross sectional view illustrating a state of forming a contact hole by a second photolithographic step in the ninth embodiment.

After forming the first insulator film 254, the substrate 250 is cleaned, and the first insulator film 254 is patterned in a second photolithographic step J4 by a method such as dry etching using, for example, SF$_6$+O$_2$ gas to form a contact hole 255 leading to a gate wiring 253 as shown in FIG. 77.

Figure 78:
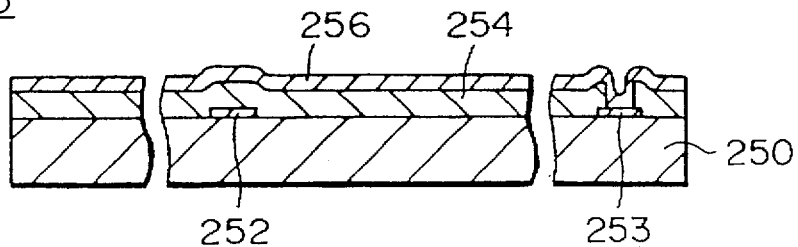
FIG. 78 is a cross sectional view illustrating a state of forming a transparent conductive film on the surface of the substrate in the ninth embodiment.

Then, in a step J5, the substrate 250 after forming the contact hole is cleaned, a transparent conductive film 256 made, for example, of ITO is formed on the upper surface as shown in FIG. 78. The transparent conductive film 256 is connected to the gate wiring 253 by way of the contact hole 255 formed in the step described previously. Further, in this step, the transparent conductive film 256 is formed to a thickness, for example, of about 700 angstrom.

Figure 79:
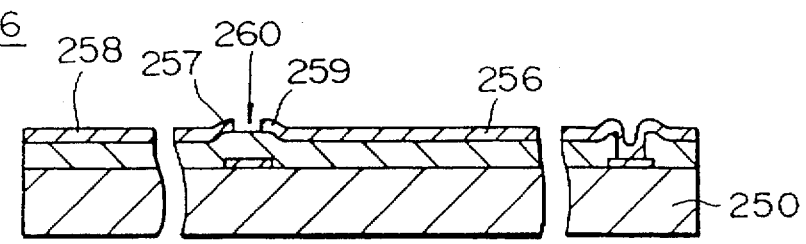
FIG. 79 is a cross sectional view illustrating a state of forming a source electrode, drain electrode and a transparent pixel electrode by a second photolithographic step in the ninth embodiment.

In a third photolithographic step J6, after forming the transparent conductive film 256, the transparent conductive film 256 is patterned by a method such as wet etching to form a source electrode 257, a source wiring 258 and a drain electrode 259 shown in FIG. 79. In this step, a portion of the transparent conductive film 256 formed on the first insulator film 254 above the gate electrode 252 is removed to form a perforation 260.

For the wet etching, an etching solution of a composition comprising HCl+HNO$_3$+H$_2$O can be used for fabrication of the transparent conductive film 256 made of ITO.

Figure 80:
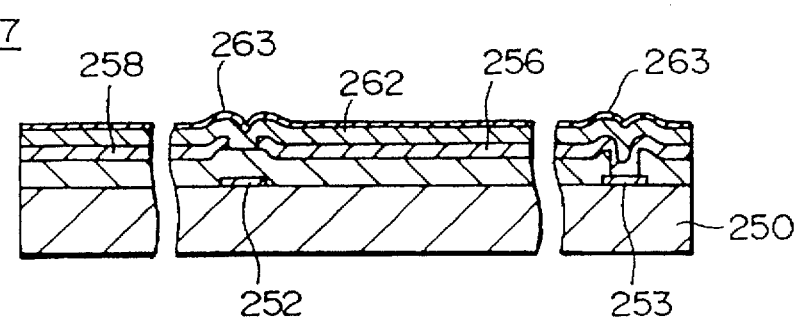
FIG. 80 is a cross sectional view illustrating a state of forming a metal film of reduced resistance and an ohmic contact film on the surface of the substrate in the ninth embodiment.

Successively, in a step J7, the substrate 250 is cleaned and a second metal film 262 made of a conductive material such as Cr is formed on the upper surface as shown in FIG. 80. Further, an ohmic contact film 263 made of a-Si(n$^+$) is formed on the second metal film 262. The second metal film 262 made of Cr and the ohmic contact film 263 can be formed, for example, to 1,000 angstrom and 200 angstrom thickness respectively. The second metal film 262 is disposed for reducing the resistivity of the source wiring 258, the source electrode 257 and the drain electrode 259 made of ITO.

Figure 81:
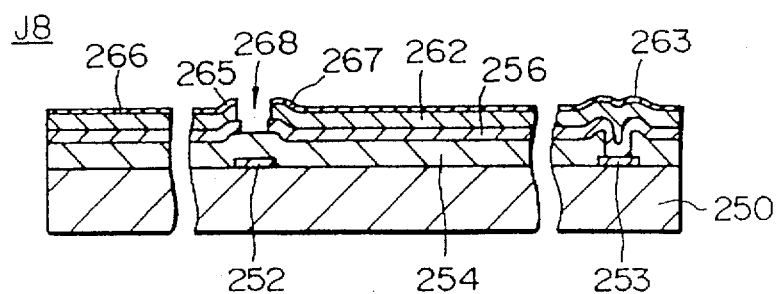
FIG. 81 is a cross sectional view illustrating a state after applying a forth photolithographic in the ninth embodiment.

Then, in a fourth photolithographic JS, the substrate 250 is cleaned, and the ohmic contact film 263 and the second metal film 262 are patterned by a method such as wet etching to form a source electrode 265, a source wiring 266, a drain electrode 267 and a channel portion 268 shown in FIG. 81.

For the etching solution used in the wet etching described above, the same solution as described in the previous embodiment can be used.

Figure 82:
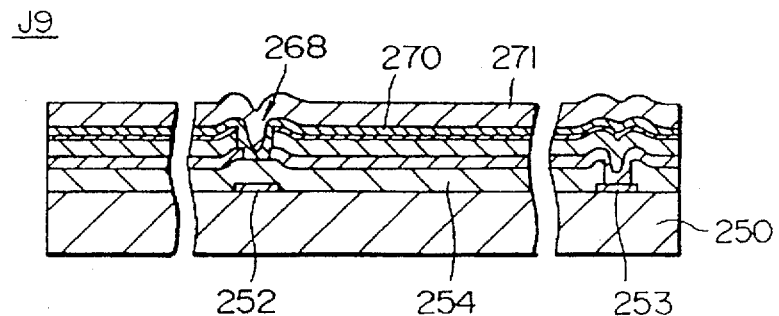
FIG. 82 is a cross sectional view illustrating a state of forming a passivation film on the substrate in the ninth embodiment.

Successively, in a step JP, the substrate 250 after the above-described treatments is cleaned, and a semiconductor active film 270 made of i-Si(i) and a passivation film 271 are formed at the cleaned surface by a method such as plasma CVD as shown in FIG. 82. The semiconductor active film 185 and the passivation film 186 in this step can be formed to thickness, for example, of about 1,000 angstrom and 4,000 angstrom thickness, respectively.

After forming the passivation film 271, a portion of the passivation film 271 above the transparent pixel electrode area is patterned by dry etching is patterned in a fifth photolithographic step J10 to the treated substrate 250 and, further, a portion of the semiconductor active film 270 a portion of the ohmic contact film 263 and a portion of the second metal film 177 are patterned by wet etching to form a transparent pixel electrode 273 and a perforation 187 ? thereabove to make a portion above the transparent pixel electrode light permeable and, at the same time, a contact hole 275 for a source wiring connection terminal is formed. Further, in the fifth photolithographic step J10, the semiconductor active film 270 above the drain electrode 267, and the source wiring 266 is isolated from the semiconductor active film 270 of other adjacent thin film transistors having the gate wiring 118 in common.

Figure 83:
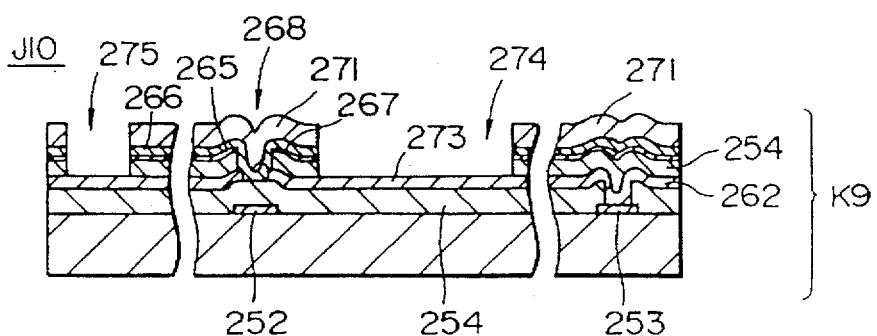
FIG. 83 is a cross sectional view illustrating a state of patterning the passivation film to make a portion above the transparent pixel electrode light permeable by a fifth photolithographic step in the ninth embodiment.
Figure 84:
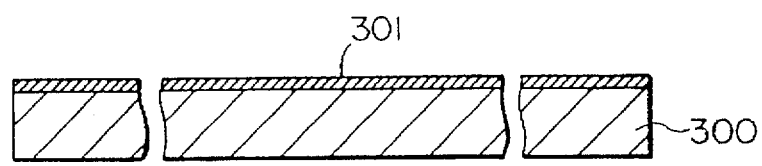
FIG. 84 is a cross sectional view illustrating a state of forming a light screening thin film in a tenth embodiment.

By way of the above-described steps, a thin film transistor array substrate K9 of a structure shown in FIG. 83 can be obtained. In the production method in this embodiment, since five photolithographic steps may suffice in the entire steps, the number of steps can be decreased as compared with the prior art process requiring seven photolithographic steps and the production steps can be simplified by so much to improve the yield and reduce the production cost.

Further, the thin film transistor array substrate K9 of this embodiment is used for constituting a liquid crystal display device (electro-optical device) by sealing liquid crystals between the substrate K9 and another substrate paired therewith like that in the liquid crystal display device of the prior art. In the structure of this embodiment, the perforation 274 is formed above the transparent pixel electrode 278, and the transparent pixel electrode 278 controls the orientation of liquid crystal molecules by way of the perforation 274 thereby enabling liquid crystal display.

FIG. 84 to FIG. 93 explain a tenth embodiment according to the present invention. In this embodiment, a light screening thin film 301 such as made of Cr is formed on a transparent substrate 300 shown in FIG. 84 by a film-forming method in a step L1. The light screening thin film 301 can be formed in this step to a thickness, for example, of about 1,000 angstrom.

Then, the substrate 330 is preferably applied with a surface cleaning treatment by using a brush cleaning device or a UV-irradiation device for removing organic materials. Further, the light screening thin film 301 may be formed after forming a surface stabilization film made, for example, of TaO$_x$ by a treatment such as reactive sputtering to the surface of the cleaned substrate.

Then, the substrate 300 with the light screening thin film 331 is fabricated in a first photolithographic step L2 as below. At first, after cleaning the substrate 300 and coating a photoresist on the light screening thin film 301, exposure and development are applied to the entire upper surface by way of a photomask to transfer a pattern on the photomask to the photoresist.

Figure 85:
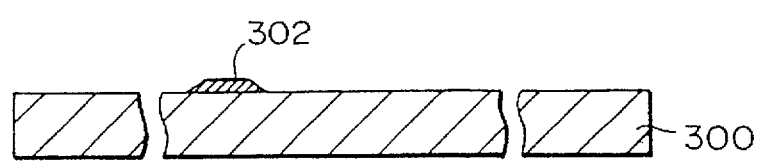
FIG. 85 is a cross sectional view illustrating a state of etching the light screening thin film to form a light screening film by a first photolithographic step in the tenth embodiment.

Then, in a case where the light screening thin film 331 is a film made of Cr, wet etching is applied by using an etching solution of a composition comprising, for example, (NH$_4$)$_2$(Ce(NO$_3$)$_6$)+HNO$_3$+H$_2$O and, successively the photoresist is peeled off to form an island-shaped light screening film 302 on the substrate 300 shown in FIG. 85. The light screening film 302 is formed at a position corresponding to the position to which a semiconductor portion to be described later is formed.

Figure 86:
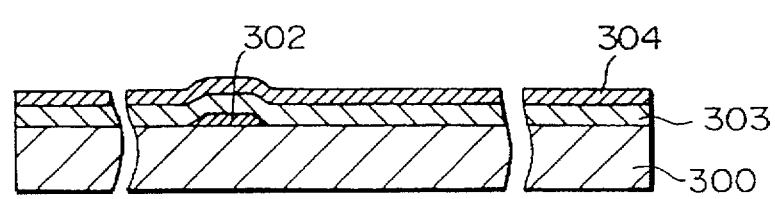
FIG. 86 is a cross sectional view illustrating a state of stacking a first insulator film and a semiconductor active film on the substrate in the tenth embodiment.

After forming the light screening film 302, the thus treated substrate 300 is cleaned in a step L3, and a first insulator film 303 made of SiN$_x$ and a semiconductor active film 334 made of a-Si (i) are stacked on the surface as shown in FIG. 86.

The first insulator film 303 is formed to a thickness of about 3000 angstrom and the semiconductor active film 304 is formed to a thickness of about 1000 angstrom, respectively.

Figure 87:
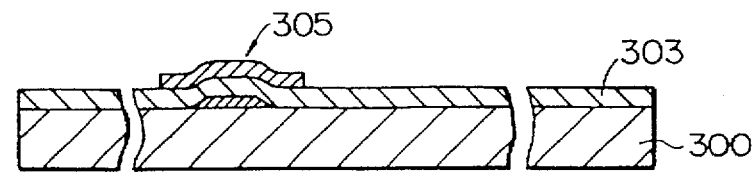
FIG. 87 is a cross sectional view illustrating a state of etching the semiconductor active film to form a semiconductor portion by a second photolithographic step in the tenth embodiment.

Then, in a second photolithographic step L4, treatments such as resist coating, exposure, development, etching and resist peeling are applied as done in the first lithographic step L2, and a semiconductor portion 36 is formed above the light screening film 302 as shown in FIG. 87. The etching solution, for example, a composition comprising $HF+HIO_3+H_2O$ can be used in this step.

Figure 88:
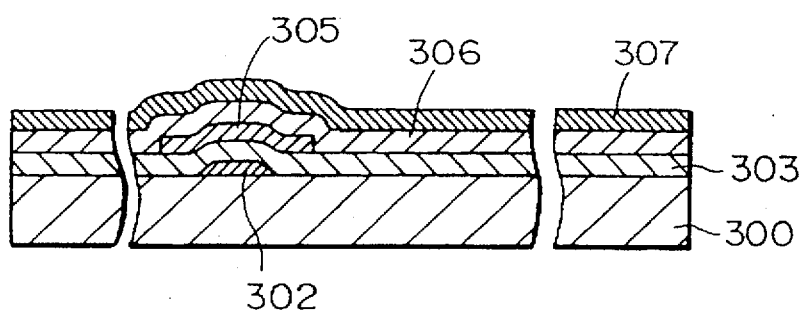
FIG. 88 is a cross sectional view illustrating a state of stacking a second insulator film and a first metal film on the substrate in the tenth embodiment.
Figure 89:
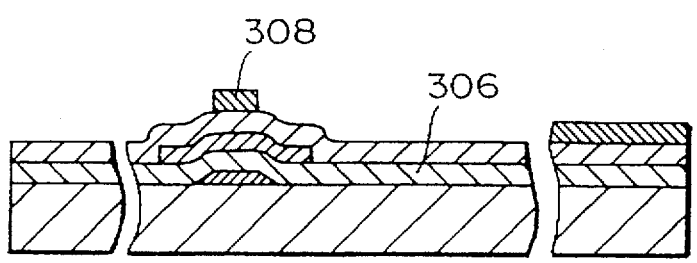
FIG. 89 is a cross sectional view illustrating a state of etching the first metal film to form a gate electrode and a wiring therefor by a third photolithographic step in the tenth embodiment.

After applying the second photolithographic step L4, the substrate 300 is cleaned in a step L5, and a second insulator film 306 made of Sinx and a first metal film 307 made of a conductive metal such as Cr are stacked to the surface as shown in FIG. 88. The second insulator film 306 and the first metal film 307 can be formed in this step to thickness, for example, of about 3000 angstrom and about 1500 angstrom, respectively.

Then, the substrate 300 after forming the first metal film 306 is cleaned and wet etching is conducted in a third photolithographic step L6 by using LEC-3B, trade name of products manufactured by Nagase Co., to form a gate electrode 308, above the semiconductor portion 305.

Figure 90:
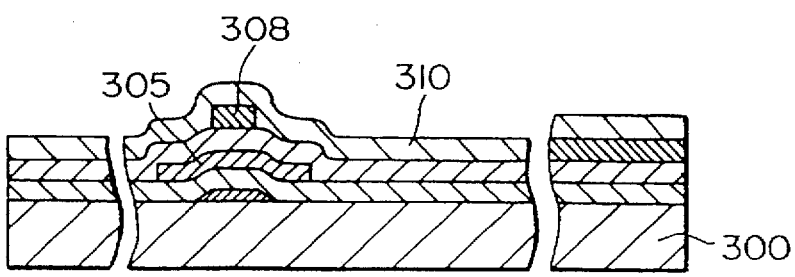
FIG. 90 is a cross sectional view illustrating a state of forming a third insulator film on the substrate in the tenth embodiment.

After forming them, the substrate 300 formed with them is cleaned in a step L7, and a third insulator film 310 made of $SiN_x$ is formed to the surface as shown in FIG. 90. The third insulator film 310 can be formed in this step to a thickness, for example, of about 3000 angstrom.

Figure 91:
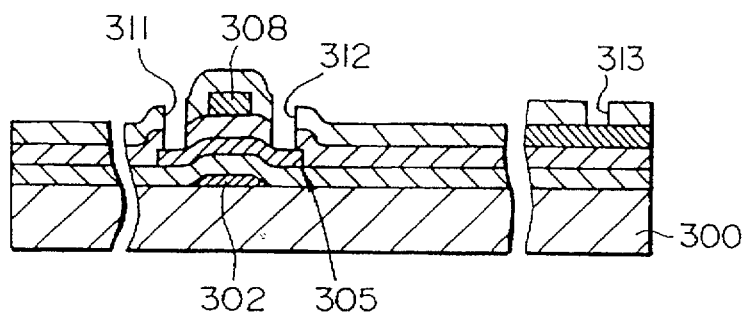
FIG. 91 is a cross sectional view illustrating a state of forming a contact hole to a laminate film by a fourth photolithographic step in the tenth embodiment.

After forming the third insulator film 310, the third insulator film 310 is patterned in a fourth photolithographic L8 by a method such as dry etching using, for example, $CF_6+O_2$ gas to form a contact hole 311 leading to one end of the semiconductor portion 305, a contact hole 312 leading to the other end of the semiconductor portion 305 and a contact holes 313 for connecting and the source wiring and the gate wiring as shown in FIG. 91.

Figure 92:
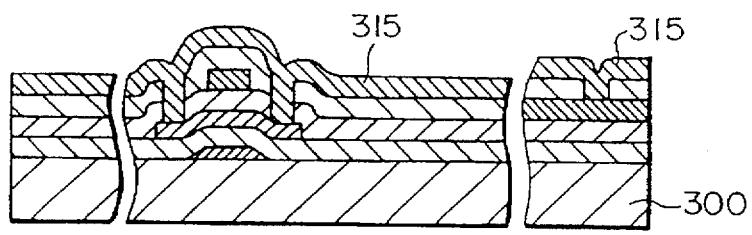
FIG. 92 is a cross sectional view illustrating a state of forming a transparent conductive film on the substrate and the contact hole in the tenth embodiment.

Then, the substrate 300 after forming the contact holes is cleaned in a step L9, and a transparent conductive film 315 made, for example, of ITO is formed to the upper surface as shown in FIG. 92. Further, the transparent conductive film 315 can be formed in this step to a thickness, for example, of about 2000 angstrom.

Figure 93:
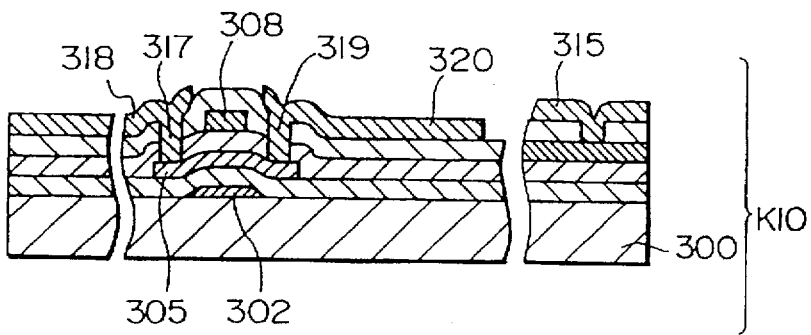
FIG. 93 is a cross sectional view illustrating a state of etching the transparent conductive film to form a source electrode, a wiring therefor, drain electrode and a pixel electrode by a fifth photolithographic step in the tenth embodiment.
Figure 94:
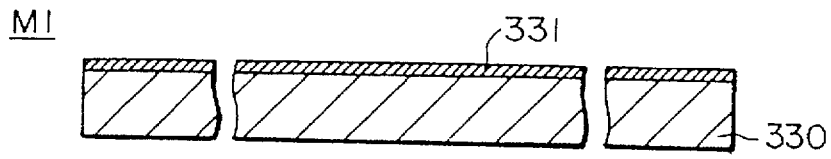
FIG. 94 is a cross sectional view illustrating a state of forming a light screening thin film on the surface of a substrate in an eleventh embodiment.

After forming the transparent conductive film 315, the transparent conductive film 315 is patterned in a fifth photolithographic step L10 by a method such as wet etching to form a source electrode 317, a source wiring 318, a drain electrode 319 and a transparent pixel electrode 320 shown in FIG. 93.

For the etching solution in the wet etching, a solution of a composition comprising $HCl+HNO_3+H_2O$ can be used for the fabrication of the transparent conductive film 315 made of ITO.

By way of the above-described step, a thin film transistor array substrate K10 of a structure shown in FIG. 93 can be obtained. In the production method in this embodiment, since five photolithographic steps may suffice for the entire steps, the number of the steps may be decreased as compared with the prior art process requiring seven photolithographic steps and the production steps can be simplified by so much to improve the yield and reduce the production cost.

Further, the thin film transistor array substrate K10 of this embodiment is used for constituting a liquid crystal display device (electro-optical device) by sealing liquid crystals between the substrate K10 and another substrate paired therewith like that in the liquid crystal display device of the prior art. In the structure of this embodiment. The transparent pixel electrode 320 controls the orientation of liquid crystal molecules disposed above it thereby enabling liquid crystal display.

With the structure described above, since the transparent pixel electrode 320 is at the uppermost layer, an electric field can be exerted efficiently upon driving liquid crystal molecules by the transparent pixel electrode 320, to provide excellent driving performance for the liquid crystal molecules.

FIG. 94 to FIG. 103 explain an eleventh embodiment according to the present invention. In this embodiment, a light screening thin film 331 such as made of Cr is formed on a transparent substrate 300 shown in FIG. 94 by a film-forming method in a step M1. The light screening thin film 331 can be formed in this step to a thickness, for example, of about 1,000 angstrom.

Then, the substrate 330 is preferably applied with a surface cleaning treatment by using a brush cleaning device or a UV-irradiation device for removing organic materials. Further, the light screening thin film 331 may be formed after forming a surface stabilization film made, for example, of $TaO_x$ by a treatment such as reactive sputtering to the surface of the cleaned substrate.

Then, the substrate 330 with the light screening thin film 331 is fabricated in a first photolithographic step M2 as below. At first, after cleaning the substrate 330 and coating a photoresist on the light screening thin film 331, exposure and development are applied to the entire upper surface by way of a photomask to transfer a pattern on the photomask to the photoresist.

Figure 95:
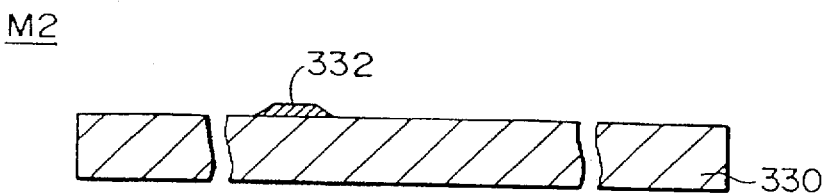
FIG. 95 is a cross sectional view illustrating a state of etching the light screening their film by a first photolithographic step in the eleventh embodiment.

Then, in a case where the light screening thin film 331 is a film made of Cr, wet etching is applied by using an etching solution of a composition comprising, for example, $(NH_4)_2(Ce(NO_3)_6)+HNO_3+H_2O$ and, successively the photoresist is peeled off to form an island-shaped light screening film 332 on the substrate 330 shown in FIG. 95. The light screening film 332 is formed at a position corresponding to the position to which a semiconductor portion to be described later is formed.

Figure 96:
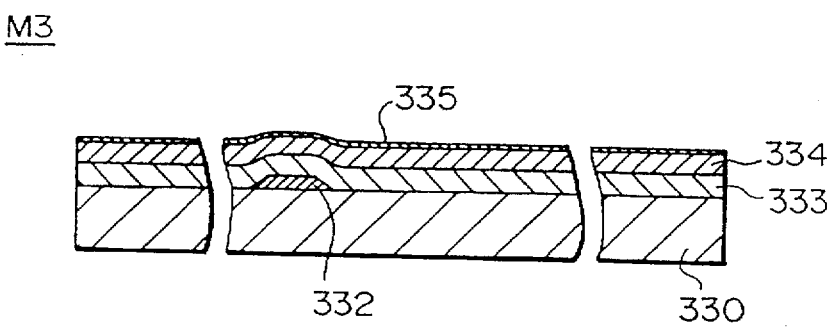
FIG. 96 is a cross sectional view illustrating a state of stacking a first insulator film, a semiconductor active film and an ohmic contact film on the substrate in the eleventh embodiment.

After forming the light screening film 332, the thus treated substrate 330 is cleaned in a step M3, and a first insulator film 333 made of $SiN_x$, a semiconductor active film 334 made of a-Si (i) and an ohmic contact film 335 made of a-Si (n$^+$) are stacked on the surface as shown in FIG. 96. The first insulator film 333 is formed to a thickness of about 3000 angstrom, the semiconductor active film 334 is formed to a thickness of about 1000 angstrom and the ohmic contact film 335 is formed to a thickness of about 200 angstrom, respectively.

Figure 97:
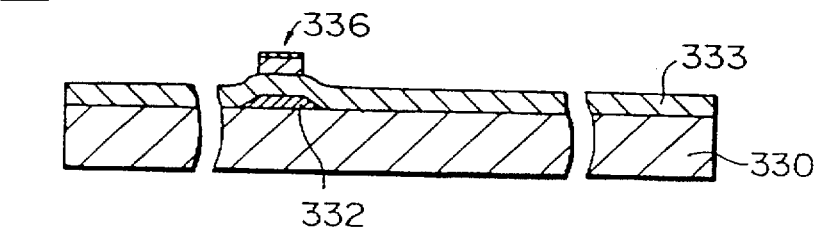
FIG. 97 is a cross sectional view illustrating a state of etching the ohmic contact film and the semiconductor active film to form a semiconductor portion by a second photolithographic step in the eleventh embodiment.

Then, in a second photolithographic step M4, treatments such as resist coating, exposure, development, etching and resist peeling are applied as done in the first lithographic step M2, and the ohmic contact film 335 and the semiconductive active film 334 are patterned to form a semiconductor portion 336 above the light screening film 332 as shown in FIG. 97. The etching solution, for example, a composition comprising $HF+HIO_3+H_2O$ can be used in this step.

Figure 98:
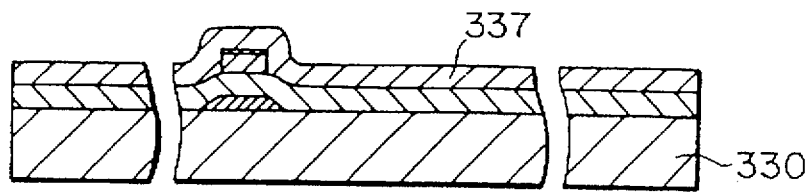
FIG. 98 is a cross sectional view illustrating a state of stacking a first metal film on the substrate in the eleventh embodiment.
Figure 99:
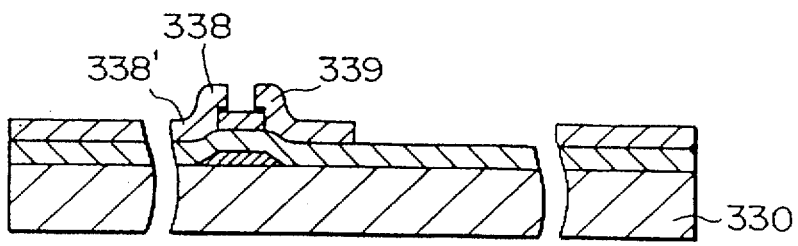
FIG. 99 is a cross sectional view illustrating a state of etching the first metal film to form a source electrode, drain electrode and a wiring therefor by a third photographgraphic step in the eleventh embodiment.

After applying the second photolithographic step M4, the substrate 330 is cleaned in a step M5, and a first metal film 337 made of a conductive metal such as Ti is stacked to the surface as shown in FIG. 98. The first metal film 337 can be formed in this step to a thickness, for example, of about 3000 angstrom.

Then, the substrate 330 after forming the first metal film 337 is cleaned and patterning is conducted in a third photolithographic step M6 by wet etching using an etching solution of a composition comprising HF+H$_2$O and wet etching using an etching solution of a composition comprising HF+NH$_4$F+HNO$_3$+CH$_3$COOH, to form a source electrode 338, a drain electrode 339 and a source wiring 338'.

Figure 100:
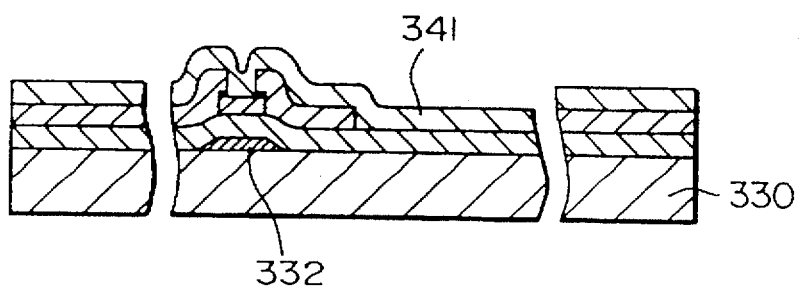
FIG. 100 is a cross sectional view illustrating a state of forming a second insulator film on the substrate in the eleventh embodiments.

After forming them, the substrate 330 formed with them is cleaned in a step M7, and a second insulator film 341 made of SiN$_x$ is formed to the surface as shown in FIG. 100. The second insulator film 341 can be formed in this step to a thickness, for example, of about 3000 angstrom.

Figure 101:
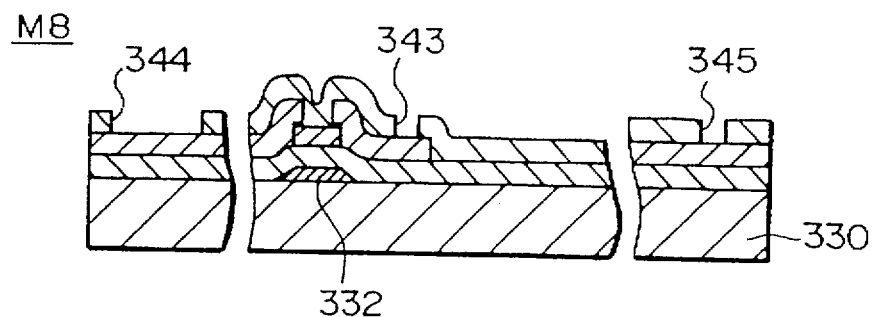
FIG. 101 is a cross sectional view illustrating a state of forming a contact hole to a laminate film by a fourth photolithographic step in the eleventh embodiment.

After forming the second insulator film 341, the second insulator film 341 is patterned in a fourth photolithographic M8 by a method such as dry etching using, for example, CF$_6$+O$_2$ gas to form a contact hole 343 leading to the drain electrode 339 and contact holes 344 and 345 for connecting the gate wiring and the source wiring as shown in FIG. 101.

Figure 102:
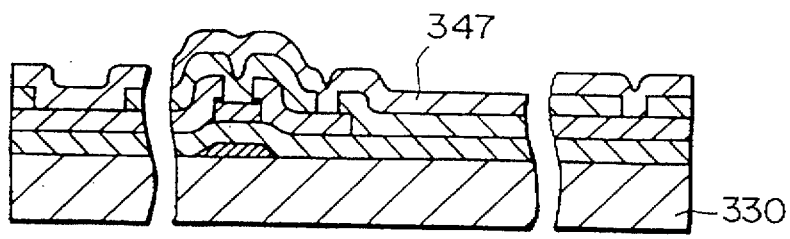
FIG. 102 is a cross sectional view illustrating a state of forming a transparent conductive film on the substrate and the contact hole in the eleventh embodiment.

Then, the substrate 330 after forming the contact holes is cleaned in a step M9, and a transparent conductive film 347 made, for example, of ITO is formed to the upper surface as shown in FIG. 102. Further, the transparent conductive film 347 can be formed in this step to a thickness, for example, of about 1500 angstrom.

Figure 103:
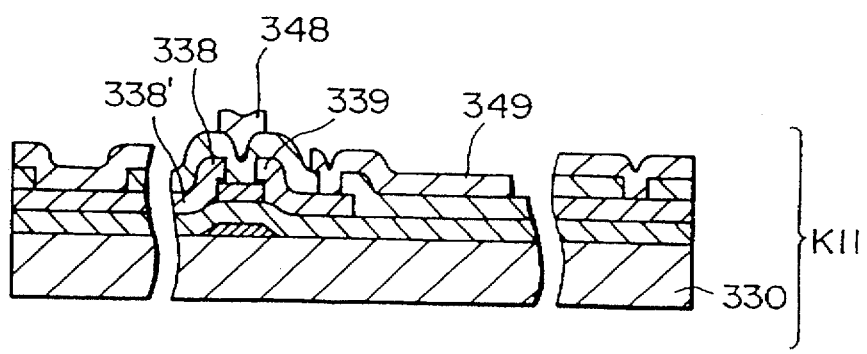
FIG. 103 is a cross sectional view illustrating a state etching the transparent conductive film to form a gate electrode, a wiring therefor and a pixel electrode by a fifth photolithographic step in the eleventh embodiment.
Figure 104:
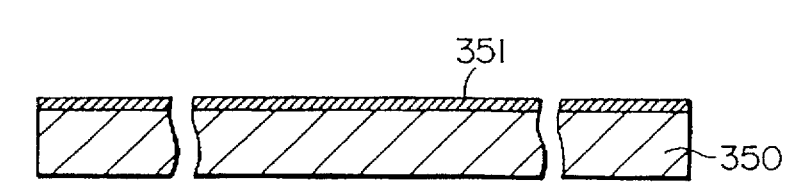
FIG. 104 is a cross sectional view illustrating a state of forming a light screening thin film in a twelfth embodiment.

After forming the transparent conductive film 347, the transparent conductive film 347 is patterned in a fifth photolithographic step M10 by a method such as wet etching to form a gate electrode 348 and a transparent pixel electrode 349 shown in FIG. 103.

For the etching solution in the wet etching, a solution of a composition comprising HCl+HNO$_3$+H$_2$O can be used for the fabrication of the transparent conductive film 347 made of ITO.

By way of the above-described step, a thin film transistor array substrate K11 of a structure shown in FIG. 103 can be obtained. In the production method in this embodiment, since five photolithographic steps may suffice for the entire steps, the number of the steps may be decreased as compared with the prior art process requiring seven photolithographic steps and the production steps can be simplified by so much to improve the yield and reduce the production cost.

Further, the thin film transistor array substrate K11 of this embodiment is used for constituting a liquid crystal display device (electro-optical device) by sealing liquid crystals between the substrate K11 and another substrate paired therewith like that in the liquid crystal display device of the prior art. In the structure of this embodiment, the transparent pixel electrode 349 controls the orientation of liquid crystal molecules disposed above it thereby enabling liquid crystal display.

With the structure described above, since the transparent pixel electrode 349 is at the uppermost layer, an electric field can be exerted efficiently upon driving liquid crystal molecules by the transparent pixel electrode 349, to provide excellent driving performance for the liquid crystal molecules.

FIG. 104 to FIG. 113 explain a twelfth embodiment according to the present invention. In this embodiment, a light screening thin film 351 such as made of Cr is formed on a transparent substrate 350 shown in FIG. 104 by a film-forming method in a step N1. The light screening thin film 351 can be formed in this step to a thickness, for example, of about 1,000 angstrom.

Then, the substrate 350 is preferably applied with a surface cleaning treatment by using a brush cleaning device or a UV-irradiation device for removing organic materials. Further, the light screening thin film 351 may be formed after forming a surface stabilization film made, for example, of TaO$_x$ by a treatment such as reactive sputtering to the surface of the cleaned substrate.

Then, the substrate 350 with the light screening thin film 351 is fabricated in a first photolithographic step N2 as below. At first, after cleaning the substrate 350 and coating a photoresist on the light screening thin film 351, exposure and development are applied to the entire upper surface by way of a photomask to transfer a pattern on the photomask to the photoresist.

Figure 105:
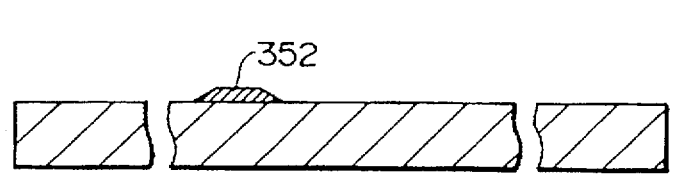
FIG. 105 is a cross sectional view illustrating a state of etching the light screening thin film to form a light screening film by a first photolithographic step in the twelfth embodiment.

Then, in a case where the light screening thin film 351 is a film made of Cr, wet etching is applied by using an etching solution of a composition comprising, for example, (NH$_4$)$_2$(Ce(NO$_3$)$_6$)+HNO$_3$+H$_2$O and, successively the photoresist is peeled off to form an island-shaped light screening film 352 on the substrate 350 shown in FIG. 105. The light screening film 352 is formed at a position corresponding to the position to which a semiconductor portion to be described later is formed.

Figure 106:
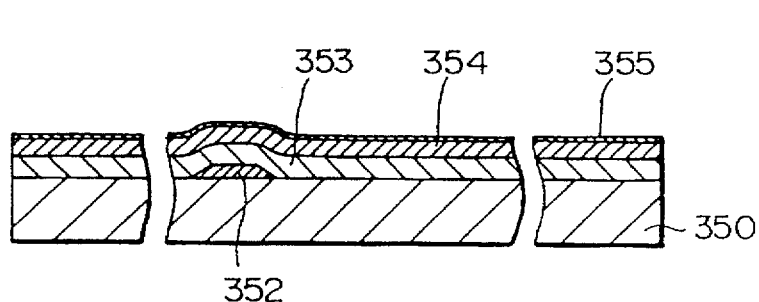
FIG. 106 is a cross sectional view illustrating a state of stacking a first insulator film, a semiconductor active film and an ohmic contact film on the substrate in the twelfth embodiment.

After forming the light screening film 352, the substrate 350 is cleaned in a step N3, and a first insulator film 303 made of SiN$_x$, a semiconductor active film 354 made of a-Si (i) and an ohmic contact film 355 made of a-Si (n$^+$) are stacked on the surface as shown in FIG. 106. The first insulator film 353 is formed to a thickness of about 3000 angstrom, the semiconductor active film 304 is formed to a thickness of about 1000 angstrom and the ohmic contact film 355 to a thickness of about 200 angstrom, respectively.

Figure 107:
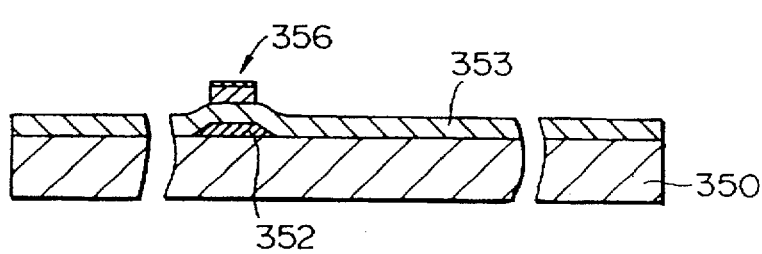
FIG. 107 is a cross sectional view illustrating a state of etching the semiconductor portion to form an ohmic contact film and a semiconductor active film by a second photolithographic step in the twelfth embodiment.

Then, in a second photolithographic step N4, treatments such as resist coating, exposure, development, etching and resist peeling are applied as done in the first lithographic step N2, and the ohmic contact film 355 and the semiconductor active film 354 are patterned to form a semiconductor portion 356 above the light screening film 352 as shown in FIG. 107. The etching solution, for example, a composition comprising HF+HIO$_3$+H$_2$O can be used in this step.

Figure 108:
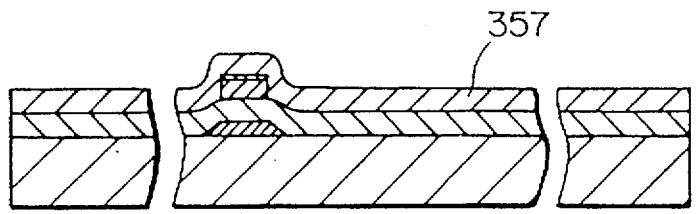
FIG. 108 is a cross sectional view illustrating a state of stacking a transparent conductive film on the of substrate after the above-mentioned treatment in the twelfth embodiments.
Figure 109:
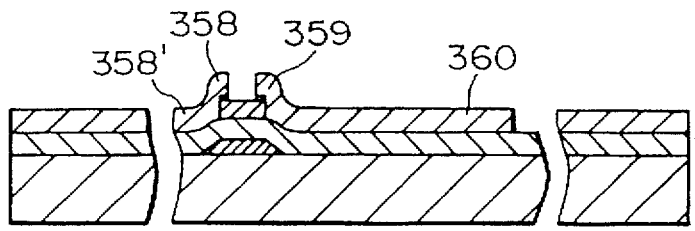
FIG. 109 is a cross sectional view illustrating a state of etching the transparent conductive film to form a source electrode, a drain electrode and a wiring therefor by a third photolithographic step in the twelfth embodiment.

After applying the second photolithographic step N4, the substrate 350 is cleaned in a step N5, and a transparent conductive film 357 made, for example, of ITO is stacked to the surface as shown in FIG. 108. The transparent conductive film 357 can be formed in this step to a thickness, for example, of about 1500 angstrom.

Then, the substrate 350 after forming the transparent conductive film 357 is cleaned, and patterning is conducted in a third photolithographic step N6 by wet etching using an etching solution of a composition comprising HCl+HNO$_3$+H$_2$O and by wet etching using an etching solution of a composition comprising HF+NH$_4$F+HNO$_3$+CH$_3$COOH to form a source electrode 358, a drain electrode 359 and a source wiring 358' and, further, a pixel electrode 360. Further, a portion of the ohmic contact film 355 on the upper surface of the semiconductor portion 356 at a portion put between the source electrode 358 and the drain electrode 359 is also removed.

Figure 110:
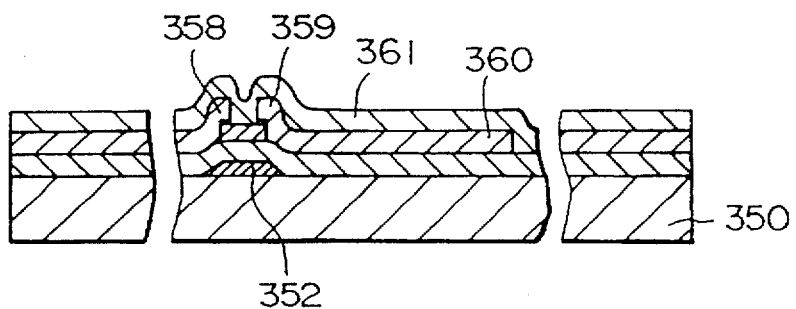
FIG. 110 is a cross sectional view illustrating a state of forming a second insulator film on the substrate in the twelfth embodiment.

After forming them, the substrate 300 formed with them is cleaned in a step N7, and a second insulator film 361 made of SiN$_x$ is formed to the surface as shown in FIG. 110. The second insulator film 361 can be formed in this step to a thickness, for example, of about 3000 angstrom.

Figure 111:
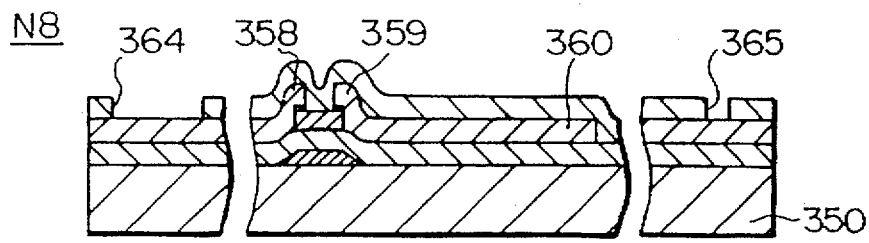
FIG. 111 is a cross sectional view illustrating a state of forming a contact hole to a laminate film by a fourth photolithographic step in the twelfth embodiment.

After forming the second insulator film 361, the second insulator film 361 is patterned in a fourth photolithographic lithographic N8 by a method such as dry etching using, for example, CF$_6$+O$_2$ gas to form a contact holes 364, 365 for connecting the gate wiring and the source wiring as shown in FIG. 111.

Figure 112:
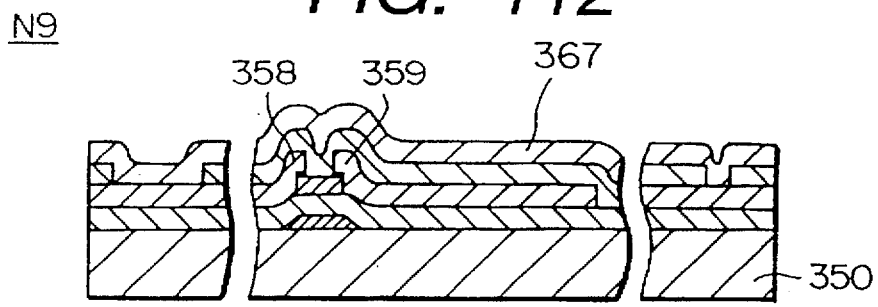
FIG. 112 is a cross sectional view illustrating a state of forming a metal film on the upper surface of the substrate and the contact hole in the twelfth embodiment.

Then, the substrate 350 after forming the contact holes is cleaned in a step N9, and a metal film 367 made of a conductive metal such as Cr is formed to the upper surface as shown in FIG. 112. Further, the metal film 367 can be formed in this step to a thickness, for example, of about 2000 angstrom.

After forming the metal film 367, the metal film 367 is patterned in a fifth photolithographic step N10 by a method such as wet etching to form a gate electrode 368 and a wiring therefor.

For the etching solution in the wet etching, LEC-3B manufactured by Nagase Co. can be used for the fabrication of the metal film 367 made of Cr.

Figure 113:
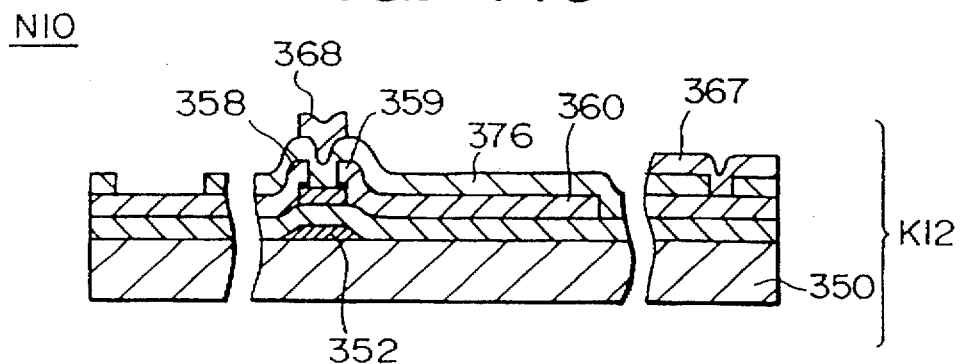
FIG. 113 is a cross sectional view illustrating a state of etching the metal film to form a gate electrode and a wiring therefor by a fifth photolithographic step in the twelfth embodiment.
Figure 114:
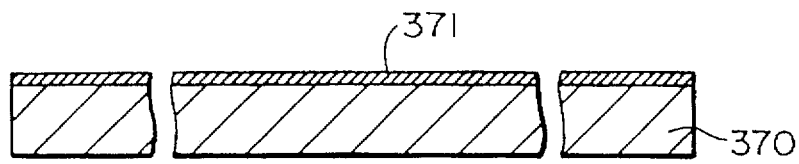
FIG. 114 is a cross sectional view illustrating a state of forming a light screening thin film on the surface of a substrate in a thirteenth embodiment.

By way of the above-described step, a thin film transistor array substrate K12 of a structure shown in FIG. 113 can be obtained. In the production method in this embodiment, since five photolithographic steps may suffice for the entire steps, the number of the steps can be decreased as compared with the prior art method requiring seven photolithographic steps and the production steps can be simplified by so much to improve the yield and reduce the production cost.

Further, the thin film transistor array substrate K12 of this embodiment is used for constituting a liquid crystal display device (electro-optical device) by sealing liquid crystals between the substrate K12 and another substrate paired therewith like that in the liquid crystal display device of the prior art. In the structure of this embodiment, the transparent pixel electrode 360 can control the orientation of liquid crystal molecules thereby enabling liquid crystal display.

FIG. 114 to FIG. 121 explain a thirteenth embodiment according to the present invention. In this embodiment, a light screening thin film 371 such as made of Cr is formed on a transparent substrate 370 shown in FIG. 114 by a film-forming method in a step Q1. The light screening thin film 371 can be formed in this step to a thickness, for example, of about 1,000 angstrom.

Then, the substrate 370 is preferably applied with a surface cleaning treatment by using a brush cleaning device or a UV-irradiation device for removing organic materials. Further, the light screening thin film 371 may be formed after forming a surface stabilization film made, for example, of $TaO_x$ by a treatment such as reactive sputtering to the surface of the cleaned substrate.

Then, the substrate 370 with the light screening thin film 371 is fabricated in a first photolithographic step 02 as below. At first, after cleaning the substrate 370 and coating a photoresist on the light screening thin film 371, exposure and development are applied to the entire upper surface by way of a photomask to transfer a pattern on the photomask to the photoresist.

Figure 115:
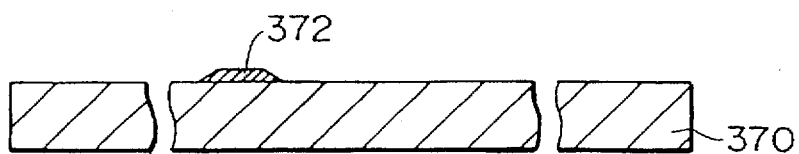
FIG. 115 is a cross sectional view illustrating a state of etching the light screening thin film to form a light screening film by a first photolithographic step in the thirteenth embodiment.

Then, in a case where the light screening thin film 371 is a film made of Cr, wet etching is applied by using an etching solution of a composition comprising, for example, $(NH_4)_2(Ce(NO_3)_6)+HNO_3+H_2O$ and, successively the photoresist is peeled off to form an island-shaped light screening film 372 on the substrate 370 shown in FIG. 115. The light screening film 372 is formed at a position corresponding to the position to which a semiconductor portion to be described later is formed.

Figure 116:
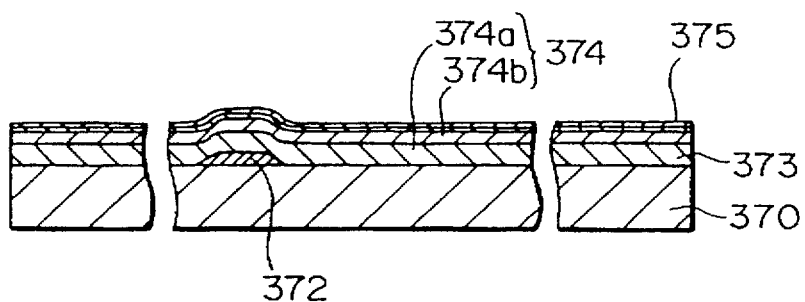
FIG. 116 is a cross sectional view illustrating a state of stacking a first insulator film, a first metal film and an ohmic contact film on the substrate in the thirteenth embodiment.

After forming the light screening film 372, the substrate 370 is cleaned in a step 03, and a first insulator film 373 made of $SiN_x$, a first metal film 374 comprising a conductive metal film 374a made of a good conductive metal material such as Al or Ta and a barrier film 374b made of a metal material such as Cr and an ohmic contact film 375 made of a-Si ($N^+$) are stacked to the surface as shown in FIG. 116. Each of the films can be formed in this step to a thickness, for example, as: the first insulator film 373 to about 3,000 angstrom, the conductive Al metal film 374a to about 1,500 angstrom, the Cr barrier film 374b to about 500 angstrom and the ohmic contact film 375 to about 200 angstrom, respectively.

Figure 117:
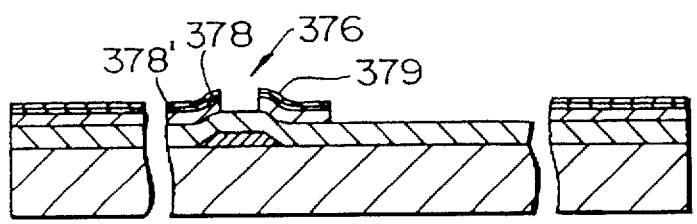
FIG. 117 is a cross sectional view illustrating a state of etching of the ohmic contact film and the first insulator film to form a semiconductor portion by a second photolithographic step in the thirteenth embodiment.

Then, in a second photolithographic step 04, treatments such as resist coating, exposure, development, etching and resist peeling are applied as done in the first lithographic step 02, and the ohmic contact film 375 and the first metal film 374 are patterned to form a semiconductor portion 36 above the light screening film 372 as shown in FIG. 117, and the first metal film 374 is patterned to form a source electrode 378 and a drain electrode 379 and form a source wiring 378'. As the etching solution in this step, for example, a composition comprising $HF+NH_4F+HNO_3+CH_3COOH$ can be used for the ohmic contact film 375, LEC-B3 trade name of products manufactured by Nagase Co. can be used for the Cr barrier film 374b and a composition comprising $H_3PO_4+HNO_3+CH_3COOH$ can be used for the conductive Al metal film 374a.

As the first metal film 374, a single layer film made of Ti at a thickness of about 3,000 angstrom can be used instead of the two layered structure described above.

If the conductive Al metal film 374a is used as described above, since it is excellent in conductivity, passage of electric signals can be improved causing no problems such as signal delay. By the way, in a photolithographic step described later, when dry etching treatment is applied by using $SF_6O_2$ gas and then resist peeling is conducted in $O_2$ plasmas, the electroconductive metal film 374a of Al or Ta may possibly cause corrosion by exposure to an oxidative atmosphere with $O_2$ gas. However, since the barrier film 374b is covered thereover, the film prevents corrosion of the conductive metal film 374a.

Accordingly, any of conductive films that is less oxidizable than the constituent material for the conductive metal film 374a may be used as the constituent material for the barrier film 374b and, in addition, they may be of any materials so long as it can be solid solubilized as an conductive oxide to other conductive film to be connected with the conductive metal film 374a, for example, ITO constituting a pixel electrode to be described later and it may also be a semiconductive film such as i-Si ($n^{30}$). Accordingly, since the single layer film made of Ti is less oxidizable, a single layer film may also be used. However, with a view point of the signal delay, a film comprising Al and Ta is preferred.

Further, since Al of good conductivity can be used for wiring, the film thickness of the wiring can be decreased as compared with the existent wiring using Ti, so that a step in the stepped portion for the entire thin film transistor device can be reduced to improve the step coverage and improve the yield.

Figure 118:
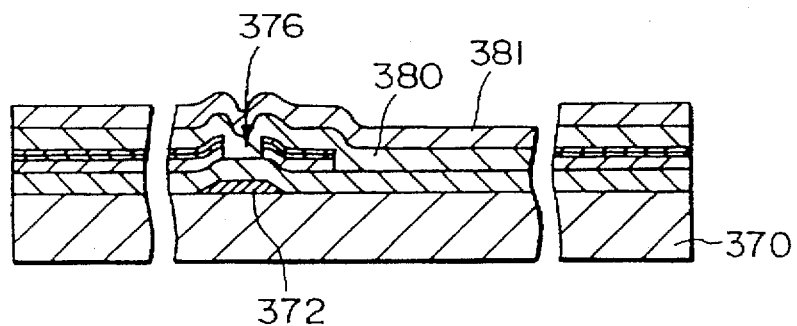
FIG. 118 is a cross sectional view illustrating a state of stacking a semiconductor active film and a second insulator film on the substrate after the above-mentioned treatment in the thirteenth embodiments.

After applying the second photolithographic step 04, the substrate 370 is cleaned in a step of 05, and a semiconductive active film 380 made of A-Si (i) and a second insulator film 381 made of $SiN_x$ are formed on the surface as shown in FIG. 118. The semiconductor active film 380 can be formed to a thickness, for example, of about 2,000 angstrom and the second insulator film 381 can be formed to a thickness of about 3,000 angstrom.

Figure 119:
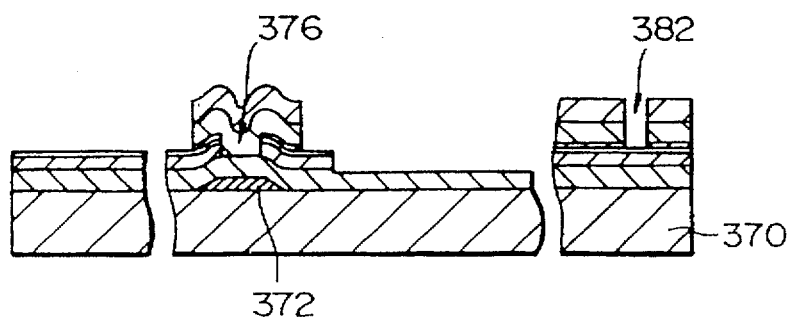
FIG. 119 is a cross sectional view illustrating a state of etching the second insulator film, the semiconductor active film and the ohmic contact film to form a contact hole by a third photolithographic step in the thirteenth embodiment.

Then, the substrate 370 after forming the films is cleaned and a second insulator film 381 is patterned in a third photolithographic step 06 by way of dry etching, using, for example, $SF_6+O_2$ gas to isolate a semiconductor portion 376 with respect to each of pixels as shown in FIG. 119, and form a contact hole for connecting a gate wiring and a source wiring and form a contact hole 382 for terminal connection.

Figure 120:
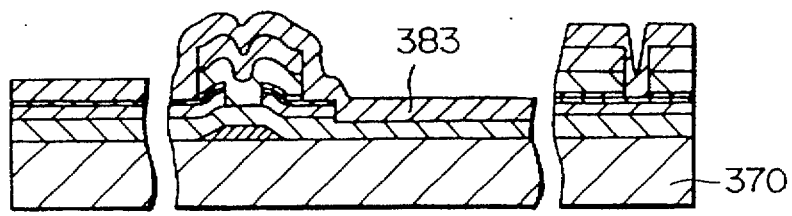
FIG. 120 is a cross sectional view illustrating a state of forming a transparent conductive film on the substrate after the above-mentioned treatment in the thirteenth embodiment.

Then, in a step 07, the substrate 370 after forming the contact holes is cleaned, and a transparent conductive film 383 made, for example, of ITO is formed to the upper surface as shown in FIG. 120. The transparent conductive film 383 can be formed in this step to a thickness, for example, of about 2,000 angstrom.

Figure 121:
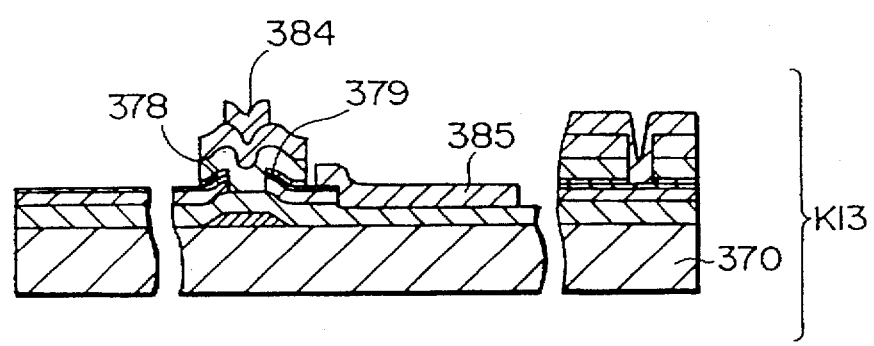
FIG. 121 is a cross sectional view illustrating a state of etching the transparent conductive film to form a gate electrode, gate wiring and a pixel electrode by a fourth photolithographic step in the thirteenth embodiment.
Figure 122:
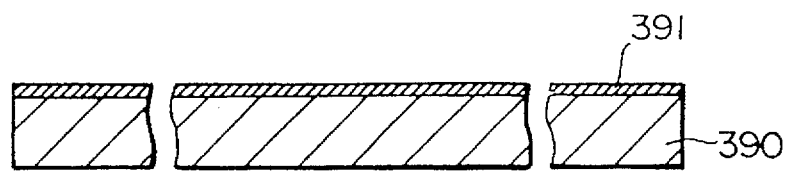
FIG. 122 is a cross sectional view illustrating a state of forming a light screening thin film on the surface of a substrate in a fourteenth embodiment.

After forming the transparent conductive film 383, the transparent conductive film 383 is patterned in a fourth photolithographic step 08 by a method such as wet etching to form a gate electrode 384, a wiring therefor and a transparent pixel electrode 385 shown in FIG. 121.

For the etching solution in the wet etching, a solution of a composition comprising $HCl+HNO_3+H_2O$ can be used for the fabrication of the transparent conductive film 383 made of ITO.

By way of the above-described step, a thin film transistor array substrate K13 of a structure shown in FIG. 121 can be obtained. In the production method in this embodiment, since four photolithographic steps may suffice for the entire steps, the number of steps may be decreased as compared with the prior art method requiring seven photolithographic steps and the production steps can be simplified by so much to improve the yield and reduce the production cost.

Further, the thin film transistor array substrate K13 of this embodiment is used for constituting a liquid crystal display device (electro-optical device) by sealing liquid crystals between the substrate K13 and another substrate paired therewith like that in the liquid crystal display device of the prior art. In the structure of this embodiment, the transparent pixel electrode 360 controls the orientation of liquid crystal molecules disposed above it, thereby enabling liquid crystal display.

With the structure described above, since the transparent pixel electrode 360 is not covered with other films, an electric field can be exerted efficiently upon driving liquid crystal molecules by the transparent pixel electrode 360, to provide excellent driving performance for the liquid crystal molecules.

FIG. 122 to FIG. 129 explain a fourteenth embodiment according to the present invention. In this embodiment, a light screening thin film 391 such as made of Cr is formed on a transparent substrate 390 made, for example, of glass shown in FIG. 122 by a film-forming method in a step P1. The light screening thin film 391 can be formed in this step to a thickness, for example, of about 1,000 angstrom.

Then, the substrate 390 is preferably applied with a surface cleaning treatment by using a brush cleaning device or a UV-irradiation device for removing organic materials. Further, the light screening thin film 391 may be formed after forming a surface stabilization film made, for example, of $TaO_x$ by a treatment such as reactive sputtering to the surface of the cleaned substrate.

Then, the substrate 390 with the light screening thin film 391 is fabricated in a first photolithographic step P2 as below. At first, after cleaning the substrate 390 and coating a photoresist on the light screening thin film 391, exposure and development are applied to the entire upper surface by way of a photomask to transfer a pattern on the photomask to the photoresist.

Figure 123:
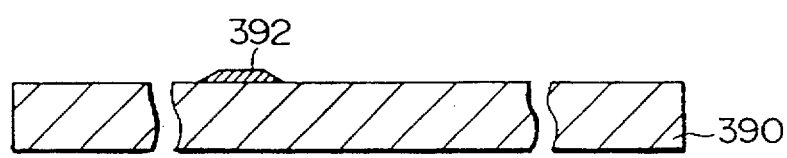
FIG. 123 is a cross sectional view illustrating a state of etching the light screening thin film to form a light screening film by a first photolithographic step in the fourteenth embodiment.

Then, in a case where the light screening thin film 391 is a film made of Cr, wet etching is applied by using an etching solution of a composition comprising, for example, $(NH_4)_2(Ce(NO_3)_6)+HNO_3+H_2O$ and, successively the photoresist is peeled off to form an island-shaped light screening film 392 on the substrate 390 shown in FIG. 123. The light screening film 392 is formed at a position corresponding to the position to which a semiconductor portion to be described later is formed.

Figure 124:
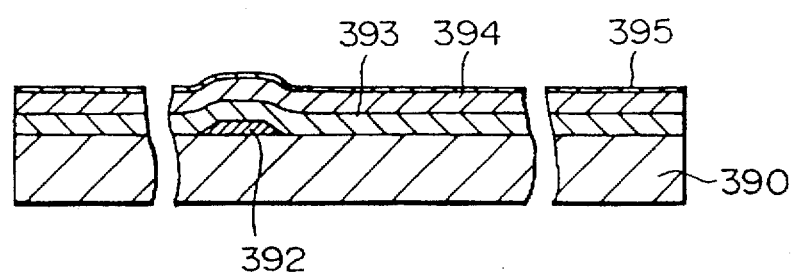
FIG. 124 is a cross sectional view illustrating a state of stacking a first insulator film, a transparent conductive film and an ohmic contact film on the substrate in the fourteenth embodiment.

After forming the light screening film 392, the substrate 390 is cleaned in a step P3, and a first insulator film 393 made of $SiN_x$, a transparent conductive film 394 made, for example, of ITO and an ohmic contact film 355 made of $a\text{-}Si(n^+)$ are stacked on the surface as shown in FIG. 124. In this step, each of the films can be formed to a thickness, for example, as: the first insulator film 393 to about 3000 angstrom, the transparent conductive film 394 to about 2000 angstrom and the ohmic contact film 395 to about 200 angstrom, respectively.

Figure 125:
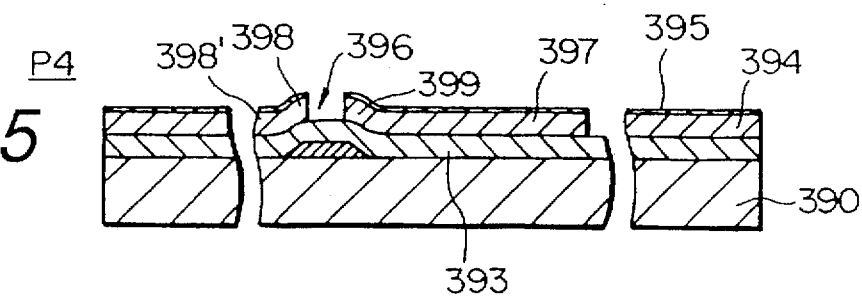
FIG. 125 is a cross sectional view illustrating a state etching the ohmic contact film and the transparent conductive film to form a semiconductor channel portion by a second photolithographic step in the fourteenth embodiment.

Then, in a second photolithographic step P4, treatments such as resist coating, exposure, development, etching and resist peeling are applied as done in the first lithographic step P2 and the ohmic contact film 395 and the transparent conductive film 394 are patterned to form a semiconductor channel portion 396 above the light screening film 392 as shown in FIG. 125 and the transparent conductive film 394 is patterned to form a pixel electrode 397 and a source wiring 398'. The etching solution, for example, a composition comprising $HF+NH_4F+HNO_3+CH_3COOH$ can be used for the ohmic contact film and a composition comprising $HCl+HNO_3+H_2O$ can be used for the transparent conductive film 394.

Figure 126:
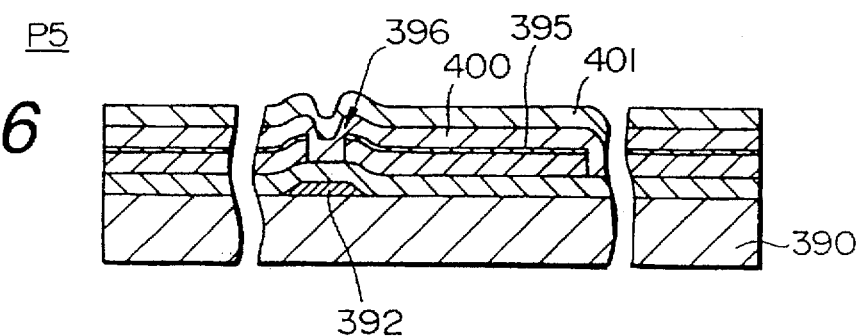
FIG. 126 is a cross sectional view illustrating a state of stacking a semiconductor active film and a second insulator film on the substrate after the above-mentioned treatment in the fourteenth embodiment.

After applying the second photolithographic step P4, the substrate 390 is cleaned in a step P5, and a semiconductor active film 400 made of a-Si(i) and a second insulator film 401 made of $SiN_x$ are formed to the surface as shown in FIG. 126. The semiconductor active film 400 can be formed in this step to a thickness of about 2,000 angstrom and the second insulator film 401 can be formed to a thickness of about 3,000 angstrom.

Figure 127:
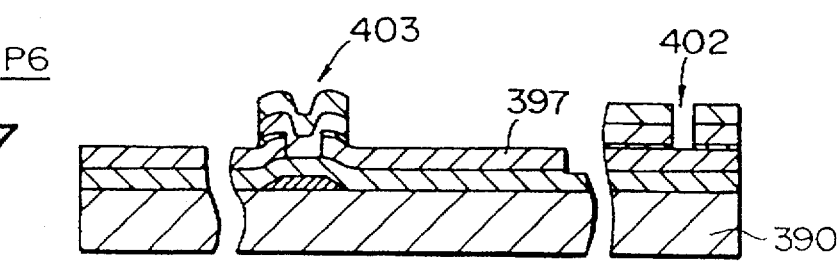
FIG. 127 is a cross sectional view illustrating a state of etching the second insulator film, the semiconductor active film and the ohmic contact film to form a contact hole by a third photolithographic step in the fourteenth embodiment.

Then, the substrate 390 after forming the films is cleaned and the second insulator film 401 and the semiconductor active film 400 are patterned in a third photolithographic step P6 by a method such as dry etching using, for example, $SF_6+O_2$ gas to isolate the semiconductor portion 403 with respect to each of pixels as shown in FIG. 127, and a contact hole for connecting the gate wiring and the source wiring and a contact hole 402 for terminal connection are formed and the ohmic contact film 395 above the pixel electrode 397 is removed.

Figure 128:
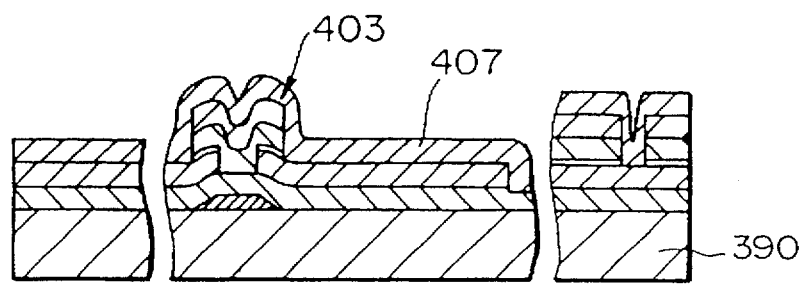
FIG. 128 is a cross sectional view illustrating a state of forming a metal film on the substrate after the above-mentioned treatment in the fourteenth embodiment.

Then, in a step P7, the substrate 300 after forming the contact hole is cleaned, and a metal film 407 made of a conductive metal such as Cr is formed to the upper surface as shown in FIG. 128. The metal film 407 can be formed in this step to a thickness, for example, of about 2,000 angstrom.

Figure 129:
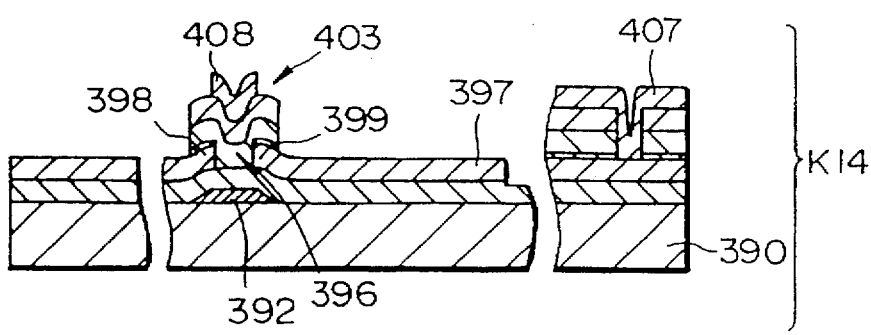
FIG. 129 is a cross sectional view illustrating a state of etching the transparent conductive film to form a gate electrode and a gate wiring by a fourth photolithographic step in the fourteenth embodiment.
Figure 130:
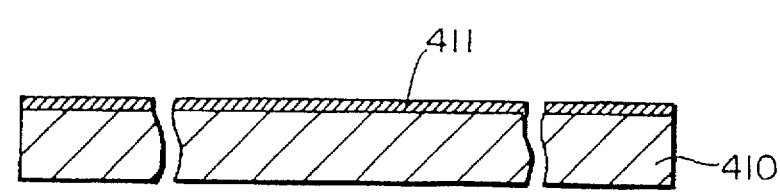
FIG. 130 is a cross sectional view illustrating a state of forming a light screening thin film on the surface of a substrate in a fifteenth embodiment.

After forming the metal film 407, the metal film 407 is patterned in a fifth photolithographic step P8 by a method such as wet etching to form a gate electrode 408, and a wiring therefor shown in FIG. 129.

For the etching solution in the wet etching, LEC-3B manufactured by Nagase Co. can be used for the fabrication of the metal film 407 made of Cr.

By way of the above-described step, a thin film transistor array substrate K14 of a structure shown in FIG. 129 can be obtained. In the production method in this embodiment, since four photolithographic steps may suffice, for the entire steps, the number of the steps can be decreased as compared with the prior art method requiring seven photolithographic steps and the production steps can be simplified by so much to improve the yield and reduce the production cost.

Further, the thin film transistor array substrate K14 of this embodiment is used for constituting a liquid crystal display device (electro-optical device) by sealing liquid crystals between the substrate K14 and another substrate paired therewith like that in the liquid crystal display device of the prior art. In the structure of this embodiment, the transparent pixel electrode 397 can control the orientation of liquid crystal molecules thereby enabling liquid crystal display.

With the structure described above, since the transparent pixel electrode 397 is not covered with other films, an electric field can be exerted efficiently upon driving liquid crystal molecules by the transparent pixel electrode 397, to provide excellent driving performance for the liquid crystal molecules.

FIG. 130 to FIG. 139 explain a fifteenth embodiment according to the present invention. In this embodiment, a light screening thin film 411 such as made of Cr is formed on a transparent substrate 410 shown in FIG. 130 by a film-forming method in a step Q1. The light screening thin film 411 can be formed in this step to a thickness, for example, of about 1,000 angstrom.

Then, The substrate 410 is preferably applied with a surface cleaning treatment by using a brush cleaning device or a UV-irradiation device for removing organic materials. Further, the light screening thin film 411 may be formed after forming a surface stabilization film made, for example, of $TaO_x$ by a treatment such as reactive sputtering to the surface of the cleaned substrate.

Then, the substrate 410 with the light screening thin film 411 is fabricated in a first photolithographic seep 02 as below. At first, after cleaning the substrate 410 and coating a photoresist on the light screening thin film 411, exposure and development are applied to the entire upper surface by way of a photomask to transfer a pattern on the photomask to the photoresist.

Figure 131:
FIG. 131 is a cross sectional view illustrating a state of etching the light screening thin film to form a light screening film by a first photolithographic step in the fourteenth embodiment.

Then, in a case where the light screening thin film 411 is a film made of Cr, wet etching is applied by using an etching solution of a composition comprising, for example, $(NH_4)_2(Ce(NO_3)_6)+HNO_3+H_2O$ and, successively the photoresist is peeled off to form an island-shaped light screening film 412 on the substrate 410 shown in FIG. 131. The light screening film 412 is formed at a position corresponding to the position to which a semiconductor portion to be described later is formed.

Figure 132:
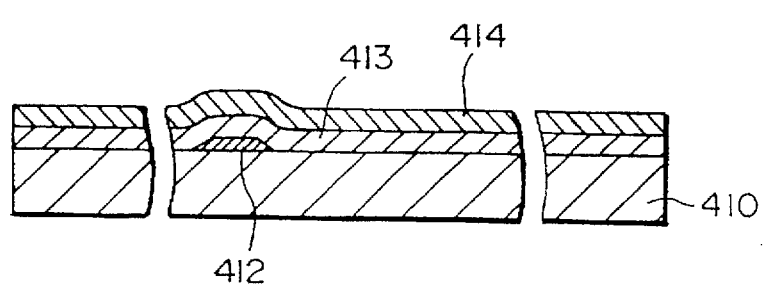
FIG. 132 is a cross sectional view illustrating a state of stacking a first insulator film and a transparent conductive film on the substrate in the fifteenth embodiment.

After forming the light screening film 412, the substrate 410 is cleaned in a step 03, and a first insulator film 373 made of $SiN_x$ and a transparent conductive film 414 made of ITO are stacked to the surface as shown in FIG. 132. In this step, the first insulator film 413 can be formed to a thickness of about 3,000 angstrom, and the transparent conductive film 414 can be formed to a thickness of about 1000 angstrom.

Figure 133:
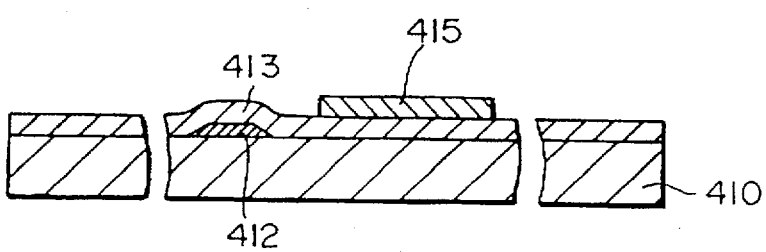
FIG. 133 is a cross sectional view illustrating a state of etching the transparent conductive film to form a pixel electrode by a second photolithographic step in the fifteenth embodiment.

Then, in a second photolithographic step 04, treatments such as resist coating, exposure, development, etching and resist peeling are applied as done in the first lithographic step 02, and the transparent conductive film 414 is patterned to form a pixel electrode 415 as shown in FIG. 133. As the etching solution in this step, for example, a composition comprising $HCl+HNO_3+H_2O$ can be used for the transparent conductive film 414.

Figure 134:
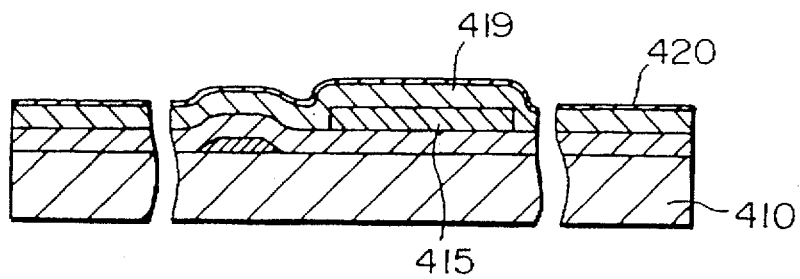
FIG. 134 is a cross sectional view illustrating a state of stacking an ohmic contact film and a first metal film on the substrate after the treatment described above in the fifteenth embodiments.
Figure 135:
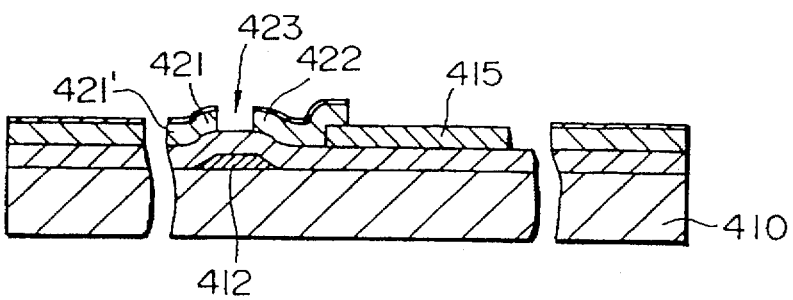
FIG. 135 is a cross sectional view illustrating a state of etching the ohmic contact film and the first metal film to form a semiconductor channel portion, a source electrode, a drain electrode and wiring therefor by a third photolithographic step in the fifteenth embodiment.

After applying the second photolithographic step 04, the substrate 410 is cleaned in a step Q5, and a first metal film 419 made, for example, of a metal such as Ti and an ohmic contact insulator film 420 made of a-Si($n^+$) are formed on the surface as shown in FIG. 134. The first metal film 419 can be formed to a thickness, for example, of about 3,000 angstrom and the ohmic contact film 420 can be formed to a thickness of about 200 angstrom.

Then, the substrate 410 after forming the films is cleaned the ohmic contact film 420 and the first metal film 419 are patterned in a third photolithographic step Q6 by a method such as wet etching, to form a source electrode 421 and a drain electrode 422 above the light screening film 412 to constitute a semiconductor portion 423 and, further, a source wiring 421' is formed. For the etching solution in this step, for example, a composition comprising $HF+NH_4F+HNO_3+CH_3COOH$ can be used for the ohmic contact film 420, and a composition comprising $HF+H_2O$ can be used for the first metal film 419.

Figure 136:
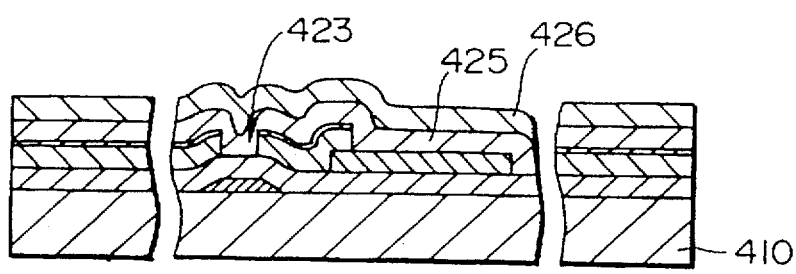
FIG. 136 is a cross sectional view illustrating a state of stacking a semiconductor active film and a second insulator film on the substrate after the treatment described above in the fifteenth embodiment.

After forming the third photolithographic step Q6, the substrate 410 is cleaned in the step Q7, and a semiconductive active film 425 made of a-Si (i) and a second insulator film 426 made of $SiN_x$ are formed on the surface as shown in FIG. 136. In this step, the semiconductor active film 425 can be formed to a thickness, for example, of about 2,000 angstrom, and the second insulator film 426 can be formed to a thickness of about 3,000 angstrom.

Figure 137:
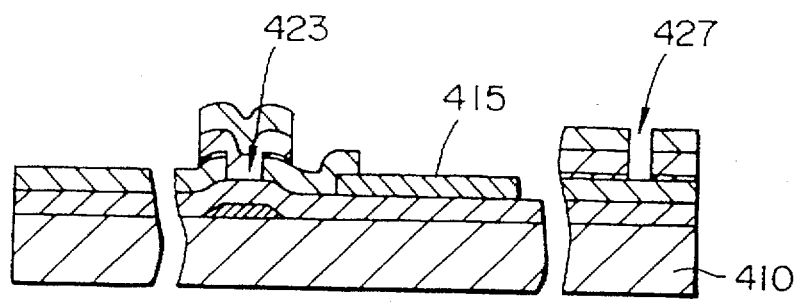
FIG. 137 is a cross sectional view illustrating a state of etching a second insulator film to form a contact hole, a semiconductor active film and an ohmic contact film by a fourth photolithographic step in the fifteenth embodiment.

Then, the substrate 410 after forming the films is cleaned, and the second insulator film 426 and the semiconductor active film 425 are patterned by a method such as dry etching using, for example, $SF_6+O_2$ gas in a fourth photolithographic step Q8 to isolate the semiconductor portion 423 relative to each of pixels as shown in FIG. 137 and a contact hole for connecting the gate wiring and the source wiring and a contact hole 427 for terminal connection are formed and the ohmic contact film 395 above the pixel electrode is removed.

Figure 138:
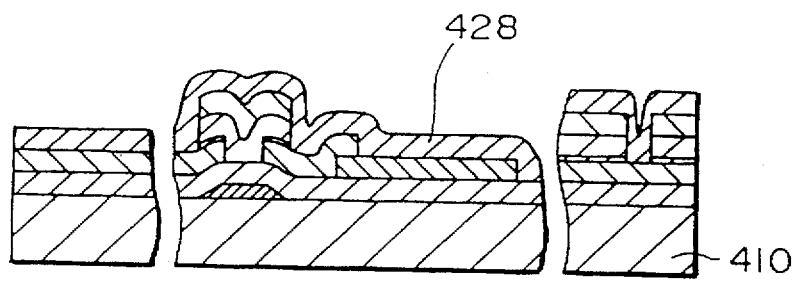
FIG. 138 is a cross sectional view illustrating a state of forming a metal film on the substrate after the treatment described above in the fifteenth embodiment.

Then, in a step Q9, the substrate 410 after forming the contact hole is cleaned and a second metal film 428 made of a conductive metal such as Cr is formed to the upper surface as shown in FIG. 138. The second metal film 427 can be formed in this step to a thickness, for example, of about 2,000 angstrom.

Figure 139:
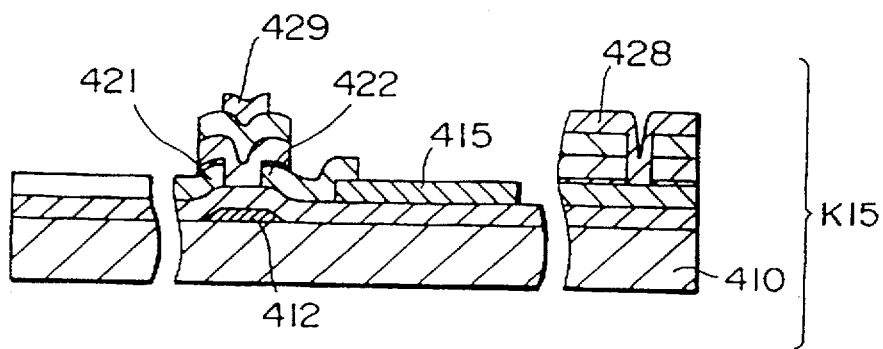
FIG. 139 is a cross sectional view illustrating a state of etching the metal film to form a gate electrode and a gate wiring by a fourth photolithographic step in the fifteenth embodiment.
Figure 140:
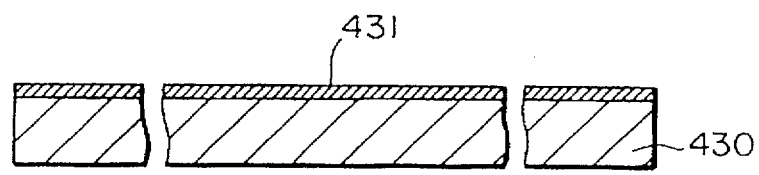
FIG. 140 is a cross sectional view illustrating a state of forming a light screening thin film on the surface of a substrate in a sixteenth embodiment.

After forming the second metal film 428, the second metal film 428 is patterned by a method such as wet etching in a fifth photolithographic step Q10 to form a gate electrode 429 and a wiring therefor as shown in FIG. 139 in the fifth photolithographic step Q10.

For the etching solution in a case of the wet etching, LEC-3B trade name of products manufactured by Nagase Co. may be used for fabricating the second Cr metal film 428.

By way of the above-described steps, a thin film transistor array substrate K15 of a structure shown in FIG. 139 can be obtained. In the production method in this embodiment, since five photolithographic steps may suffice for the entire steps, the number of steps may be decreased as compared with the prior art method requiring seven photolithographic steps and the production steps can be simplified by so much to improve the yield and reduce the production cost.

Further, the thin film transistor array substrate K15 of this embodiment is used for constituting a liquid crystal display device (electro-optical device) by sealing liquid crystals between the substrate K15 and another substrate paired therewith like that in the liquid crystal display device of the prior art. In the structure of this embodiment, the transparent pixel electrode 415 controls the orientation of liquid crystal molecules disposed above it thereby enabling liquid crystal display.

With the structure described above, since the transparent pixel electrode 415 is not covered with other films, an electric field can be exerted efficiently upon driving liquid crystal molecules by the transparent pixel electrode 415, to provide excellent driving performance for the liquid crystal molecules.

FIG. 140 to FIG. 149 explain a sixteenth embodiment according to the present invention. In this embodiment, a light screening thin film 431 made, for example, of Cr is formed on a transparent substrate 430, for example, shown in FIG. 140 by a film-forming method in a step R1. The light screening thin film 431 can be formed in this step to a thickness, for example, of about 1,000 angstrom.

The substrate 430 is preferably applied with a surface cleaning treatment by using a brush cleaning device or a UV-irradiation device for removing organic materials. Further, the light screening thin film 431 may be formed after forming a surface stabilization film made, for example, of $TaO_x$ by a treatment such as reactive sputtering to the surface of the cleaned substrate.

Then, the substrate 430 with the light screening thin film 431 is fabricated in a first photolithographic step R2 as below. At first, after cleaning the substrate 430 and coating a photoresist on the light screening thin film 431, exposure and development are applied to the entire upper surface by way of a photomask to transfer a pattern on the photomask to the photoresist.

Figure 141:
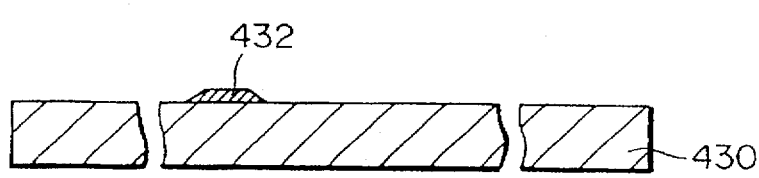
FIG. 141 is a cross sectional view illustrating a state of etching the light screening thin film to form a light screening film by a first photolithographic step in the sixteenth embodiment.

Then, in a case where the light screening thin film 351 is a film made of Cr, wet etching is applied by using an etching solution of a composition comprising, for example, $(NH_4)_2(Ce(NO_3)_6)+HNO_3+H_2O$ and, successively the photoresist is peeled off to form an island-shaped light screening film 432 on the substrate 430 shown in FIG. 141. The light screening film 432 is formed at a position corresponding to the position to which a semiconductor portion to be described later is formed.

Figure 142:
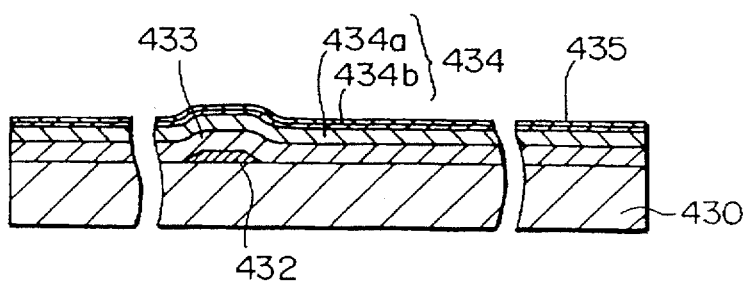
FIG. 142 is a cross sectional view illustrating a state of stacking a first insulator film, a first metal film and an ohmic contact film on the substrate in the sixteenth embodiment.

After forming the light screening film 432, the thus treated substrate 430 after forming them is cleaned in a step R3, and a first insulator film 433 made of $SiN_x$, a first metal film 434 comprising a conductive metal film 434a made of a good conductive metal material such as Al or Ta, and a barrier film 434b made of a metal material such as Cr and an ohmic contact film 435 made of a-Si(n$^+$) are stacked on the surface as shown in FIG. 142. Each of the films can be formed in this step to a thickness, for example, as: the first insulator film 433 to about 3000 angstrom, the conductive Al film to about 1500 angstrom, the Cr barrier film to about 500 angstrom and the ohmic contact film 435 to about 200 angstrom, respectively.

Figure 143:
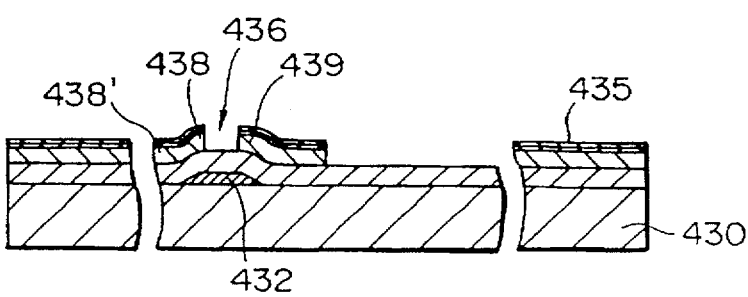
FIG. 143 is a cross sectional view illustrating a state of etching the ohmic contact film and the first insulator film to form a semiconductor channel portion by a second photolithographic step in the sixteenth embodiment.

Then, in a second photolithographic step R4 angstrom, treatments such as resist coating, exposure, development, etching and resist peeling are applied as done in the first lithographic step R2, and the ohmic contact film 43S and the first metal film 434 are patterned to form a semiconductor channel portion 436 above the light screening film 432 as shown in FIG. 143, and the first metal film 434 is patterned to form a source electrode 438, a drain electrode 439 and a source wiring 438'.

As the etching solution in this step, for example, a composition comprising $HF+NH_4F+HNO_3+CH_3COOH$ can be used for the ohmic contact film 435. LEC-B3 trade name of products manufactured by Nagase Co. can be used for the Cr barrier film 434b and a composition comprising $H_3PO_4+HNO_3+CH_3COOH$ can be used to the conductive Al metal film 374a.

As the first metal film 434, a single layer film made of Ti at a thickness of about 3,000 angstrom can be used instead of the two layered structure described above.

If the conductive Al metal film 434a is used as described above, since it is excellent in conductivity, passage of electric signals can be improved causing no problems such as signal delay. By the way, in a photolithographic step described later, when dry etching treatment is applied by using $SF_6+O_2$ gas and then resist peeling is conducted in $O_2$ plasmas, the electroconductive metal film 434a of Al or Ta may possibly cause corrosion by exposure to an oxidative atmosphere. However, since the barrier film 434b is covered thereover, the film prevents corrosion of the conductive metal film 434a.

Accordingly, any of conductive films that is less oxidizable than the constituent material for the conductive metal film 434a may be used as the constituent material for the barrier film 434b and, in addition, they may be of any material so long as it can be solid solubilized as an conductive oxide with other conductive film to be connected with the conductive metal film 434a, for example, ITO constituting a pixel electrode to be described later and it may also be a semiconductive film such as Si. Accordingly, since the single layer film made of Ti is less oxidizable, a single layer film may also be used. However, with a view point of the signal delay, a film comprising Al and Ta is preferred.

Further, since Al of good conductivity can be used for wiring, the film thickness of the wiring can be decreased as compared with the existent wiring using Ti, so that a step in the stepped portion for the entire thin film transistor device can be reduced to improve the step coverage and improve the yield.

Figure 144:
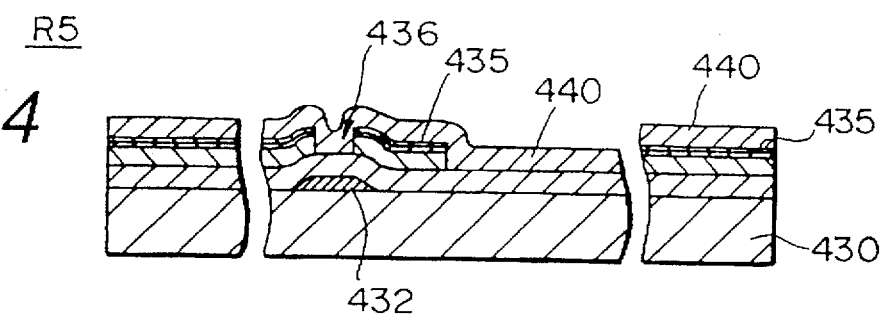
FIG. 144 is a cross sectional view illustrating a state of stacking a semiconductor active film on the substrate after the treatment described above in the sixteenth embodiments.

After applying the second photolithographic step R4, the substrate 430 is cleaned in a step R5, and a semiconductor film 440 made of a-Si (i) is formed on the surface as shown in FIG. 144. The semiconductor active film 440 can be formed to a thickness, for example, of about 2,000 angstrom.

Figure 145:
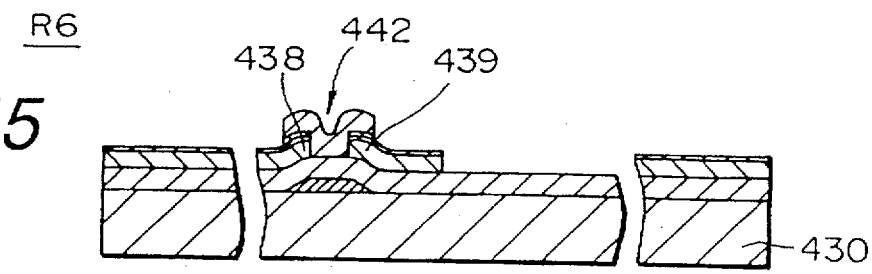
FIG. 145 is a cross sectional view illustrating a state of etching the semiconductor active film and the ohmic contact film to isolate a semiconductor portion by a third photolithographic step in the sixteenth embodiment.

Then, the substrate 430 after forming the films is cleaned and the semiconductor active film 440 and the ohmic contact film 435 are patterned in a third photolithographic step R6 by a method such as dry etching using, for example, $SF_6$ gas to isolate a semiconductor portion 442 with respect to each of pixels as shown in FIG. 145.

Figure 146:
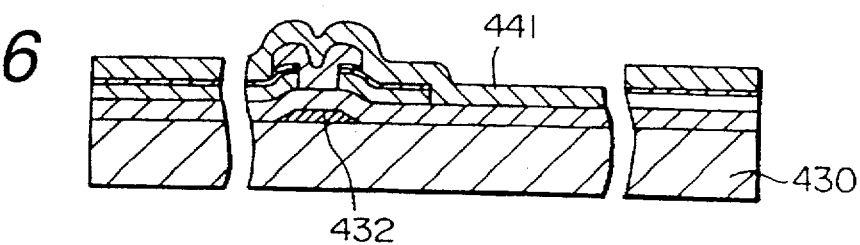
FIG. 146 is a cross sectional view illustrating a state of stacking a second insulator film on the substrate after the treatment described above in the sixteenth embodiment.
Figure 147:
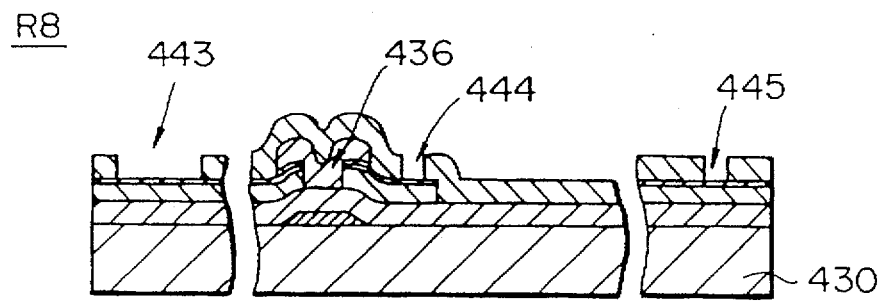
FIG. 147 is a cross sectional view illustrating a state of etching the second insulator film to form a contact hole by a fourth photolithographic step in the sixteenth embodiment.

Then, in a step R7, the treated substrate 430 is cleaned and a second insulator film 441 made of $SiN_x$ is formed on the surface as shown in FIG. 146. The second insulator film 441 can be formed in this step, for example, to about 3,000 angstrom.

Then, the treated substrate 430 is cleaned and, in a fourth photolithographic step R8, dry etching treatment is applied by using $SF_6+O_2$ gas, to form contact holes 443, 444 and 445 for connecting the gate wiring, the source wiring and the drain electrode 439 with a pixel electrode to be described later.

Figure 148:
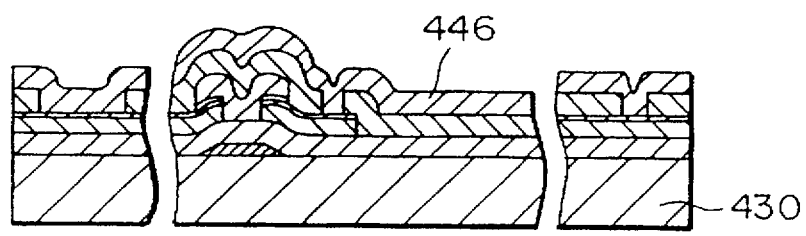
FIG. 148 is a cross sectional view illustrating a state of forming a transparent conductive film on the substrate after the treatment described above in the sixteenth embodiment.

Then, in a step R9, the substrate 430 after the treatment is cleaned, and a transparent conductive film 446 made, for example, of ITO is formed to the upper surface of the substrate 430 as shown in FIG. 148. The transparent conductive film 440 can be formed in this step to a thickness, for example, of about 1,500 angstrom.

Figure 149:
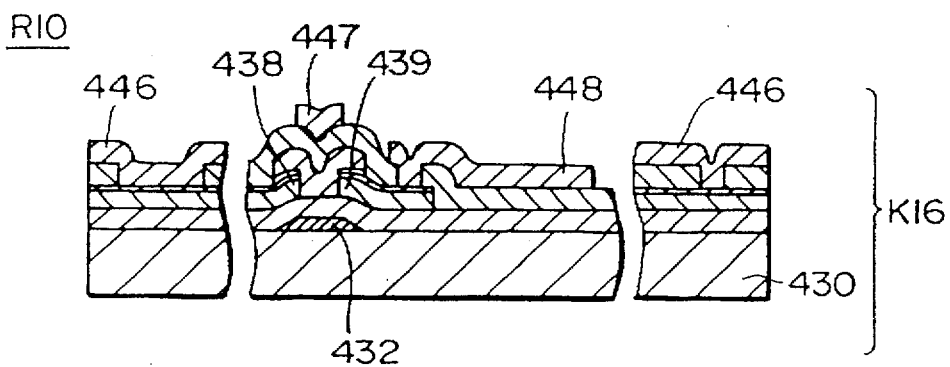
FIG. 149 is a cross sectional view illustrating a state of etching the transparent conductive film to form a gate electrode, a gate wiring and a pixel electrode by a fifth photolithographic step in the sixteen embodiment.
Figure 150:
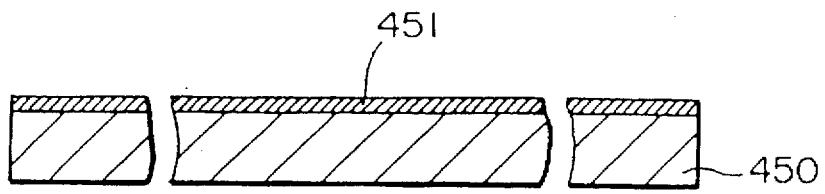
FIG. 150 is a cross sectional view illustrating a state of forming a light screening thin film on the surface of a substrate in a seventeenth embodiment.

After forming the transparent conductive film 446, the transparent conductive film 446 is patterned in a fifth photolithographic step R10 by a method such as wet etching to form a gate electrode 447, a wiring therefor and a transparent pixel electrode 448 shown in FIG. 149.

For the etching solution in the wet etching, a solution of a composition comprising $HCl+HNO_3+H_2O$ can be used for the fabrication of the transparent conductive film 446 made of ITO.

By way of the above-described step, a thin film transistor array substrate K16 of a structure shown in FIG. 149 can be obtained. In the production method in this embodiment, since five photolithographic steps may suffice for the entire steps, the number of steps may be decreased as compared with the prior art method requiring seven photolithographic steps and the production steps can be simplified by so much to improve the yield and reduce the production cost.

Further, the thin film transistor array substrate K16 of this embodiment is used for constituting a liquid crystal display device (electro-optical device) by sealing liquid crystals between the substrate K16 and another substrate paired therewith like that in the liquid crystal display device of the prior art. In the structure of this embodiment, the transparent pixel electrode 448 controls the orientation of liquid crystal molecules disposed above it thereby enabling liquid crystal display.

With the structure described above, since the transparent pixel electrode 448 is not covered with other films, an electric field can be exerted efficiently upon driving liquid crystal molecules by the transparent pixel electrode 448, to provide excellent driving performance for the liquid crystal molecules.

FIG. 150 to FIG. 157 explain a seventeenth embodiment according to the present invention. In this embodiment, a light screening thin film 451 made, for example, of Cr is at first formed on a transparent substrate 450 made, for example, of glass shown in FIG. 150 by a film-forming method in a step S1. The light screening thin film 451 can be formed in this step to a thickness, for example, of about 1,000 angstrom.

Then, the substrate 450 is preferably applied with a surface cleaning treatment by using a brush cleaning device or a UV-irradiation device for removing organic materials. Further, the light screening thin film 451 may be formed after forming a surface stabilization film made, for example, of $TaO_x$ by a treatment such as reactive sputtering to the surface of the cleaned substrate.

Then, the substrate 450 with the light screening thin film 451 is fabricated in a first photolithographic step S2 as below. At first, after cleaning the substrate 450 and coating a photoresist on the light screening thin film 451, exposure and development are applied to the entire upper surface by way of a photomask to transfer a pattern on the photomask to the photoresist.

Figure 151:
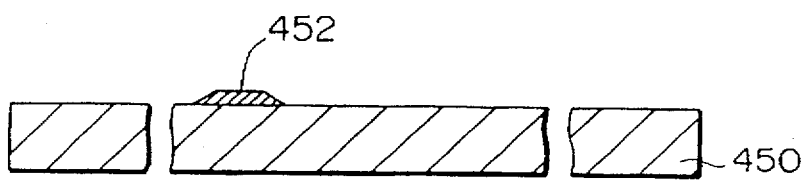
FIG. 151 is a cross sectional view illustrating a state of etching the light screening thin to form a light screening film by a first photolithographic step in the seventeenth embodiment.

Then, in a case where the light screening thin film 451 is a film made of Cr, wet etching is applied by using an etching solution of a composition comprising, for example, $(NH_4)_2(Ce(NO_3)_6)+HNO_3+H_2O$ and, successively, the photoresist is peeled off to form an island-shaped light screening film 452 on the substrate 450 shown in FIG. 151. The light screening film 452 is formed at a position corresponding to the position to which a semiconductor portion to be described later is formed.

Figure 152:
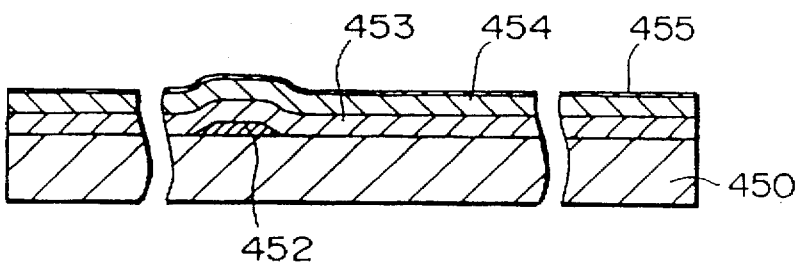
FIG. 152 is a cross sectional view illustrating a state of stacking a first insulator film, a transparent conductive film and an ohmic contact film on the substrate in the seventeenth embodiment.

After forming the light screening film 452, the thus treated substrate 450 is cleaned in a step S3, and a first insulator film 453 made of $SiN_x$, a transparent conductive film 454 made, for example, of ITO and an ohmic contact film 455 made of a-Si(n⁺) are stacked on the surface as shown in FIG. 152. In this step, each of the films can be formed to a thickness, for example, as: the first insulator film 343 to about 3000 angstrom, the transparent conductive film 454 to about 2000 angstrom and the ohmic contact film 455 to about 200 angstrom, respectively.

Figure 153:
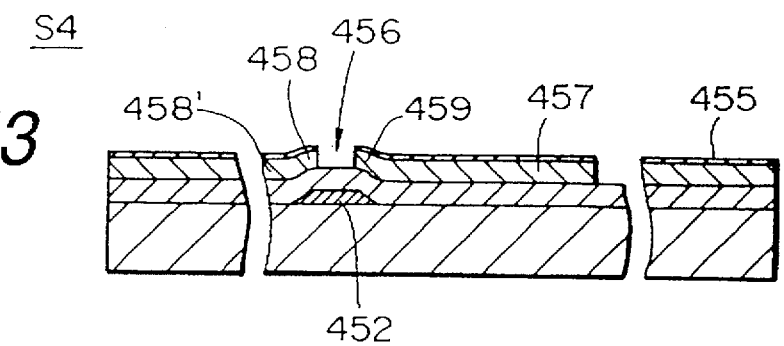
FIG. 153 is a cross sectional view illustrating a state of etching the ohmic contact film and the transparent conductive film to form a semiconductor channel portion, a source electrode, a drain electrode and wiring therefor by a second photolithographic step in the seventeenth embodiment.

Then, in a second photolithographic step S4, treatments such as resist coating, exposure, development, etching and resist peeling are applied as done in the first lithographic step S2, and the ohmic contact film 455 and the transparent conductive film 454 are patterned to form a semiconductor portion 456 above the light screening film 452 as shown in FIG. 153 and the transparent conductive film 454 is pat-terned to form a pixel electrode 457, a source electrode 458 and a drain electrode 459 and form a source wiring 458'. As the etching solution in this step, for example, a composition comprising $HF+NH_4F+HNO_3+CH_3COOH$ can be used for the ohmic contact film 455 and a composition comprising $HCl+HNO_3+H_2O$ can be used for the transparent conductive film 454.

Figure 154:
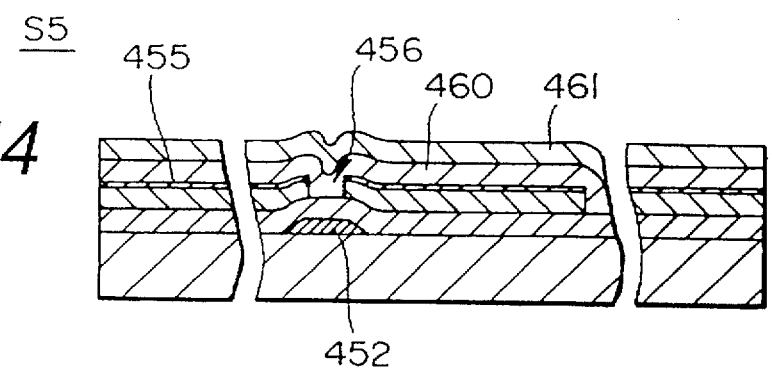
FIG. 154 is a cross sectional view illustrating a state of stacking a passivation film on the substrate after the treatment described above in the seventeenth embodiments.

After applying the second photolithographic step S4, the substrate 450 is cleaned in a step S5, and a semiconductor active film 460 made of a-Si(i) and a second insulator film 461 made of $SiN_x$ are formed to the surface as shown in FIG. 154. The semiconductor active film 460 can be formed to a thickness of about 2,000 angstrom and the second insulator film 461 can be formed to a thickness of about 3,000 angstrom in this step.

Then, the substrate 450 after forming the films is cleaned and the second insulator film 461 and the semiconductor active film 460 are patterned in a third photolithographic step S6 by a method such as dry etching using, for example, $SF_6+O_2$ gas to form a contact hole 463 for connecting the gate wiring and the source wiring.

Figure 156:
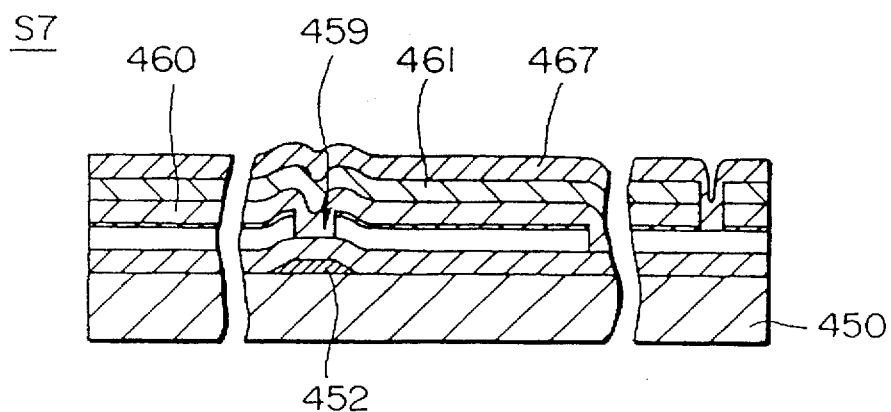
FIG. 156 is a cross sectional view illustrating a state of forming a metal film on the substrate after treatment described above in the seventeenth embodiment.

Then, in a step S7, the substrate 450 after forming the contact hole is cleaned, and a metal film 467 made of a conductive metal such as Cr is formed to the upper surface as shown in FIG. 156. The metal film 467 can be formed in this step to a thickness, for example, of about 2,000 angstrom.

Figure 157:
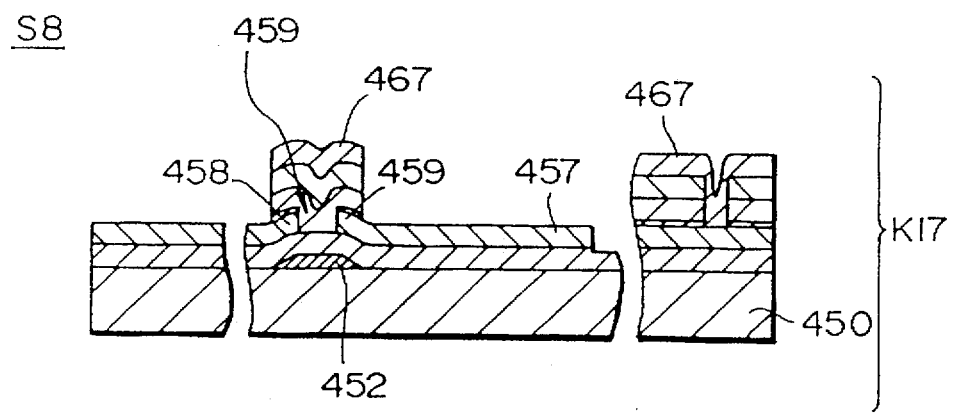
FIG. 157 is a cross sectional view illustrating a state by etching the metal film to form a gate electrode and a gate wiring and isolate the semiconductor portion from other portions by fourth photolithographic step in the seventeenth embodiment.
Figure 158:
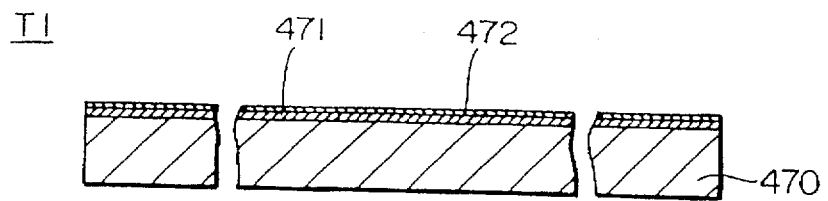
FIG. 158 is a cross sectional view illustrating a state of forming a first metal film on the surface of a substrate in an eighteenth embodiment.

After forming the metal film 467, the metal film 467, the second insulator film 461, the semiconductor active film 460 and the ohmic contact film 455 are patterned in a fourth photolithographic step S8 by a method such as wet etching to form a gate electrode 468 and a wiring therefor shown in FIG. 157 and other films above the pixel electrode 457 are removed.

Figure 155:
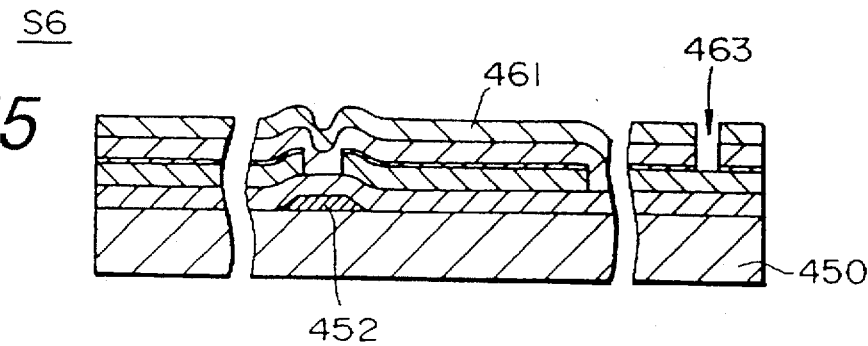
FIG. 155 is a cross sectional view illustrating a state of etching the second insulator film, the semiconductor active film and the ohmic contact film to form a contact hole by a third photolithographic step in the seventeenth embodiment.

By way of the above-described seeps, a thin film transistor array substrate K17 of a structure shown in FIG. 155 can be obtained. In the production method in this embodiment, since four photolithographic steps may suffice for the entire steps, the number of the steps can be decreased as compared with the prior art method requiring seven photolithographic steps and the production steps can be simplified by so much to improve the yield and reduce the production cost.

Further, the thin film transistor array substrate K17 of this embodiment is used for constituting a liquid crystal display device (electro-optical device) by sealing liquid crystals between the substrate K17 and another substrate paired therewith like that in the liquid crystal display device of the prior art. In the structure of this embodiment, the transparent pixel electrode 457 can control the orientation of liquid crystal molecules thereby enabling liquid crystal display.

With the structure described above, since the transparent pixel electrode 457 is not covered with other films, an electric field can be exerted efficiently upon driving liquid crystal molecules by the transparent pixel electrode 457, to provide excellent driving performance for the liquid crystal molecules.

FIG. 158 to FIG. 167 explain an eighteenth embodiment according to the present invention. In this embodiment, a first metal film 471 formed from a conductive metal thin film made of a conductive material such as Cr, Ta, Mo and Al and a barrier film 472 made of a-Si(n⁺) are formed on a transparent substrate 470 made, for example, of glass shown in FIG. 158 in a step T1. The first metal film 471 can be formed to a thickness of about 1,000 angstrom and the barrier film 472 can be formed to a thickness of about 200 angstrom in this step.

Figure 159:
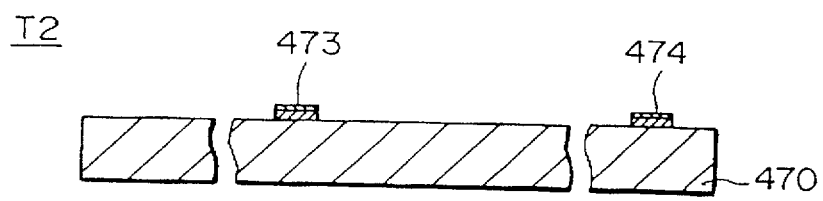
FIG. 159 is a cross sectional view illustrating a state of forming a gate electrode and a gate wiring on the substrate by a first photolithographic step in the eighteenth embodiment.

Then, the substrate 470 after the treatment is fabricated in a first photolithographic step T2 as below. At first, after cleaning the substrate 470 and coating a photoresist on the barrier film 472, exposure and development are applied to the entire upper surface by way of a photomask to transfer a pattern on the photomask to the photoresist. Then, in a case where the barrier film 472 is made of a-Si($n_+$), wet etching is applied by using an etching solution of a composition comprising, for example, $HF+HNO_3+H_2O$ to peel of the photoresist. Successively, after applying similar treatment, and wet etching is applied in a case where the first metal film 471 is an Al film by using a etching solution of a composition comprising $H_3PO_4+HNO_3+CH_3COOH +H_2O$ and, successively, the photoresist is peeled off to form a gate electrode 473 and a gate wiring 474 on the substrate 470 as shown in FIG. 159. Although only a portion of the gate electrode 473 and the gate wirings 474 is shown in the drawing, a plurality of the gate electrodes 473 and the gate wirings 474 are actually formed on the substrate 470.

Figure 160:
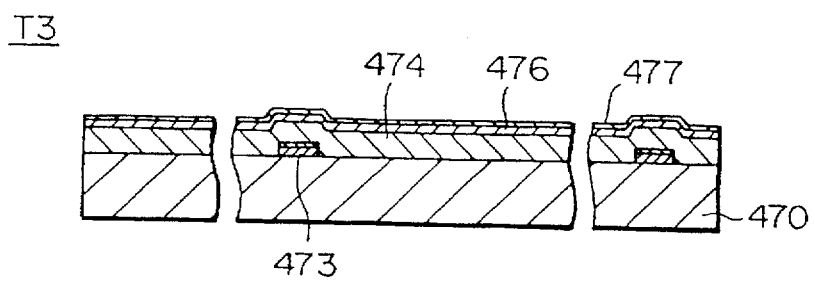
FIG. 160 is a cross sectional view illustrating a state of forming a first insulator film, a semiconductor active film and an ohmic contact film on the surface of the substrate in the eighteenth embodiment.

After forming the gate electrode 473 and the gate wiring 474, the substrate 470 formed with them is cleaned in a step T3, and a first insulator film 475 made of $SiN_x$, a semiconductor active film 476 made of a-Si(i) and an ohmic contact film 477 made of a-Si($n^+$) are stacked on the surface as shown in FIG. 160. In this step, each of the films can be formed to a thickness, for example, as; the first insulator film 475 to about 3,000 angstrom, the semiconductor active film 476 to about 1,000 angstrom and the ohmic contact film 477 to about 200 angstrom, respectively.

Figure 161:
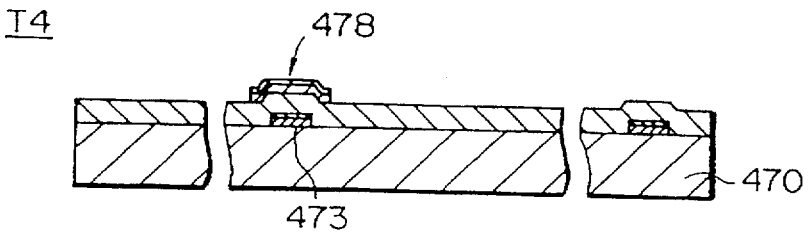
FIG. 161 is a cross sectional view illustrating a state of forming a semiconductor portion by a second photolithographic step in the eighteenth embodiment.

Then, in a second photolithographic step T4, treatments such as resist coating, exposure, development, etching and resist peeling are applied as done in the first lithographic step T2, and the ohmic contact film 477 and the semiconductor active film 476 are patterned to form a semiconductor portion above the gate electrode 473 as shown in FIG. 161. As the etching solution in this step, for example, a composition comprising $HF+HIO_3+HNO_3$ can be used.

Figure 162:
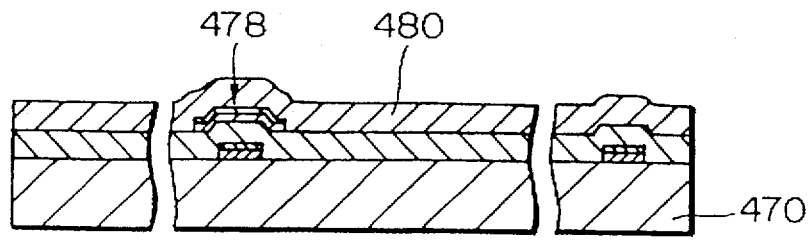
FIG. 162 is a cross sectional view illustrating a state of forming a second metal film on the surface of the substrate in the eighteenth embodiment.
Figure 163:
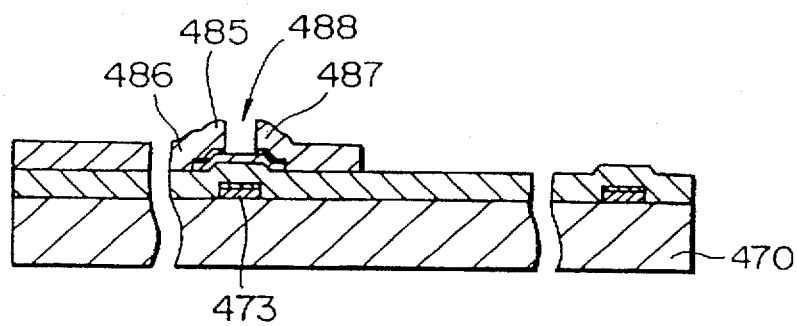
FIG. 163 is a cross sectional view illustrating a state of forming a source electrode, a drain electrode, a source wiring and a channel portion by a third photolithographic step in the eighteenth embodiment.

After applying the second photolithographic step T4, the substrate 470 is cleaned in a step T5, and a second metal film 480 made, for example, of a conductive material such as Ti is formed on the upper surface as shown in FIG. 162. The second metal film 480 can be formed to a thickness, for example, of about 3,000 angstrom.

After forming the second metal film 480, the second metal film 480 and the ohmic contact film 477 are patterned in a third photolithographic step T6 by a method such as wet etching, to form a source electrode 485, a source wiring 486, a drain electrode 487 and a channel portion 488.

For the etching solution in the wet etching, for example, a composition comprising $HF+H_2O$ can be used for the second metal film 480 and a composition comprising $HF+NH_4F+HNO_3+CH_3COOH$ can be used for the channel portion.

Figure 164:
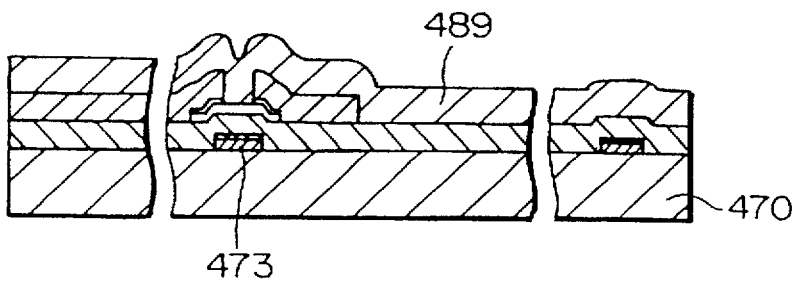
FIG. 164 is a cross sectional view illustrating a state of forming a passivation film on the surface of the substrate in the eighteenth embodiment.

Then, the substrate 470 is cleaned in a step T7, and a passivation film 489 made of an insulative material such as $SiN_x$ is formed as shown in FIG. 164 to the surface by a method such as plasma CVD. The passivation film 489 can be formed in this step to a thickness to, for example, of about 4,000 angstrom.

Figure 165:
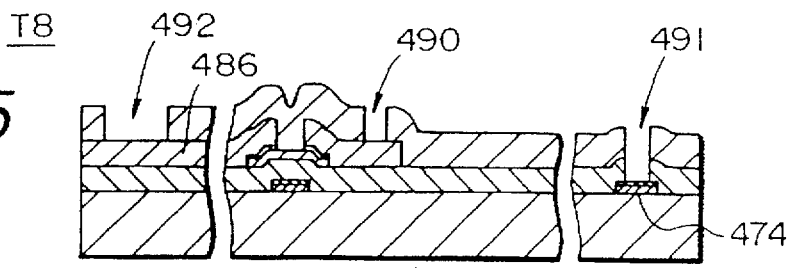
FIG. 165 is a cross sectional view illustrating a state of forming a contact hole to the passivation film and the first insulator film by a fourth photolithographic step in the eighteenth embodiment.
Figure 166:
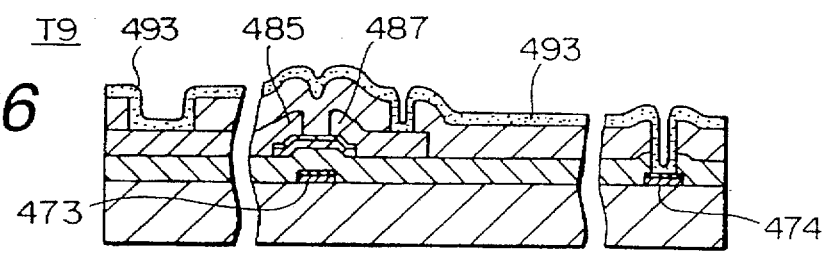
FIG. 166 is a cross sectional view illustrating a state of forming a transparent conductive film on the passivation film in the eighteenth embodiment.

After forming the passivation film 489, the passivation film 489 is patterned by a method such as dry etching using $SF_6+O_2$ gas in a fourth photolithographic step T8 to the treated substrate 470, and a first insulator film 475 is dry-etched by the same dry etching treatment to form a contact hole 490 leading the drain electrode 487, a contact hole 491 leading the gate wiring 483 and a contact hole 492 leading to the source wiring 486 as shown in FIG. 165.

To the surface of the substrate 470 after forming the contact holes, a transparent conductive film 493 made of ITO is formed in a step T9. The transparent conductive film 493 can be formed to a thickness, for example, of about 1,500 angstrom.

Figure 167:
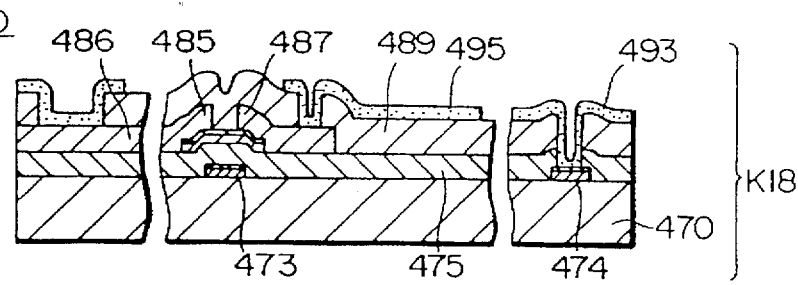
FIG. 167 is a cross sectional view illustrating a state of patterning the passivation film to form a transparent pixel electrode by a fifth photolithographic step in the eighteenth embodiment.

Then, in a fifth photolithographic step T10, a portion of the transparent conductive film 493 is removed by wet etching to form a transparent pixel electrode 495 as shown in FIG. 167, and an unrequired portion of the transparent conductive film 493 such as above a channel portion 488 is removed. An etching solution, for example, of a composition comprising $HCl+HNO_3+H_2O$ can be used in this step.

By way of the above-described steps, a thin film transistor array substrate K18 of a structure shown in FIG. 167 can be obtained. In the production method in this embodiment, since five photolithographic steps may suffice for the entire steps, the number of steps may be decreased as compared with the prior art method requiring seven photolithographic steps and the production steps can be simplified by so much to improve the yield and reduce the production cost.

Further, the thin film transistor array substrate K18 of this embodiment is used for constituting a liquid crystal display device (electro-optical device) by sealing liquid crystals between the substrate K18 and another substrate paired therewith like that in the liquid crystal display device of the prior art. In the structure of this embodiment, the transparent pixel electrode 495 controls the orientation of liquid crystal molecules disposed above it thereby enabling liquid crystal display.

With the structure described above, since the transparent pixel electrode 495 situates at the uppermost layer, an electric field can be exerted efficiently upon driving liquid crystal molecules by the transparent pixel electrode 495, to provide excellent driving performance for the liquid crystal molecules.

Figure 168:
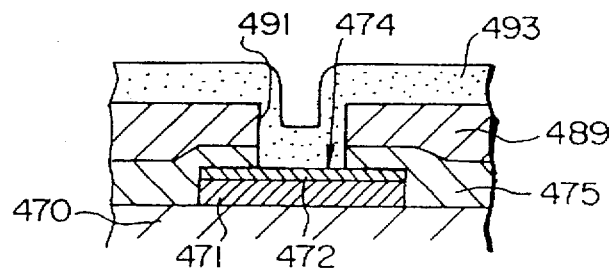
FIG. 168 is an enlarged view a portion of the structure shown in FIG. 167.
Figure 169:
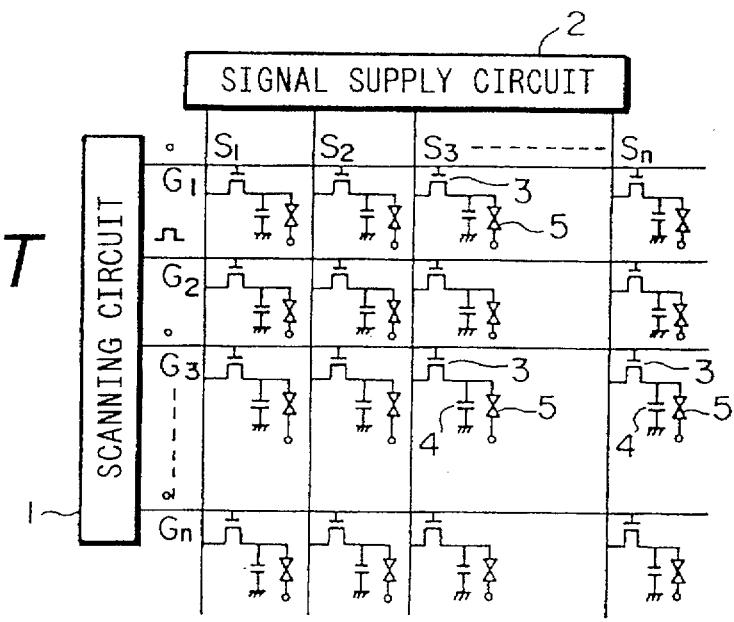
FIG. 169 is a view illustrating a driving circuit of a general active matrix liquid crystal display device.

Then, FIG. 168 shows a schematic cross sectional structure in the vicinity of a portion for forming the contact hole 491 in the thin film transistor array substrate K18. In this structure, the transparent conductive film 493 made of ITO is joined by way of the barrier film 472 to the first metal 471.

In a case of manufacturing the thin film transistor array substrate K18 by way of the steps T1–T10 described above, dry etching is conducted by using $SF_6+O_2$ gas upon forming the contact hole 491 and, subsequently, the resist peeling is conducted in an $O_2$ plasma atmosphere, so that the barrier film 472 is exposed through the contact hole 491 to the $O_2$ plasma atmosphere (oxidative atmosphere).

However, if the structure described above is employed, since the barrier film 472 is present, the underlying first metal film 471 is not oxidized by the oxidative atmosphere. Since the first metal film 471 constitutes the gate wiring 474, if the first metal film 471 were oxidized, contact with the transparent conductive film 493 made of ITO could no more be attained to cause contact failure. Accordingly, since the barrier film 472 prevents oxidation of the gate wiring 474. As the material for the first metal film 471 constituting the gate wiring 474, a material having higher conductivity although having lower oxidation resistance than Ti, for example, Al or Ta can be used.

Figure 172:
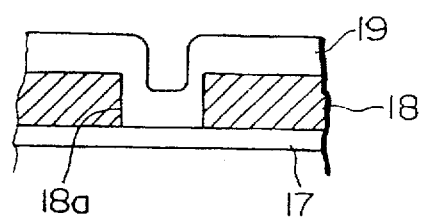
FIG. 172 is a cross sectional view illustrating a contact structure between a metal film and a thin film of the prior art.

Accordingly, the foregoing problems in the prior art can be overcome based on the embodiment of FIG. 172 and since the conductivity of the gate wiring 474 can be improved, problems such as signal delay in the gate wiring can be overcome and it is advantageous for enlarging the size of the liquid crystal panel. Further, since Al of good conductivity can be used for the gate wiring 474, the film thickness of the gate wiring can be reduced to less than that of the existent gate wiring using Ti, and the step in the step portion for the entire thin film transistor can be reduced to improve the step coverage and further improve the yield.

Any of the materials may be used for the constituent material of the barrier film 472 providing that it is a conductive or semi-conductive material which is less oxidizable than the first metal film 471. If it is not less oxidizable, it may suffice that the material can be solid solubilized as the conductive oxide with the transparent conductive film 493 made of ITO and, further, it may be a material made of a semiconductor layer such as a-Si(n$^+$).

As has been described above, according to the first to 20th aspects of the invention, since the number of the photolithographic steps can be reduced to four or five steps, the yield can be improved by so much as the number of the steps is decreased as compared with the prior art requiring seven steps. Further, since the production efficiency is improved, the production cost can be saved.

Further, in third to tenth aspects, eleventh and twelfth, and fourteenth to nineteenth aspects of the present invention, since there is no such a film as causing voltage drop such as a passivation film or gate insulator film on a transparent conductive film for applying a voltage to an electro-optical material such as liquid crystals, it can provide an advantage effect capable of efficiently applying a voltage to liquid crystals.

Further, in the fourth aspect of the present invention, since the first insulator film, the semiconductor active film, the ohmic contact film and the metal film can be stacked and formed continuously, high through-put and low contact resistivity can be attained. Further, since the source wiring comprises four layers of the semiconductor active film, the ohmic contact film, the metal film and the transparent conductive film, reduction of the resistivity and the redundancy to the wire disconnection can be attained.

In the seventh aspect of the present invention, since the source wiring comprises four layers of the transparent conductive film, the second metal film, the ohmic contact film and the semiconductor active film, reduction of the resistivity and the redundancy to the wire disconnection can be attained.

In accordance with the eighth aspect of the present invention, different from other aspects, since the pixel electrode is separated by the insulator film not being formed in a layer identical with the source wiring or the gate wiring, there is no worry of short-circuit between the source wirings or gate wirings to each other caused by formation failure of the pixel electrode thereby enabling to improve the yield.

Then, in eighth, fourteenth or seventeenth aspect of the present invention, Al or Ti having higher conductivity than Ti can be used instead of existent Ti as the film material for constituting the wiring, so that the barrier film can provide anti-oxidant effect even if the wiring is exposed to an oxidative atmosphere in the subsequent photolithographic step, to ensure the performance of contact between the film and other conductive film. Accordingly, a problem of signal delay is less caused and it can provide a great advantage of obtaining a large size of screen in the liquid crystal panel. Further, since the film thickness can be reduced in the case of the wiring comprising a film made of Al or Ta than the wiring comprising a film of Ti, the step in the stepped portion for the entire thin film transistor device can be reduced and the step coverage can be improved, to improve the yield.

What is claimed is:

1. A method for producing an electro-optical device in which an electro-optical material is disposed between first and second substrates opposed to each other, at least a portion of opposing surfaces of the first and second substrates is insulative, a plurality of source wirings and a plurality of gate wirings are formed crossing each other on the opposed surface of the first substrate and a transparent pixel electrode and a thin film transistor are formed at each crossing point between one of the source wirings and one of the gate wirings, wherein the method comprises:

a step B1 of forming a first metal film on the opposed surface of the first substrate, a first photolithographic step B2 of patterning the first metal film to form a gate electrode and a gate wiring, a step B3 of forming a first insulator film, a semiconductor active film on the first insulator film, and an ohmic contact film on the semiconductor active film after the first photolithographic step, a second photolithographic step B4 of patterning the semiconductor active film and the ohmic contact film to form a semiconductor portion above the gate electrode, a third photolithographic step B5 of patterning the first insulator film to form a contact hole through the first insulator film to the gate wiring, a step B6 of sequentially forming a transparent conductive film, and a second metal film on the transparent conductive film, after the third photolithographic step, a fourth photolithographic step B7 of patterning the second metal film, the transparent conductive film and the ohmic contact film to form a source electrode, a source wiring, a drain electrode and a transparent pixel electrode, and to form a channel portion above the gate electrode exposing said semiconductor active film, a step B8 of forming a passivation film after the fourth photolithographic step, and a fifth photolithographic step B9 of patterning the passivation film and the second metal film to form a light-permeable opening above the transparent pixel electrode, and to form a contact hole for source wiring and gate wiring connection terminals.

2. The method for producing an electro-optical device according to claim 1, wherein the step B1 further comprises forming the first metal film using a conductive material selected from the group consisting of Cr, Ta, Mo and Al.

3. The method for producing an electro-optical device according to claim 1, wherein the step B1 further comprises forming the first metal film to a thickness of 1,000 angstroms.

4. The method for producing an electro-optical device according to claim 1, wherein the step B1 further comprises forming the first metal film using Cr; and wherein the first photolithographic step B2 further comprises depositing a photoresist, wet etching the first metal film using $(NH_4)_2(Ce(NO_2)_6)+HNO_3+H_2O$, and then removing the photoresist.

5. The method for producing an electro-optical device according to claim 1, wherein the step B3 further comprises forming the first insulator film using $SiN_x$, forming the semiconductor active film using a-Si(I), and forming the ohmic contact film using a-Si(n$^+$).

6. The method for producing an electro-optical device according to claim 1, wherein the second photolithographic step B4 further comprises depositing a photoresist, wet etching the semiconductor active film and the ohmic contact film using $HF+HNO_3$, and then removing the photoresist.

7. The method for producing an electro-optical device according to claim 1, wherein the third photolithographic step B5 further comprises dry etching the first insulator film using $SF_2+O_2$ gas.

8. The method for producing an electro-optical device according to claim 1, wherein the step B6 further comprises forming the transparent conductive film using ITO, and forming the second metal film by sequentially forming a Cr film and then an Al film.

9. The method for producing an electro-optical device according to claim 8, wherein the fourth photolithographic step B7 further comprises wet etching the Cr film using $H_3PO_4+HNO_3+CH_3COOH+H_2O$, dry etching the transparent conductive film using $CH_3OH$ in an Ar atmosphere, and then wet etching the ohmic contact film using $HF+HNO_3$.

10. The method for producing an electro-optical device according to claim 1, wherein the step B8 includes forming the passivation film to a thickness of 4,000 angstroms.

11. The method for producing an electro-optical device according to claim 1, wherein the fifth photolithographic step B9 further comprises dry etching the passivation film and wet etching the second metal film.

* * * * *